US012052522B2

(12) United States Patent
Sato et al.

(10) Patent No.: US 12,052,522 B2
(45) Date of Patent: Jul. 30, 2024

(54) SOLID-STATE IMAGING APPARATUS AND ELECTRONIC DEVICE

(71) Applicant: Sony Semiconductor Solutions Corporation, Kanagawa (JP)

(72) Inventors: Mamoru Sato, Kanagawa (JP); Akihiko Kato, Tokyo (JP); Eriko Kato, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 316 days.

(21) Appl. No.: 17/417,208

(22) PCT Filed: Feb. 28, 2020

(86) PCT No.: PCT/JP2020/008246
§ 371 (c)(1),
(2) Date: Jun. 22, 2021

(87) PCT Pub. No.: WO2020/235169
PCT Pub. Date: Nov. 26, 2020

(65) Prior Publication Data
US 2022/0060646 A1   Feb. 24, 2022

(30) Foreign Application Priority Data

May 17, 2019   (JP) .................... 2019-093923

(51) Int. Cl.
*H04N 25/709*   (2023.01)
*H01L 27/146*   (2006.01)
(Continued)

(52) U.S. Cl.
CPC ..... *H04N 25/709* (2023.01); *H01L 27/14603* (2013.01); *H01L 27/14612* (2013.01); *H01L 27/14643* (2013.01); *H04N 25/75* (2023.01)

(58) Field of Classification Search
CPC ......... H01L 27/14603; H01L 27/14612; H01L 27/14643; H01L 27/14641; H04N 25/627; H04N 25/709; H04N 25/75
See application file for complete search history.

(56) References Cited

U.S. PATENT DOCUMENTS 11,463,645 B2 * 10/2022 Obata .................... H04N 25/77
11,523,081 B2 * 12/2022 Taruki .................. H04N 25/778
(Continued)

FOREIGN PATENT DOCUMENTS

JP   2003009003 A   1/2003
JP   2003-259218 A   9/2003
(Continued)

OTHER PUBLICATIONS

International Search Report (PCT/ISA/210), International Application No. PCT/JP2020/008246, dated Apr. 22, 2020.
(Continued)

*Primary Examiner* — Marly S Camargo
(74) *Attorney, Agent, or Firm* — Michael Best & Friedrich LLP

(57) ABSTRACT

A light detecting device includes: one or more switch transistors, a first pixel including a first floating diffusion region coupled to a first photoelectric converter through a first transfer transistor, and a first amplification transistor coupled to the first floating diffusion region, a second pixel including a second floating diffusion region coupled to a second photoelectric converter through a second transfer transistor, and a second amplification transistor coupled to the second floating diffusion region, and a third pixel including a third floating diffusion region coupled to a third photoelectric converter through a third transfer transistor, and a third amplification transistor coupled to the third floating diffusion region. A pixel signal is differentially amplified by the first and third amplification transistors. The (Continued)

first and second floating diffusion regions are selectively connected to each other via one of the one or more switch transistors.

20 Claims, 47 Drawing Sheets

(51) Int. Cl.
*H04N 25/627* (2023.01)
*H04N 25/75* (2023.01)

(56) References Cited

U.S. PATENT DOCUMENTS

| | | | |
|---|---|---|---|
| 2006/0274176 A1 | 4/2006 | Guidash | |
| 2008/0115500 A1 | 5/2008 | MacAdam et al. | |
| 2008/0231727 A1* | 9/2008 | Compton | H04N 25/583 348/220.1 |
| 2011/0001860 A1* | 1/2011 | Taruki | H04N 25/77 348/300 |
| 2011/0234871 A1* | 9/2011 | Taruki | H04N 25/709 348/300 |
| 2012/0286138 A1 | 11/2012 | Yamazaki | |
| 2013/0155303 A1 | 6/2013 | Barbier | |
| 2014/0139713 A1* | 5/2014 | Gomi | H04N 25/79 348/308 |
| 2018/0146154 A1 | 5/2018 | Mamoru et al. | |
| 2019/0181169 A1* | 6/2019 | Tadmor | H01L 27/14605 |
| 2020/0106975 A1* | 4/2020 | Oike | H04N 25/75 |
| 2021/0168317 A1* | 6/2021 | Sato | H04N 25/772 |

FOREIGN PATENT DOCUMENTS

| | | |
|---|---|---|
| JP | 2008-271280 A | 11/2008 |
| JP | 2012253740 A | 12/2012 |
| JP | 2012253741 A | 12/2012 |
| JP | 2014075776 A | 4/2014 |
| JP | 2015126239 A | 7/2015 |
| JP | 2016042633 A | 3/2016 |
| JP | 2018074268 A | 5/2018 |
| JP | 2018182496 A | 11/2018 |
| JP | 2019041200 A | 3/2019 |
| TW | 201838167 A | 10/2018 |
| WO | 2017/179319 A1 | 10/2017 |

OTHER PUBLICATIONS

Written Opinion of the International Search Authority (PCT/ISA/237), International Application No. PCT/JP2020/008246, dated Apr. 22, 2020.

Kazuko Nishimura, and other 11 persons. "An 8K4K Resolution 60fps 450keSaturation Signal Organic Photoconductive Film Global Shutter CMOS Image Sensor with In-Pixel Noise Canceller", International Solid-State Circuits Conference (ISSCC), Institute of Electrical and Electronics Engineers (IEEE), Digest of Technical Papers, 2018, p. 82-83.

* cited by examiner

[Fig. 32]
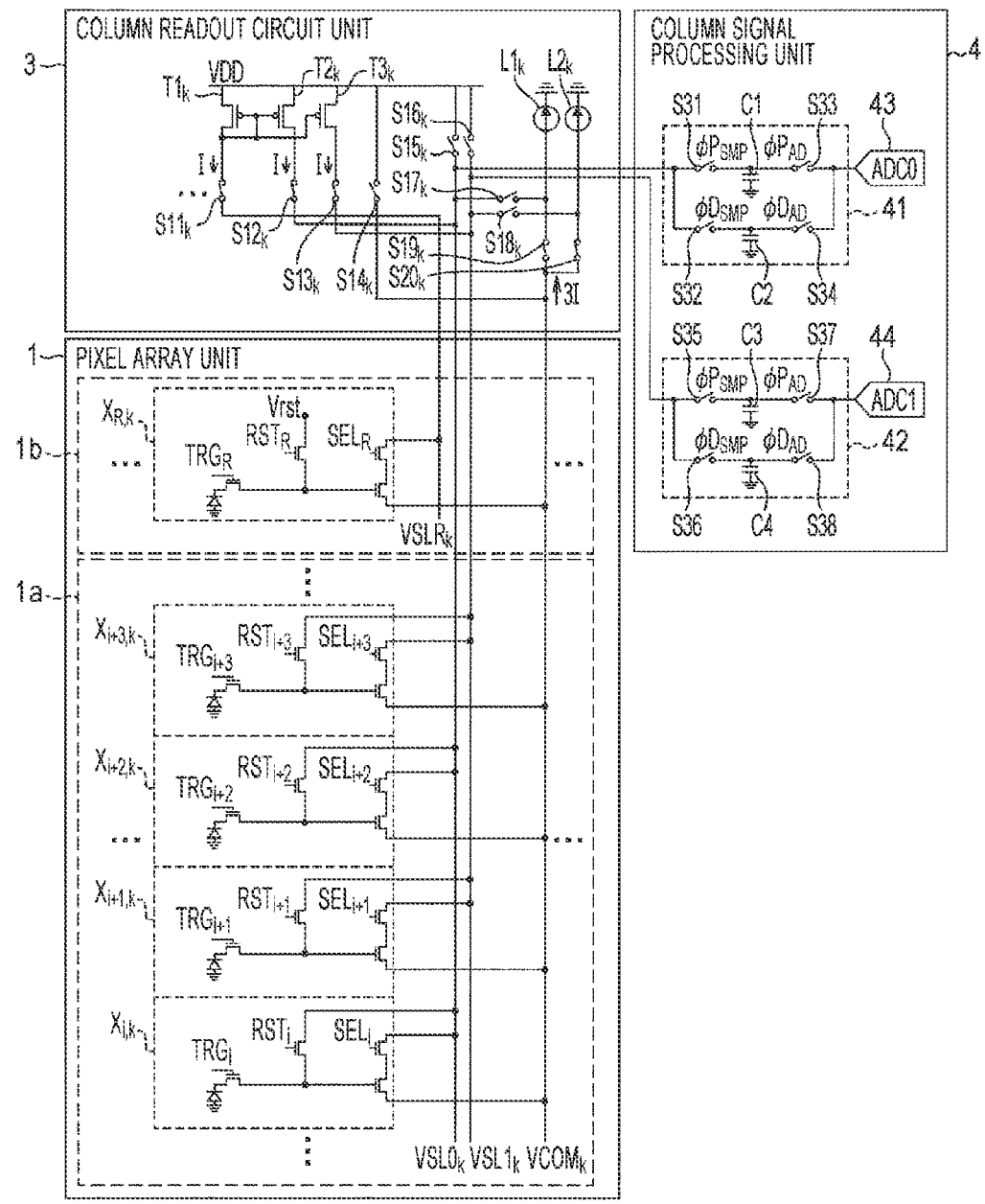

[Fig. 33]
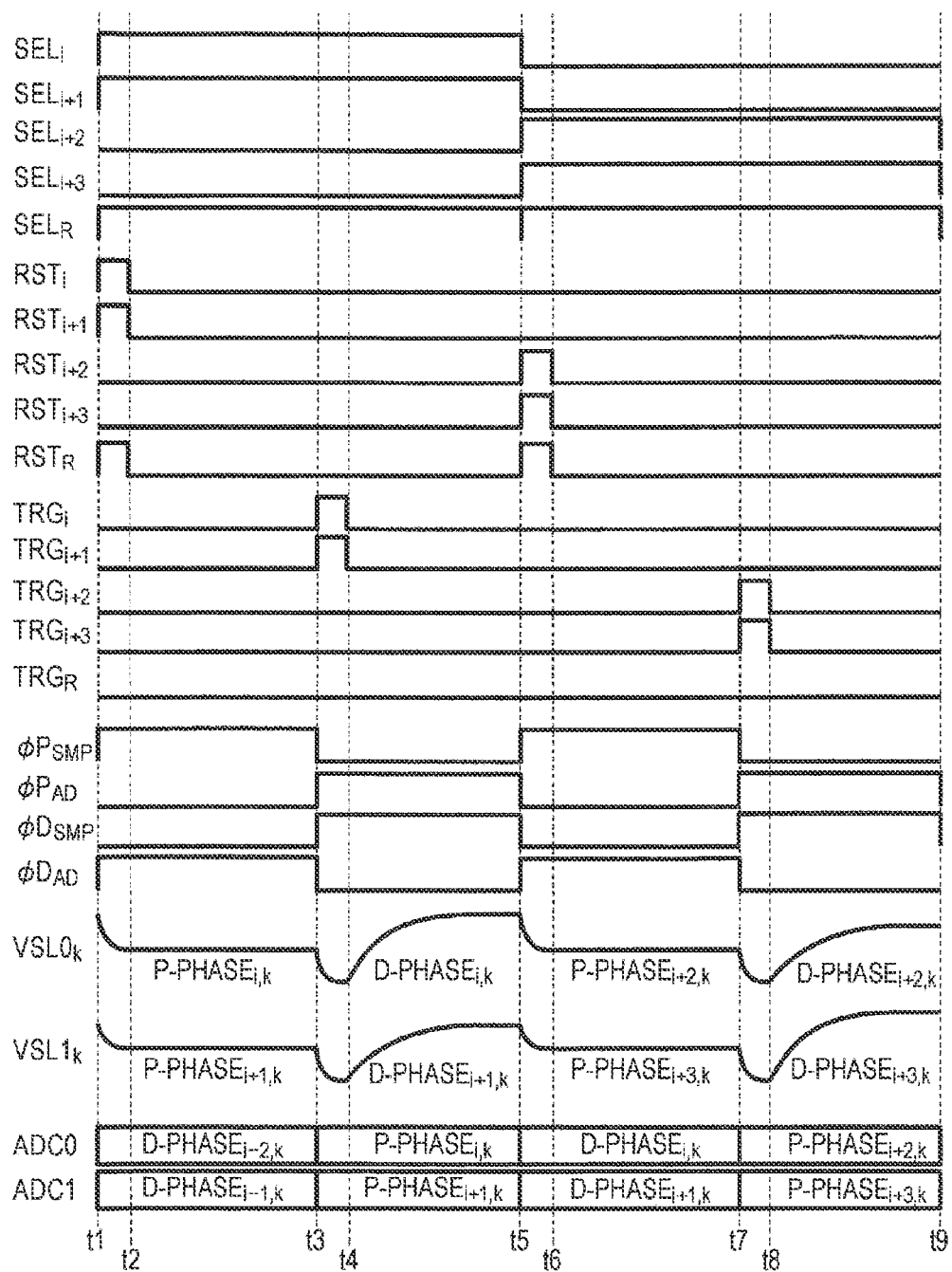

[Fig. 34]
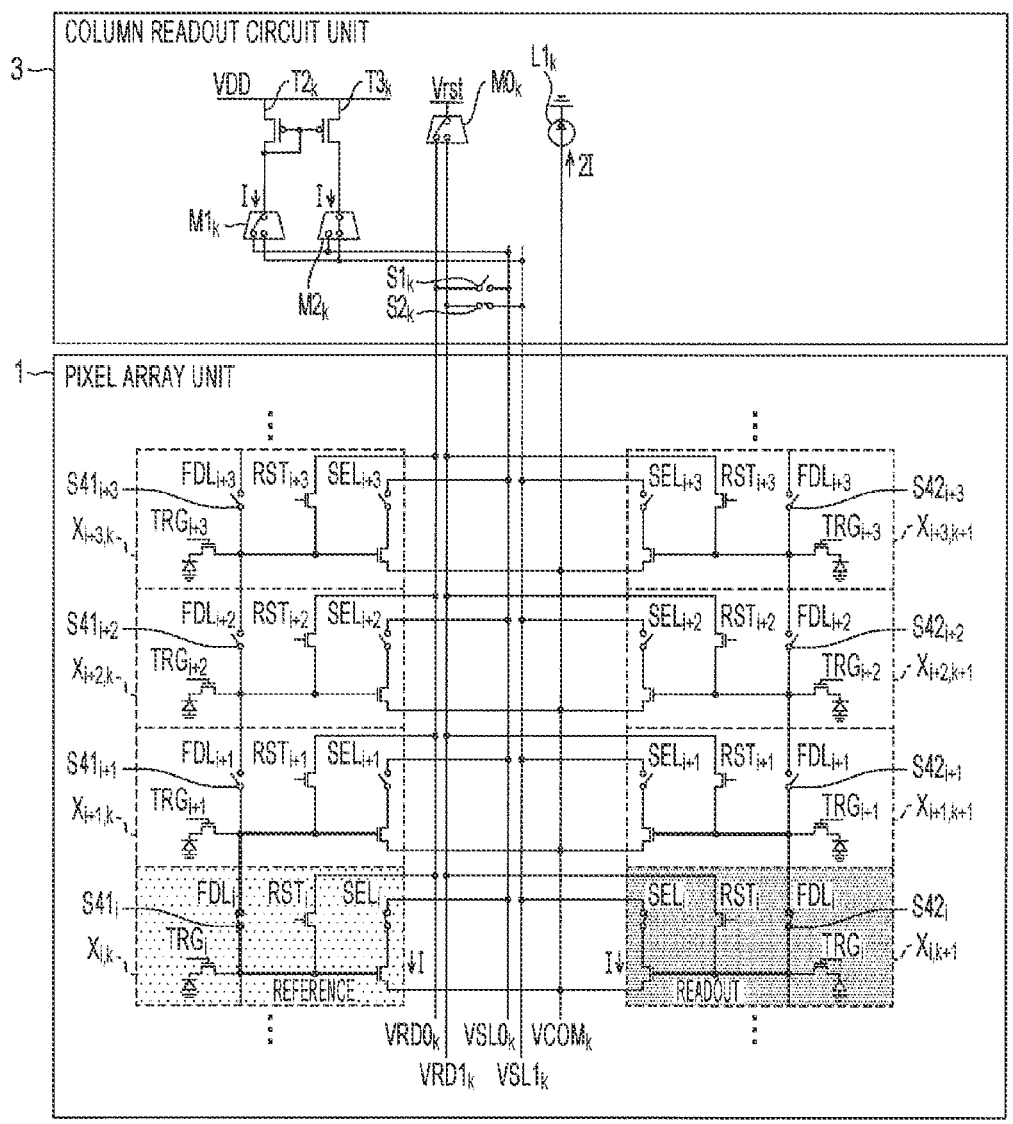

[Fig. 35]
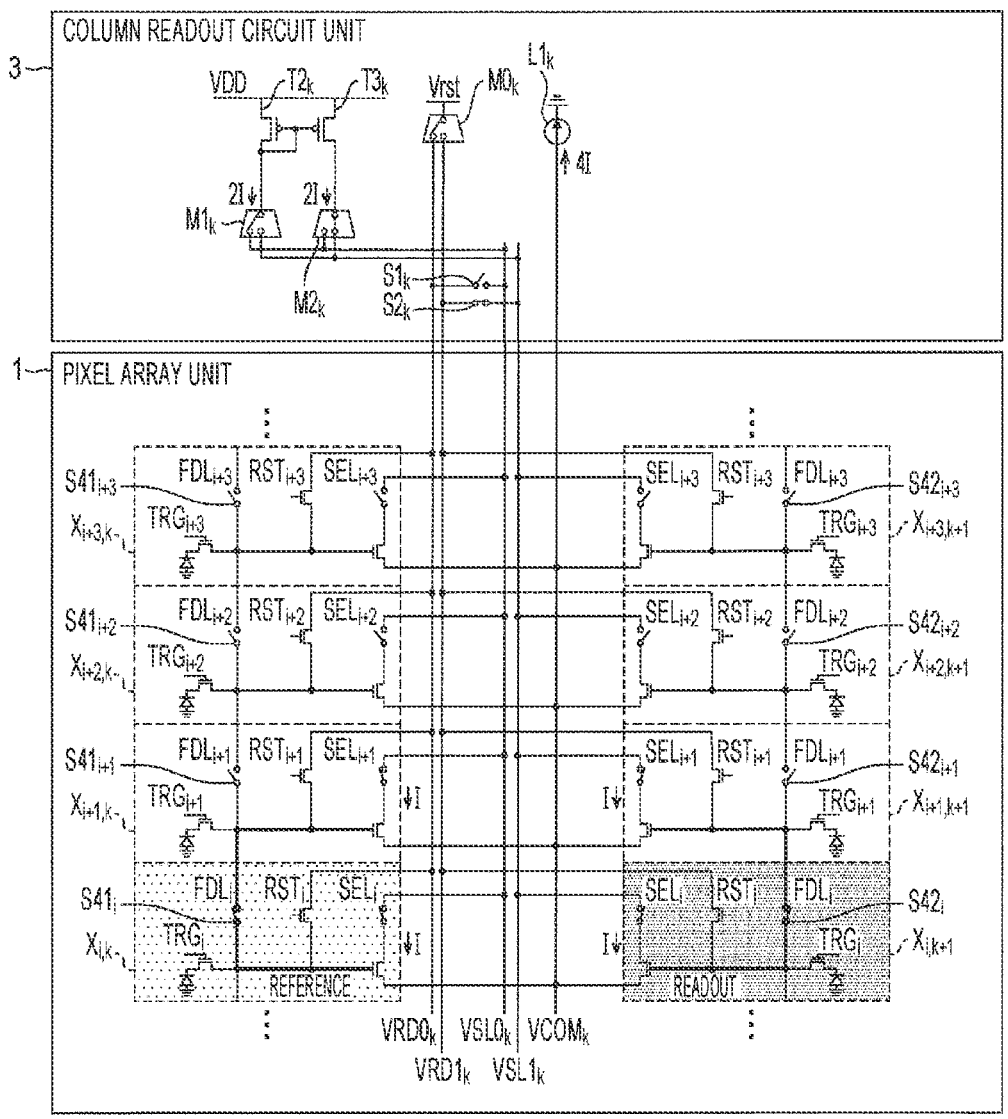

[Fig. 36A]
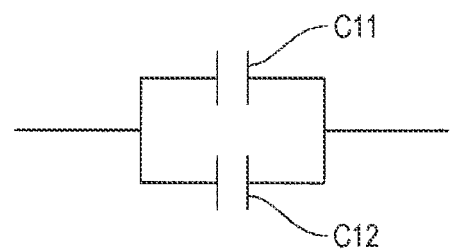
[Fig. 36B]
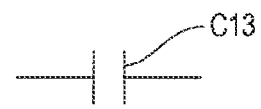

[Fig. 37]
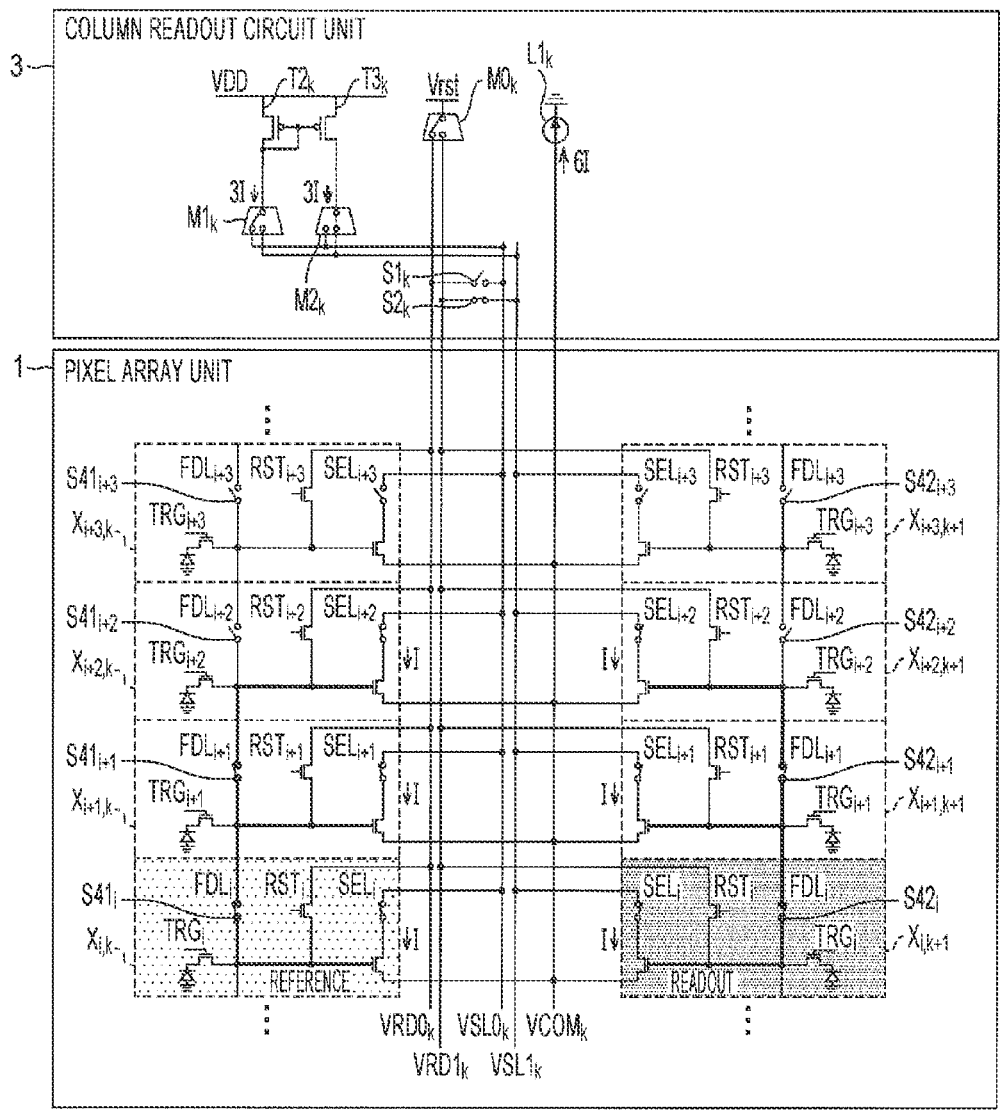

[Fig. 38]
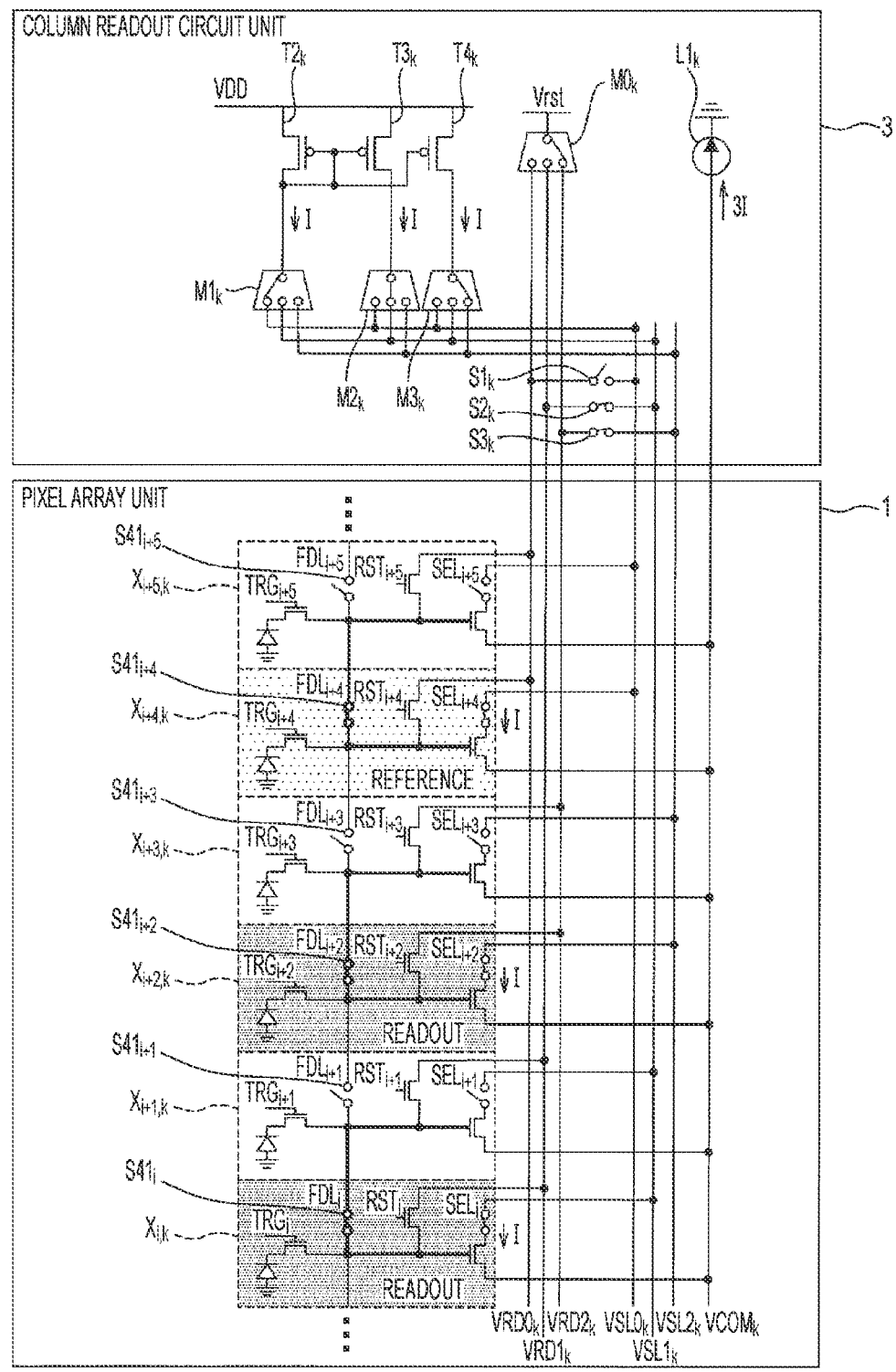

[Fig. 39]
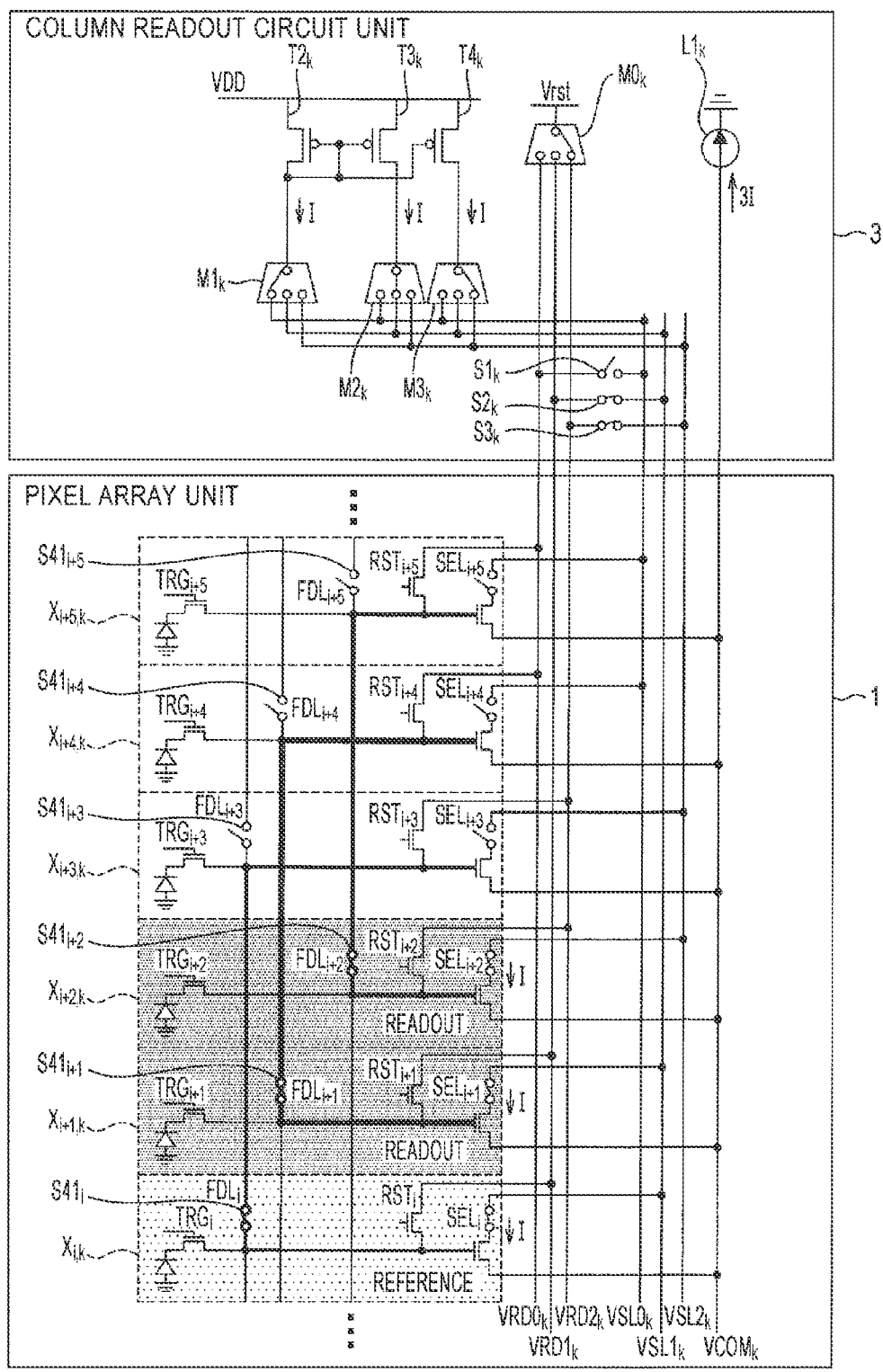

[Fig. 40]
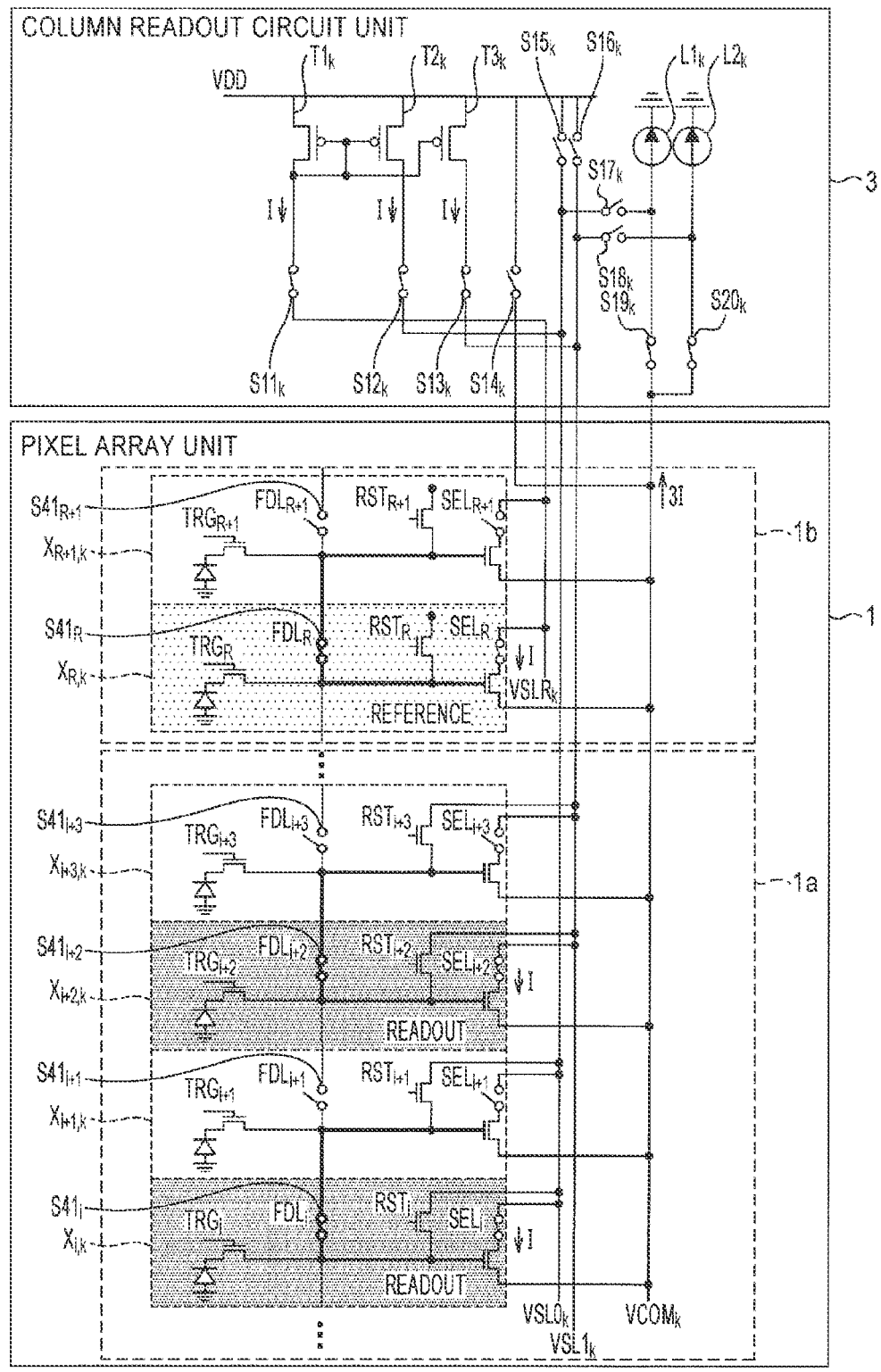

[Fig. 41]
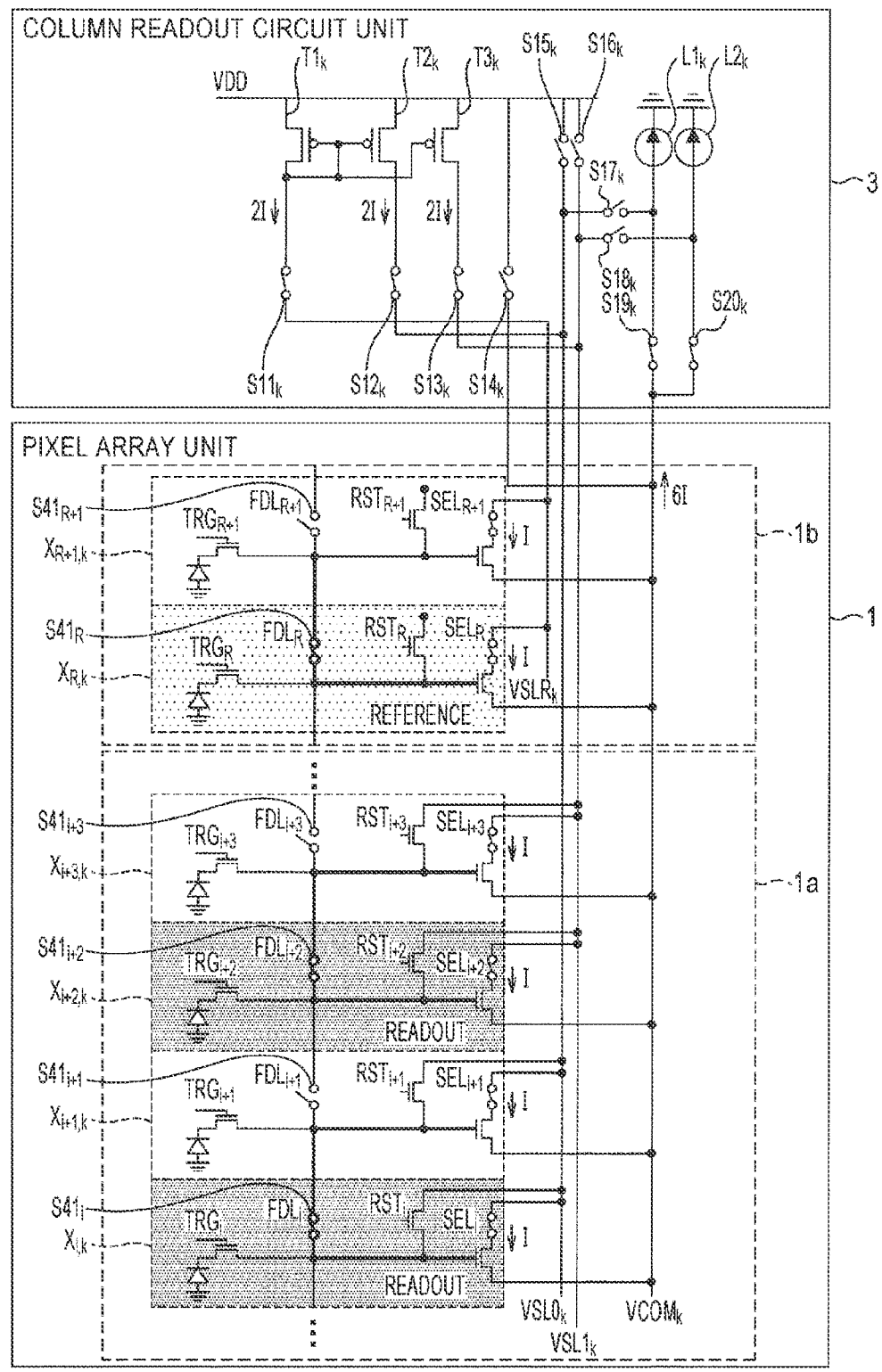

[Fig. 42]
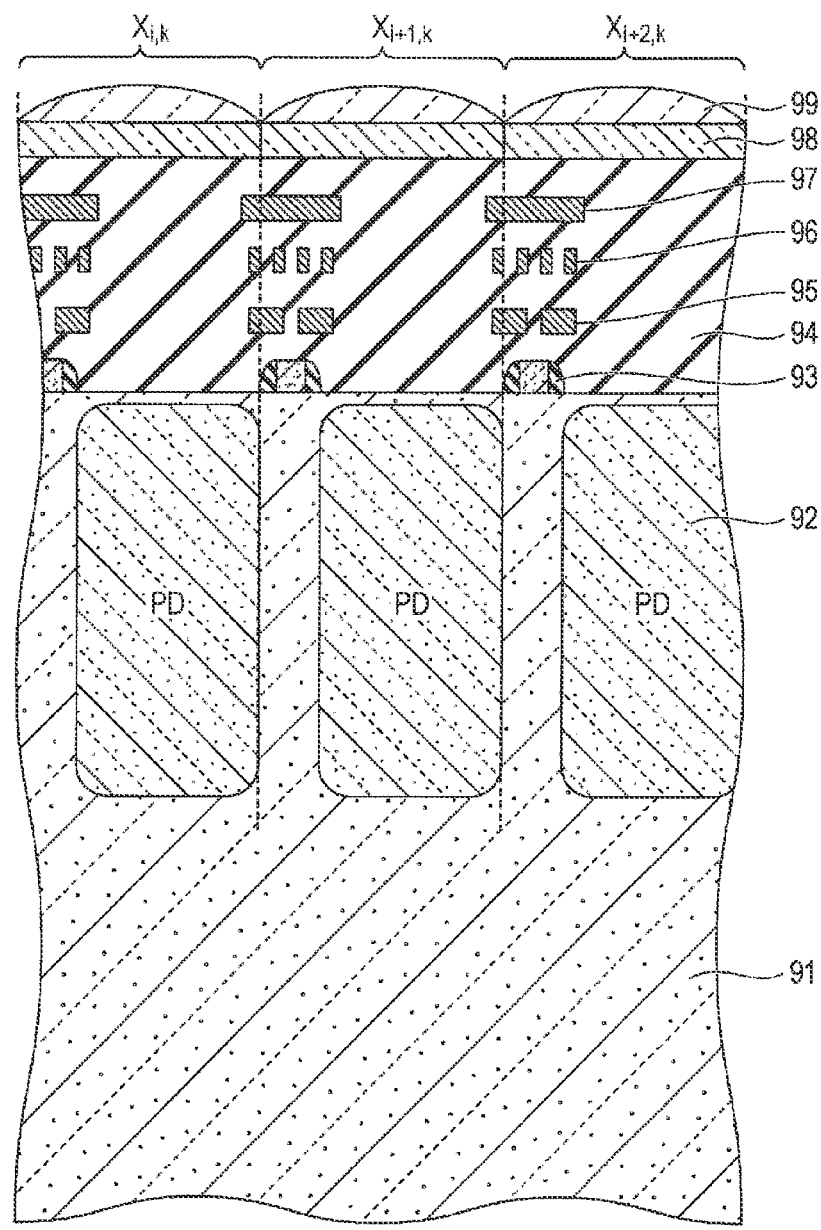

[Fig. 43]
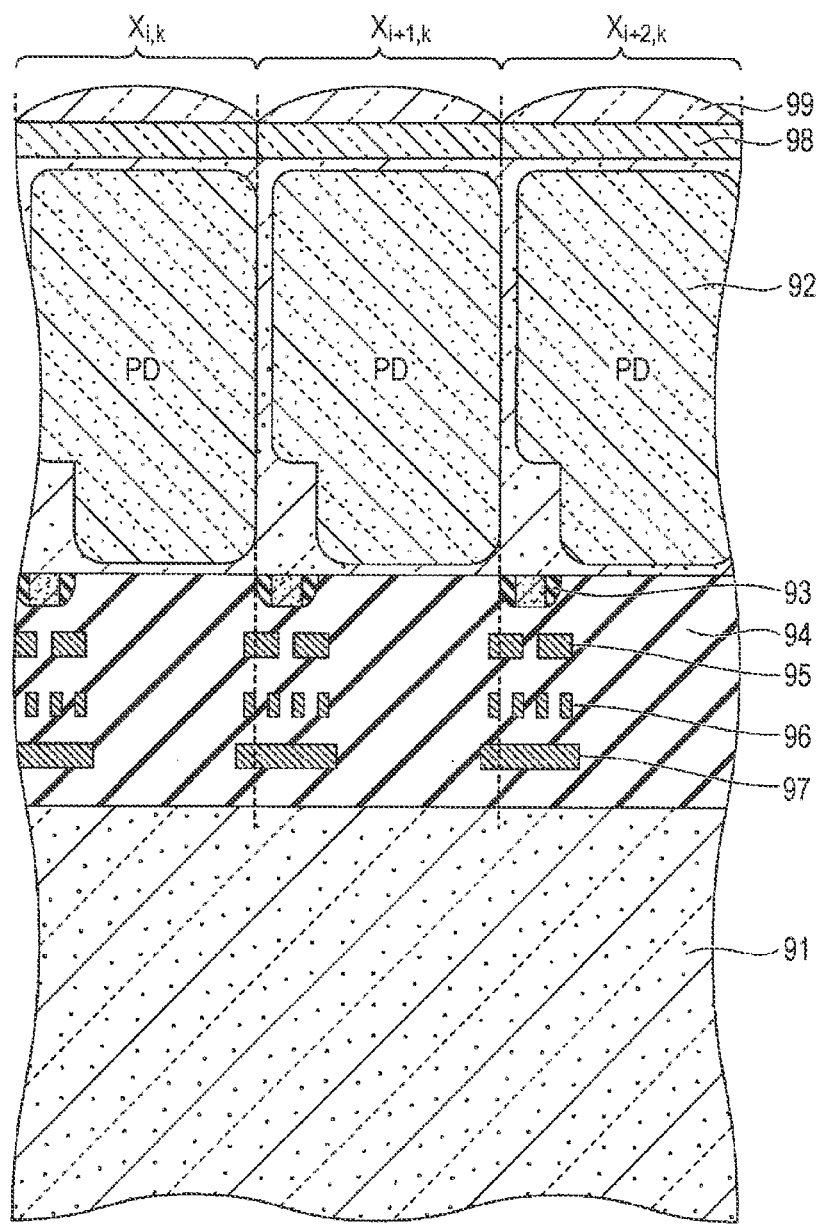

[Fig. 44]
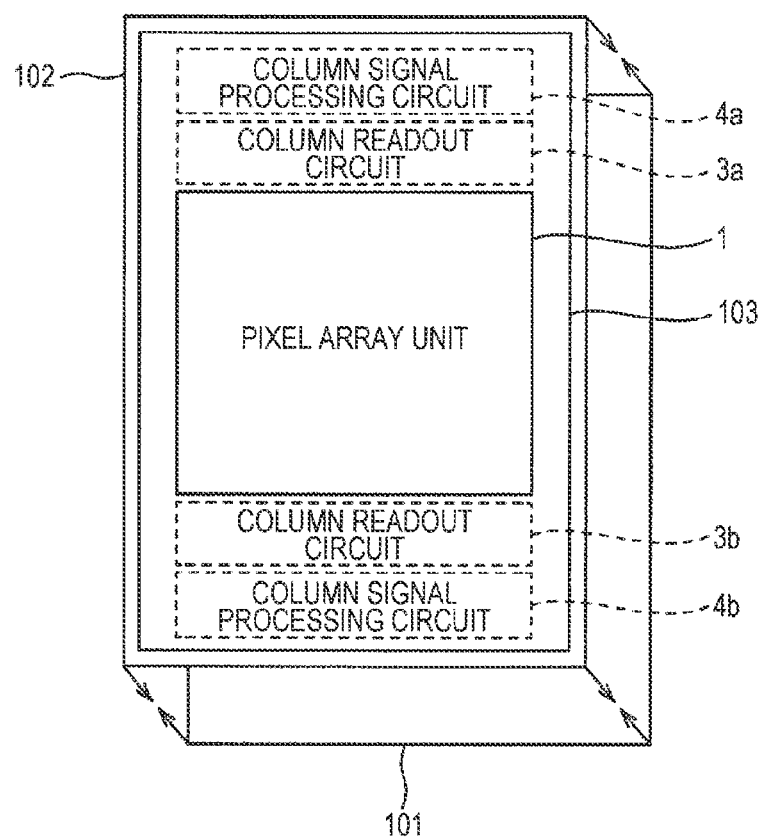

[Fig. 45]
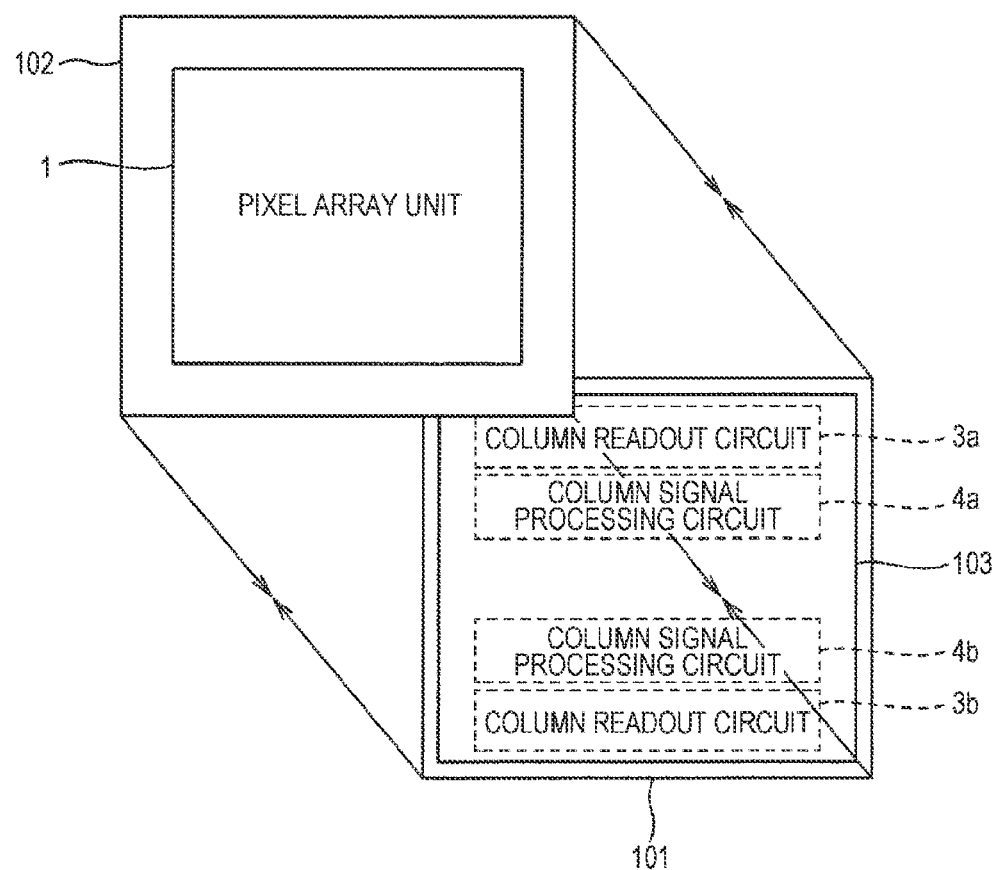

[Fig. 46]
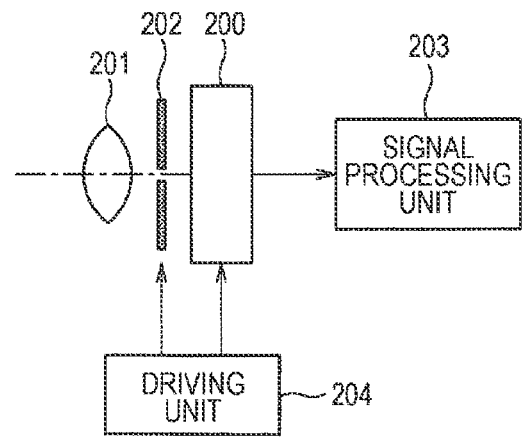

SOLID-STATE IMAGING APPARATUS AND ELECTRONIC DEVICE

CROSS REFERENCE TO RELATED APPLICATIONS

This application claims the benefit of Japanese Priority Patent Application JP 2019-093923 filed on May 17, 2019, the entire contents of which are incorporated herein by reference.

TECHNICAL FIELD

The technology according to the present disclosure (the present technology) relates to a solid-state imaging apparatus and an electronic device.

BACKGROUND ART

In the related art, a source follower CMOS image sensor (CIS) that performs readout with a source follower circuit using an amplification transistor is known. Also, there has been proposed a differential amplification CIS capable of increased gain and significantly higher conversion efficiency compared to a source follower CIS (see PTLs 1 to 3 and NPL 1). In a differential amplification CIS, a differential amplifier is formed by a readout pixel from which a pixel signal is read out and a reference pixel from which a pixel signal is not read out, and a pixel signal differentially amplified by the differential amplifier is read out.

CITATION LIST

Patent Literature

PTL 1: JP 2008-271280A
PTL 2: WO 2017/179319
PTL 3: JP 2003-259218A

Non Patent Literature

NPL 1: Kazuko Nishimura, and other 11 persons. "An 8K4K Resolution 60 fps 450ke-Saturation Signal Organic Photoconductive Film Global Shutter CMOS Image Sensor with In-Pixel Noise Canceller", International Solid-State Circuits Conference (ISSCC), Institute of Electrical and Electronics Engineers (IEEE), Digest of Technical Papers, 2018, p. 82-83.

SUMMARY

Technical Problem

In the differential amplification CIS, further performance improvements are demanded.

It is desirable to provide a differential amplification solid-state imaging apparatus in which further performance improvements may be attained.

Solution to Problem

According to an aspect to the present technology, there is provided a light detecting device including one or more switch transistors, a first pixel including a first photoelectric converter, a first floating diffusion region coupled to the first photoelectric converter through a first transfer transistor, and a first amplification transistor coupled to the first floating diffusion region, a second pixel in a column in which the first pixel is disposed, the second pixel including a second photoelectric converter, a second floating diffusion region coupled to the second photoelectric converter through a second transfer transistor, and a second amplification transistor coupled to the second floating diffusion region, and a third pixel in the column, the third pixel including a third photoelectric converter, a third floating diffusion region coupled to the third photoelectric converter through a third transfer transistor, and a third amplification transistor coupled to the third floating diffusion region, wherein a pixel signal is differentially amplified by the first amplification transistor and the third amplification transistor, and wherein the first floating diffusion region and the second floating diffusion region are selectively connected to each other via one of the one or more switch transistors.

According to another aspect of the present technology, there is provided a light detecting device above that further includes a plurality of reset transistors, the plurality of reset transistors including a first reset transistor configured to reset the first floating diffusion region, a second reset transistor configured to reset the second floating diffusion region, and a third reset transistor configured to reset the third floating diffusion region.

According to another aspect of the present technology, there is provided a light detecting device above, wherein a source of the first reset transistor or a drain of the first reset transistor is coupled to a power supply voltage, and a source of the third reset transistor or a drain of the third reset transistor is coupled to a first voltage line that provides a first voltage different from the power supply voltage.

According to another aspect of the present technology, there is provided a light detecting device above that further includes a fourth pixel in the column, the fourth pixel including a fourth photoelectric converter, a fourth floating diffusion region coupled to the fourth photoelectric converter through a fourth transfer transistor, and a fourth amplification transistor coupled to the fourth floating diffusion region, wherein the third floating diffusion region and the fourth floating diffusion region are selectively connected to each other via a second one of the one or more switch transistors.

According to another aspect of the present technology, there is provided a light detecting device above that further includes a current supply (VCOM) line that is disposed adjacent to the column, and an output signal (VSL) line that is disposed adjacent to the column.

According to another aspect of the present technology, there is provided a light detecting device above, wherein the current supply line is disposed between the first amplification transistor and a fourth amplification transistor of a fourth pixel, the fourth pixel disposed in an adjacent column to the column.

According to another aspect of the present technology, there is provided a light detecting device above, wherein the first amplification transistor is coupled to the current supply line, the second amplification transistor is coupled to the current supply line, and the third amplification transistor is coupled to the current supply line.

According to another aspect of the present technology, there is provided a light detecting device above, wherein the first amplification transistor is coupled to the output signal line, and the second amplification transistor is coupled to the output signal line.

According to another aspect of the present technology, there is provided a light detecting device above that further includes a second output signal (VSLR) line that is disposed adjacent to the column, the second output signal line being different than the output signal line, wherein the third amplification transistor is coupled to the second output signal line.

According to another aspect of the present technology, there is provided a light detecting device above, wherein the first pixel includes a first switch transistor from the one or more switch transistors, the first switch transistor being the one of the one or more switch transistors that is configured to electrically connect the first floating diffusion region to the second floating diffusion region, the second pixel includes a second switch transistor from the one or more switch transistors, the second switch transistor configured to electrically connect the second floating diffusion region to a fourth floating diffusion region, and the third pixel includes a third switch transistor from the one or more switch transistors, the third switch transistor configured to electrically connect the third floating diffusion region to a fifth floating diffusion region.

According to another aspect of the present technology, there is provided a light detecting device above that further includes a pixel array including the first pixel, the second pixel, and the third pixel, wherein the third pixel is a reference pixel that is positioned at an edge of the pixel array.

According to another aspect of the present technology, there is provided an electronic apparatus including a light detecting device that includes one or more switch transistors, a first pixel including a first photoelectric converter, a first floating diffusion region coupled to the first photoelectric converter through a first transfer transistor, and a first amplification transistor coupled to the first floating diffusion region, a second pixel in a column in which the first pixel is disposed, the second pixel including a second photoelectric converter, a second floating diffusion region coupled to the second photoelectric converter through a second transfer transistor, and a second amplification transistor coupled to the second floating diffusion region, and a third pixel in the column, the third pixel including a third photoelectric converter, a third floating diffusion region coupled to the third photoelectric converter through a third transfer transistor, and a third amplification transistor coupled to the third floating diffusion region, wherein a pixel signal is differentially amplified by the first amplification transistor and the third amplification transistor, and wherein the first floating diffusion region and the second floating diffusion region are selectively connected to each other via one of the one or more switch transistors.

According to another aspect of the present technology, there is provided an electronic apparatus above, wherein the light detecting device further includes a plurality of reset transistors, wherein the plurality of reset transistors includes a first reset transistor configured to reset the first floating diffusion region, a second reset transistor configured to reset the second floating diffusion region, and a third reset transistor configured to reset the third floating diffusion region.

According to another aspect of the present technology, there is provided an electronic apparatus above, wherein a source of the first reset transistor or a drain of the first reset transistor is coupled to a power supply voltage, and a source of the third reset transistor or a drain of the third reset transistor is coupled to a first voltage line that provides a first voltage different from the power supply voltage.

According to another aspect of the present technology, there is provided an electronic apparatus above, wherein the light detecting device further includes a fourth pixel in the column, the fourth pixel including a fourth photoelectric converter, a fourth floating diffusion region coupled to the fourth photoelectric converter through a fourth transfer transistor, and a fourth amplification transistor coupled to the fourth floating diffusion region, wherein the third floating diffusion region and the fourth floating diffusion region are selectively connected to each other via a second one of the one or more switch transistors.

According to another aspect of the present technology, there is provided an electronic apparatus above, wherein the light detecting device further includes a current supply (VCOM) line that is disposed adjacent to the column, and an output signal (VSL) line that is disposed adjacent to the column.

According to another aspect of the present technology, there is provided an electronic apparatus above, wherein the first amplification transistor is coupled to the current supply line, the second amplification transistor is coupled to the current supply line, and the third amplification transistor is coupled to the current supply line.

According to another aspect of the present technology, there is provided an electronic apparatus above, wherein the first amplification transistor is coupled to the output signal line, and the second amplification transistor is coupled to the output signal line.

According to another aspect of the present technology, there is provided an electronic apparatus above, wherein the first pixel includes a first switch transistor from the one or more switch transistors, the first switch transistor being the one of the one or more switch transistors that is configured to electrically connect the first floating diffusion region to the second floating diffusion region, the second pixel includes a second switch transistor from the one or more switch transistors, the second switch transistor configured to electrically connect the second floating diffusion region to a fourth floating diffusion region, and the third pixel includes a third switch transistor from the one or more switch transistors, the third switch transistor configured to electrically connect the third floating diffusion region to a fifth floating diffusion region.

According to another aspect of the present technology, there is provided an electronic apparatus above, wherein the light detecting device further includes a pixel array including the first pixel, the second pixel, and the third pixel, and wherein the third pixel is a reference pixel that is positioned at an edge of the pixel array.

BRIEF DESCRIPTION OF DRAWINGS

FIG. 32 is a circuit diagram of a part of a solid-state imaging apparatus according to the fourth embodiment.

FIG. 33 is a timing chart for explaining a readout operation by the solid-state imaging apparatus according to the fourth embodiment.

FIG. 34 is a circuit diagram of a part of a solid-state imaging apparatus according to a fifth embodiment.

FIG. 35 is a circuit diagram of a part of a solid-state imaging apparatus according to a first modification of the fifth embodiment.

FIG. 36A is a circuit diagram illustrating the parasitic capacitance of amplification transistors connected in parallel.

FIG. 36B is a circuit diagram illustrating the parasitic capacitance of an amplification transistor.

FIG. 37 is a circuit diagram of a part of a solid-state imaging apparatus according to a second modification of the fifth embodiment.

FIG. 38 is a circuit diagram of a part of a solid-state imaging apparatus according to a third modification of the fifth embodiment.

FIG. 39 is a circuit diagram of a part of a solid-state imaging apparatus according to a fourth modification of the fifth embodiment.

FIG. 40 is a circuit diagram of a part of a solid-state imaging apparatus according to a fifth modification of the fifth embodiment.

FIG. 41 is a circuit diagram of a part of a solid-state imaging apparatus according to a sixth modification of the fifth embodiment.

FIG. 42 is a schematic cross-sectional view illustrating an example of applying a solid-state imaging apparatus according to a sixth embodiment to a front-illuminated CIS.

FIG. 43 is a schematic cross-sectional view illustrating an example of applying the solid-state imaging apparatus according to the sixth embodiment to a back-illuminated CIS.

FIG. 44 is a schematic diagram illustrating an example of applying the solid-state imaging apparatus according to the sixth embodiment to a back-illuminated CIS.

FIG. 45 is a schematic diagram illustrating an example of applying the solid-state imaging apparatus according to the sixth embodiment to a back-illuminated CIS.

FIG. 46 is a schematic diagram illustrating an example of applying the solid-state imaging apparatus according to the sixth embodiment to an electronic device.

DESCRIPTION OF EMBODIMENTS

In the following, first to sixth embodiments of the present technology will be described with reference to the drawings. In the notation of the diagrams referenced in the following description, identical or similar portions are denoted with identical or similar signs. However, it should be appreciated that the diagrams are schematic illustrations, and features such as the relationship between thickness and planar dimension and the ratio of the thickness of each layer may be different from actual features. Consequently, specific thicknesses and dimensions should be determined in consideration of the following description. Also, the relationships and ratios of dimensions with respect to each other in different drawings obviously may include some portions that differ from each other. Note that the effects described in this specification are merely for the sake of example and non-limiting, and there may be other additional effects.

Also, the definition of directions such as up and down in the following description are simply definitions for the sake of convenience, and do not limit the technical ideas of the present technology. For example, it is obvious that up and down is reinterpreted as left and right when observing the target rotated 90°, and up and down is interpreted as being reversed when observing the target rotated 180°.

First Embodiment

As described above, there has been proposed a differential amplification CIS capable of increased gain and significantly higher conversion efficiency compared to a source follower CIS of the related art. In a differential amplification CIS, there are many vertical signal lines compared to a source follower CIS, and because the line area takes up space, the vertical signal lines pose an impediment to the miniaturization of the pixels. Additionally, there are also problems in the case of reading out from multiple rows at the same time for faster operation. Accordingly, the first embodiment describes a differential amplification solid-state imaging apparatus in which the number of vertical signal lines can be reduced.

<Configuration of Solid-State Imaging Apparatus>

A CIS is illustrated as an example of the solid-state imaging apparatus according to the first embodiment. A CIS captures incident light (image light) from a subject, converts the light intensity of the incident light formed into an image on an imaging surface into electrical signals in units of pixels, and outputs the electrical signals as pixel signals.

Figure 1:
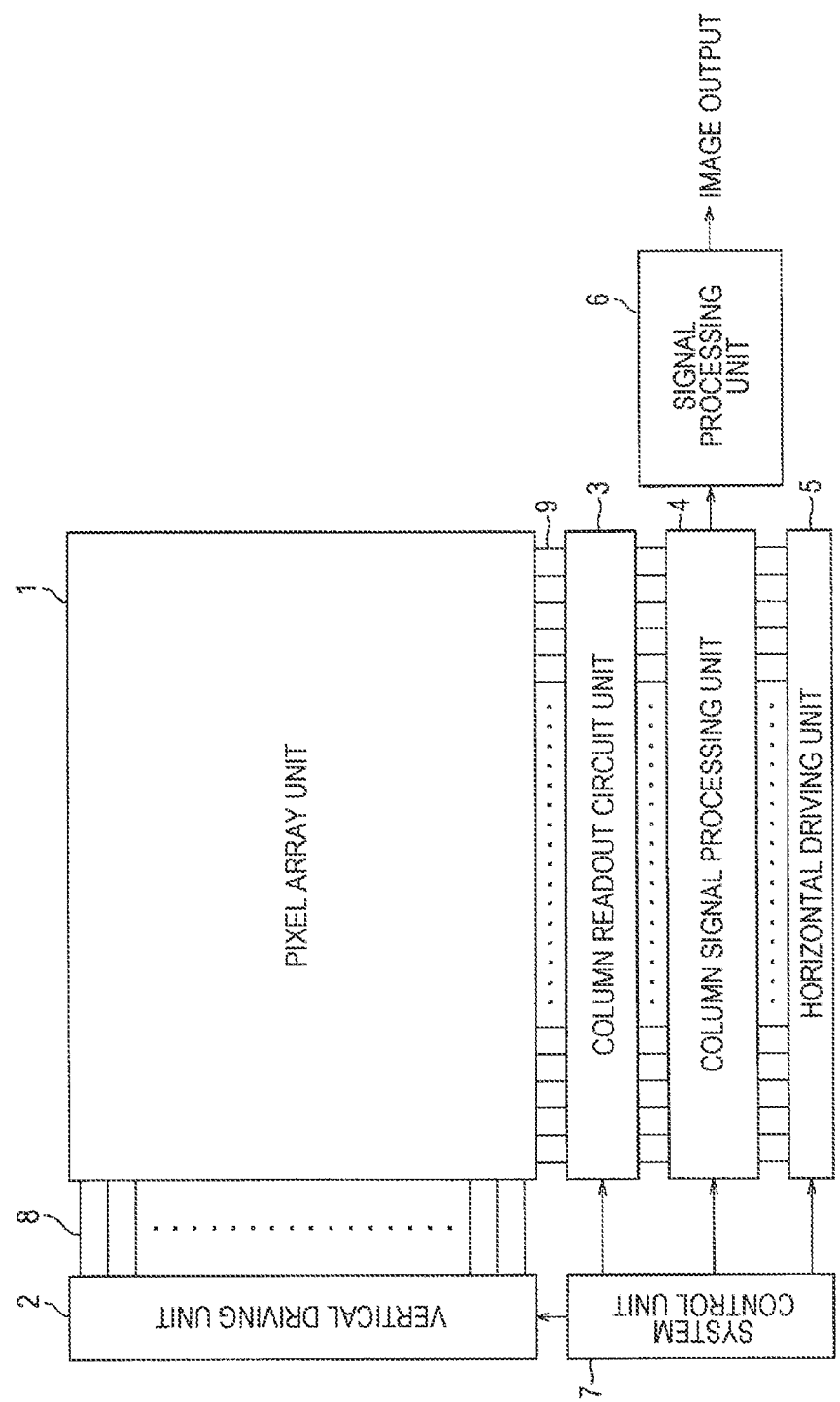
FIG. 1 is a schematic configuration diagram of a solid-state imaging apparatus according to a first embodiment.

As illustrated in FIG. 1, the solid-state imaging apparatus according to the first embodiment is provided with a pixel array unit 1 and peripheral circuits (2, 3, 4, 5, 6, and 7). In the solid-state imaging apparatus according to the first embodiment, the configuration illustrated in FIG. 1 may be provided on a single substrate, or the configuration may have a laminate structure in which a plurality of substrates is stuck together.

The pixel array unit 1 has a plurality of pixels arranged in a two-dimensional layout of rows and columns (a matrix). Each of the plurality of pixels includes a photoelectric conversion unit capable of photoelectrically converting and internally storing a quantity of charge corresponding to the amount of incident light, and outputting the stored charge as a signal. The photoelectric conversion unit includes a photodiode, for example. In the pixel array unit 1, pixel driving lines 8 are respectively connected to every pixel row, and vertical signal lines 9 are respectively connected to every pixel column. The pixel driving lines 8 are a group of lines that accept signals such as a transfer signal, a select signal, and a reset signal as input. The vertical signal lines 9 are a group of lines such as output signal lines, reset input lines, and current supply lines.

The peripheral circuits (2, 3, 4, 5, 6, and 7) include a vertical driving unit 2, a column readout circuit unit 3, a column signal processing unit 4, a horizontal driving unit 5, a signal processing unit 6, and a system control unit 7. The vertical driving unit 2 includes for example a shift register, an address decoder, or the like. The vertical driving unit 2 successively selects the pixel driving lines 8, supplies pulses for driving pixels to the selected pixel driving line 8, and drives each of the pixels in units of rows.

The column readout circuit unit 3 includes a circuit that supplies a constant current, a current mirror circuit, and the like for every pixel column, and forms a differential amplifier together with transistors inside the pixels of the pixel array unit 1. The column readout circuit unit 3 reads out signals from the pixel array unit 1 to the vertical signal lines 9.

The column signal processing unit 4 is disposed for every pixel column, for example, and processes the signals output from individual rows of pixels for every pixel column. For example, the column signal processing unit 4 performs signal processing such as correlated double sampling (CDS) and analog-digital (AD) conversion. CDS is a process that reduces fixed-pattern noise by reading out a signal from a pixel twice and treating the difference between the two readings as the pixel data. The signal read out in the first time is a reset level for example, and is referred to as P-phase level. The signal read out in the second time is a signal level for example, and is referred to as D-phase level.

The horizontal driving unit 5 includes for example a shift register, an address decoder, or the like. The horizontal driving unit 5 successively outputs horizontal scan pulses to the column signal processing unit 4, sequentially selects the column signal processing unit 4, and causes the selected column signal processing unit 4 to output a processed pixel signal. The signal processing unit 6 performs signal processing on the pixel signals output from the column signal processing unit 4, and outputs processed image data.

The system control unit 7 generates control signals and clock signals that serve as a reference for operations by the vertical driving unit 2, the column readout circuit unit 3, the column signal processing unit 4, the horizontal driving unit 5, and the like on the basis of a vertical synchronization signal, a horizontal synchronization signal, and a master clock signal, and outputs the generated clock signals and control signals to the vertical driving unit 2, the column readout circuit unit 3, the column signal processing unit 4, the horizontal driving unit 5, and the like.

Figure 2:
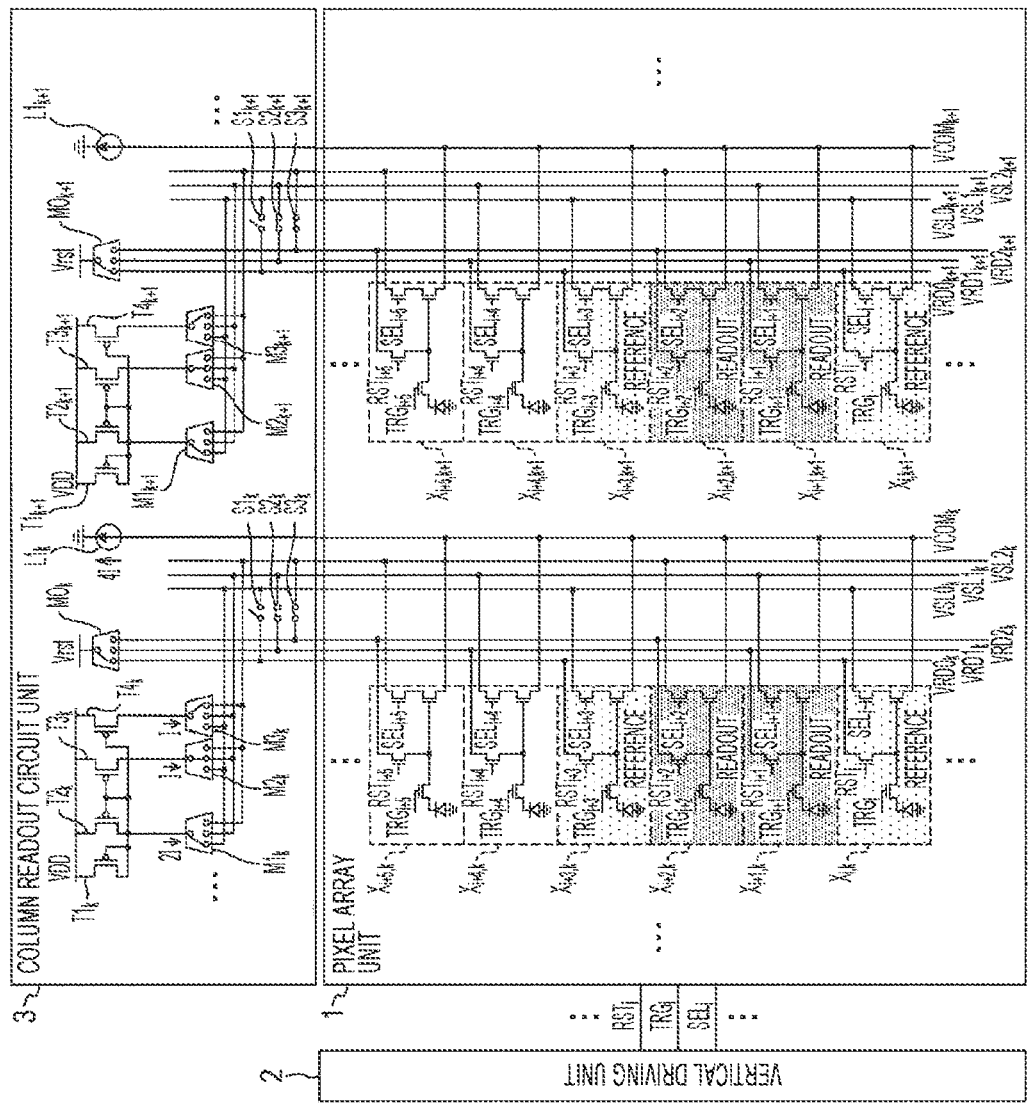
FIG. 2 is a circuit diagram of a part of the solid-state imaging apparatus according to the first embodiment.

As illustrated in FIG. 2, the pixel array unit 1 includes a plurality of pixels $X_{i,k}$, $X_{i+1,k}$, $X_{i+2,k}$, $X_{i+3,k}$, $X_{i+4,k}$, $X_{i+5,k}$, $X_{i,k+1}$, $X_{i+1,k+1}$, $X_{i+2,k+1}$, $X_{i+3,k+1}$, $X_{i+4,k+1}$, and $X_{i+5,k+1}$ arranged in a row direction (horizontal direction) and a column direction (vertical direction). The row direction is defined as the left-and-right direction of FIG. 2, while the column direction is defined as the top-and-bottom direction of FIG. 2. In FIG. 2, the pixels $X_{i,k}$, $X_{i+1,k}$, $X_{i+2,k}$, $X_{i+3,k}$, $X_{i+4,k}$, $X_{i+5,k}$, $X_{i,k+1}$, $X_{i+1,k+1}$, $X_{i+2,k+1}$, $X_{i+3,k+1}$, $X_{i+4,k+1}$, and $X_{i+5,k+1}$ in the kth (where k is an integer) and (k+1)th columns and also in the ith (where i is an integer) to (i+5)th rows are schematically illustrated, whereas illustration of the other pixels is omitted. Also, the notations such as "I", "2I", and "4I" and the arrows illustrated in the circuit diagrams in FIG. 2 and thereafter indicate magnitudes and flows of current.

Figure 3:
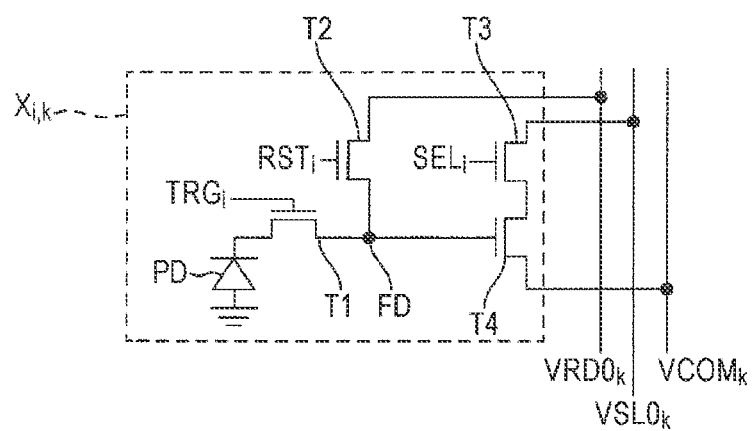
FIG. 3 is a circuit diagram of a pixel according to the first embodiment.

As illustrated in FIG. 3, the pixel $X_{i,k}$ illustrated in FIG. 2 includes a photoelectric conversion unit including a photodiode PD that photoelectrically converts incident light, and a plurality of pixel transistors (T1, T2, T3, and T4) that controls the photoelectrically-converted signal charge. The plurality of pixel transistors (TI, T2, T3, and T4) includes a transfer transistor T1, a reset transistor T2, a select transistor T3, and an amplification transistor T4, for example. The transfer transistor T1, the reset transistor T2, the select transistor T3, and the amplification transistor T4 are n-channel MOS transistors, for example.

As illustrated in FIG. 3, the anode of the photodiode PD is grounded, while the cathode of the photodiode PD is connected to the source of the transfer transistor T1. The drain of the transfer transistor T1 is connected to a floating diffusion (FD). A transfer signal $TRG_i$ is applied to the gate of the transfer transistor T1. The transfer transistor T1 transfers the signal charge generated by the photodiode PD to the floating diffusion FD on the basis of the transfer signal $TRG_i$.

The floating diffusion FD is connected to the source of the reset transistor T2 and the gate of the amplification transistor T4. The floating diffusion FD stores charge transferred by the transfer transistor T1. The potential of the floating diffusion FD is modulated according to the amount of charge stored in the floating diffusion FD.

The source of the amplification transistor T4 is connected to a current supply line $VCOM_k$, while the drain of the amplification transistor T4 is connected to the source of the select transistor T3. The amplification transistor T4 amplifies the potential of the floating diffusion FD, and outputs a current corresponding to the potential of the floating diffusion FD to an output signal line $VSL0_k$.

The drain of the select transistor T3 is connected to the output signal line $VSL0_k$. A select signal $SEL_i$ is applied to the gate of the select transistor T3. The select transistor T3 selects the pixel $X_{i,k}$ as the readout pixel on the basis of the select signal $SEL_i$.

The drain of the reset transistor T2 is connected to a reset input line $VRD0_k$. A reset signal $RST_i$ is applied to the gate of the reset transistor T2. The reset transistor T2 discharges (resets) the charge stored in the floating diffusion FD on the basis of the reset signal $RST_i$. Note that in the case where the polarity of the photodiode PD is reversed, the source and drain of the reset transistor T2 may be connected in reverse. In this case, the drain of the reset transistor T2 is connected to the floating diffusion FD while the source of the reset transistor T2 is connected to the reset input line $VRD0_k$.

The pixels $X_{i,k}$, $X_{i+1,k}$, $X_{i+2,k}$, $X_{i+3,k}$, $X_{i+4,k}$, $X_{i+5,k}$, $X_{i,k+1}$, $X_{i+1,k+1}$, $X_{i+2,k+1}$, $X_{i+3,k+1}$, $X_{i+4,k+1}$, and $X_{i+5,k+1}$ illustrated in FIG. 2 likewise have a configuration similar to the pixel $X_{i,k}$ illustrated in FIG. 3.

As illustrated in FIG. 2, in each of the pixels $X_{i,k}$ and $X_{i,k+1}$ in the same ith row, the transfer signal $TRG_i$ is applied to the gate of the transfer transistor, the reset signal $RST_i$ is applied to the gate of the reset transistor, and the select signal $SEL_i$ is applied to the gate of the select transistor. In each of the pixels $X_{i+1,k}$ and $X_{i+1,k+1}$ in the same (i+1)th row, the transfer signal $TRG_{i+1}$ is applied to the gate of the transfer transistor, the reset signal $RST_{i+1}$ is applied to the gate of the reset transistor, and the select signal $SEL_{i+1}$ is applied to the gate of the select transistor.

In each of the pixels $X_{i+2,k}$ and $X_{i+2,k+1}$ in the same (i+2)th row, the transfer signal $TRG_{i+2}$ is applied to the gate of the transfer transistor, the reset signal $RST_{i+2}$ is applied to the gate of the reset transistor, and the select signal $SEL_{i+2}$ is applied to the gate of the select transistor. In each of the pixels $X_{i+3,k}$ and $X_{i+3,k+1}$ in the same (i+3)th row, the transfer signal $TRG_{i+3}$ is applied to the gate of the transfer transistor, the reset signal $RST_{i+3}$ is applied to the gate of the reset transistor, and the select signal $SEL_{i+3}$ is applied to the gate of the select transistor.

In each of the pixels $X_{i+4,k}$ and $X_{i+4,k+1}$ in the same (i+4)th row, the transfer signal $TRG_{i+4}$ is applied to the gate of the transfer transistor, the reset signal $RST_{i+4}$ is applied to the gate of the reset transistor, and the select signal $SEL_{i+4}$ is applied to the gate of the select transistor. In each of the pixels $X_{i+5,k}$ and $X_{i+5,k+1}$ in the same (i+5)th row, the transfer signal $TRG_{i+5}$ is applied to the gate of the transfer transistor, the reset signal $RST_{i+5}$ is applied to the gate of the reset transistor, and the select signal $SEL_{i+5}$ is applied to the gate of the select transistor.

In the solid-state imaging apparatus according to the first embodiment, a differential amplifier is formed by the pair (differential pair) of a readout pixel that reads out the signal charge and a reference pixel given a reference voltage with no signal charge. For example, the readout pixel is successively selected from among the plurality of pixels $X_{i,k}$, $X_{i+1,k}$, $X_{i+2,k}$, $X_{i+3,k}$, $X_{i+4,k}$, $X_{i+5,k}$, $X_{i,k+1}$, $X_{i+1,k+1}$, $X_{i+2,k+1}$, $X_{i+3,k+1}$, $X_{i+4,k+1}$, and $X_{i+5,k+1}$. The reference pixel may be successively selected from among the plurality of pixels $X_{i,k}$, $X_{i+1,k}$, $X_{i+2,k}$, $X_{i+3,k}$, $X_{i+4,k}$, $X_{i+5,k}$, $X_{i,k+1}$, $X_{i+1,k+1}$, $X_{i+2,k+1}$, $X_{i+3,k+1}$, $X_{i+4,k+1}$, and $X_{i+5,k+1}$ to track the readout pixel, or the reference pixel may be fixed in advance. Herein, as schematically illustrated by hatching in FIG. 2, a case will be described in which the pixels $X_{i,k}$, $X_{i+3,k}$, $X_{i,k+1}$, and $X_{i+3,k+1}$ are selected as reference pixels and the pixels $X_{i+1,k}$, $X_{i+2,k}$, $X_{i+1,k+1}$, and $X_{i+2,k+1}$ are selected as readout pixels.

Reset input lines $VRD1_k$ and $VRD2_k$ are respectively connected to the drain of the reset transistor of the readout pixels $X_{i+1,k}$ and $X_{i+2,k}$ in the kth column. Output signal lines $VSL1_k$ and $VSL2_k$ are respectively connected to the drain of the select transistor of the readout pixels $X_{i+1,k}$ and $X_{i+2,k}$. A common current supply line $VCOM_k$ is connected to the source of the amplification transistor of the readout pixels $X_{i+1,k}$ and $X_{i+2,k}$. A common reset input line $VRD0_k$ is connected to the drain of the reset transistor of the reference pixels $X_{i,k}$ and $X_{i+3,k}$ in the kth column. A common output signal line $VSL0_k$ is connected to the drain of the select transistor of the reference pixels $X_{i,k}$ and $X_{i+3,k}$. A common current supply line $VCOM_k$ is connected to the source of the amplification transistor of the reference pixels $X_{i,k}$ and $X_{i+3,k}$.

Reset input lines $VRD1_{k+1}$ and $VRD2_{k+1}$ are respectively connected to the drain of the reset transistor of the readout pixels $X_{i+1,k+1}$ and $X_{i+2,k+1}$ in the (k+1)th column. Output signal lines $VSL1_{k+1}$ and $VSL2_{k+1}$ are respectively connected to the drain of the select transistor of the readout pixels $X_{i+1,k+1}$ and $X_{i+2,k+1}$. A common current supply line $VCOM_{k+1}$ is connected to the source of the amplification transistor of the readout pixels $X_{i+1,k+1}$ and $X_{i+2,k+1}$. A common reset input line $VRD0_{k+1}$ is connected to the drain of the reset transistor of the reference pixels and $X_{i,k+1}$ and $X_{i+3,k+1}$ in the (k+1)th column. A common output signal line $VSL0_{k+1}$ is connected to the drain of the select transistor of the reference pixels $X_{i,k+1}$ and $X_{i+3,k+1}$. A common current supply line $VCOM_{k+1}$ is connected to the source of the amplification transistor of the reference pixels $X_{i,k+1}$ and $X_{i+3,k+1}$.

The column readout circuit unit 3 has a configuration corresponding to each of the kth and (k+1)th columns. As the configuration corresponding to the kth column, the column readout circuit unit 3 includes a switch $M0_k$ disposed between a reset voltage $V_{rst}$ and the reset input lines $VRD0_k$, $VRD1_k$, and $VRD2_k$. The switch $M0_k$ switches the connection destination of the reset voltage $V_{rst}$ to one of the reset input lines $VRD0_k$, $VRD1_k$, and $VRD2_k$. The switch $M0_k$ connects the connection destination of the reset voltage $V_{rst}$ to the reset input line $VRD0_k$ connected to the drain of the reset transistor of the reference pixels $X_{i,k}$ and $X_{i+3,k}$.

Additionally, the column readout circuit unit 3 includes transistors $T1_k$, $T2_k$, $T3_k$, and $T4_k$ that form a current mirror circuit. The transistors $T1_k$, $T2_k$, $T3_k$, and $T4_k$ are p-channel MOS transistors, for example. The drains of the transistors $T1_k$, $T2_k$, $T3_k$, and $T4_k$ are connected to a power supply voltage VDD. The gates of the transistors $T1_k$, $T2_k$, $T3_k$, and $T4_k$ are connected to each other and are also connected to the sources of the transistors $T1_k$ and $T2_k$. The transistors $T1_k$ and $T2_k$ output a signal current 2I from the source. The transistors $T3_k$ and $T4_k$ respectively output a reference current I from the source.

Furthermore, the column readout circuit unit 3 includes a switch $M1_k$ disposed between the sources of the transistors $T1_k$ and $T2_k$ and the output signal lines $VSL0_k$, $VSL1_k$, and $VSL2_k$, a switch $M2_k$ disposed between the source of the transistor $T3_k$ and the output signal lines $VSL0_k$, $VSL1_k$, and $VSL2_k$, and a switch $M3_k$ disposed between the source of the transistor $T4_k$ and the output signal lines $VSL0_k$, $VSL1_k$, and $VSL2_k$. The switch $M1_k$ is capable of switching the connection destination of the transistors $T1_k$ and $T2_k$ to one of the output signal lines $VSL0_k$, $VSL1_k$, and $VSL2_k$, and is connected to the output signal line $VSL0_k$. The switch $M2_k$ is capable of switching the connection destination of the transistor $T3_k$ to one of the output signal lines $VSL0_k$, $VSL1_k$, and $VSL2_k$, and is connected to the output signal line $VSL1_k$. The switch $M3_k$ is capable of switching the connection destination of the transistor $T4_k$ to one of the output signal lines $VSL0_k$, $VSL1_k$, and $VSL2_k$, and is connected to the output signal line $VSL2_k$.

Furthermore, the column readout circuit unit 3 includes a switch $S1_k$ disposed between the reset input line $VRD0_k$ and the output signal line $VSL0_k$, a switch $S2_k$ disposed between the reset input line $VRD1_k$ and the output signal line $VSL1_k$, and a switch $S3_k$ disposed between the reset input line $VRD2_k$ and the output signal line $VSL2_k$. The switch $S1_k$ is turned on. The switch $S2_k$ is turned off, shorting the reset input line $VRD1_k$ and the output signal line $VSL1_k$. The switch $S3_k$ is turned off, shorting the reset input line $VRD2_k$ and the output signal line $VSL2_k$. Furthermore, the column readout circuit unit 3 includes a constant current source $L1_k$ connected to the current supply line $VCOM_k$. The constant current source $L1_k$ is an n-channel MOS transistor, for example. The constant current source $L1_k$ maintains a constant current 4I from the current supply line $VCOM_k$.

The current mirror circuit including the amplification transistors of the readout pixels $X_{i+1,k}$ and $X_{i+2,k}$, the amplification transistors of the reference pixels $X_{i,k}$ and $X_{i+3,k}$, and the transistors $T1_k$, $T2_k$, $T3_k$, and $T4_k$ form with the constant current source $L1_k$ a differential amplifier that amplifies a pair of differential input voltages. One of the pair of differential input voltages is input into the amplification transistors of the readout pixels $X_{i+1,k}$ and $X_{i+2,k}$, while the other of the pair of differential input voltages is input into the amplification transistors of the reference pixels $X_{i,k}$ and $X_{i+3,k}$. Additionally, the output voltages amplifying the differential input voltages are output to the column readout circuit unit 3 through the output signal lines $VSL1_k$ and $VSL2_k$ connected to the drain of the amplification transistors of the readout pixels $X_{i+1,k}$ and $X_{i+2,k}$.

As the configuration corresponding to the (k+1)th column, the column readout circuit unit 3 includes a switch $M0_{k+1}$ disposed between the reset voltage $V_{rst}$ and the reset input lines $VRD0_{k+1}$, $VRD1_{k+1}$, and $VRD2_{k+1}$. The switch $M0_{k+1}$ is capable of switching the connection destination of the reset voltage $V_{rst}$ to one of the reset input lines $VRD0_{k+1}$, $VRD1_{k+1}$, and $VRD2_{k+1}$, and is connected to the reset input line $VRD0_{k+1}$.

Additionally, the column readout circuit unit 3 includes transistors $T1_{k+1}$, $T2_{k+1}$, $T3_{k+1}$, and $T4_{k+1}$ that form a current mirror circuit. The transistors $T1_{k+1}$, $T2_{k+1}$, $T3_{k+1}$, and $T4_{k+1}$ are p-channel MOS transistors, for example. The drains of the transistors $T1_{k+1}$, $T2_{k+1}$, $T3_{k+1}$, and $T4_{k+1}$ are connected to a power supply voltage VDD. The gates of the transistors $T1_{k+1}$, $T2_{k+1}$, $T3_{k+1}$, and $T4_{k+1}$ are connected to each other and are also connected to the sources of the transistors $T1_{k+1}$ and $T2_{k+1}$. The transistors $T1_{k+1}$ and $T2_{k+1}$ output a signal current 2I from the source. The transistors $T3_{k+1}$ and $T4_{k+1}$ respectively output a reference current I from the source.

Furthermore, the column readout circuit unit 3 includes a switch $M1_{k+1}$ disposed between the sources of the transistors $T1_{k+1}$ and $T2_{k+1}$ and the output signal lines $VSL0_{k+1}$, $VSL1_{k+1}$, and $VSL2_{k+1}$, a switch $M2_{k+1}$ disposed between the source of the transistor $T3_{k+1}$ and the output signal lines $VSL0_{k+1}$, $VSL1_{k+1}$, and $VSL2_{k+1}$, and a switch $M3_{k+1}$ disposed between the source of the transistor $T4_k$ and the output signal lines $VSL0_k$, $VSL1_k$, and $VSL2_k$. The switch $M1_{k+1}$ switches the connection destination of the transistors $T1_{k+1}$ and $T2_{k+1}$ to one of the output signal lines $VSL0_{k+1}$, $VSL1_{k+1}$, and $VSL2_{k+1}$. The switch $M2_{k+1}$ switches the connection destination of the transistor $T3_{k+1}$ to one of the output signal lines $VSL0_{k+1}$, $VSL1_{k+1}$, and $VSL2_{k+1}$. The switch M3k switches the connection destination of the transistor T4 to one of the output signal lines $VSL0_{k+1}$, $VSL1_{k+1}$, and $VSL2_{k+1}$.

Furthermore, the column readout circuit unit 3 includes a switch $S1_{k+1}$ disposed between the reset input line $VRD0_{k+1}$ and the output signal line $VSL0_{k+1}$, a switch $S2_{k+1}$ disposed between the reset input line $VRD1_{k+1}$ and the output signal line $VSL1_{k+1}$, and a switch $S3_{k+1}$ disposed between the reset input line $VRD2_{k+1}$ and the output signal line $VSL2_{k+1}$. Furthermore, the column readout circuit unit 3 includes a constant current source $L1_{k+1}$ connected to the current supply line $VCOM_{k+1}$. The constant current source $L1_{k+1}$ is an n-channel MOS transistor, for example. The constant current source $L1_{k+1}$ maintains a constant current 4I from the current supply line $VCOM_{k+1}$.

<Differential Amplification Readout Operation>

Figure 4:
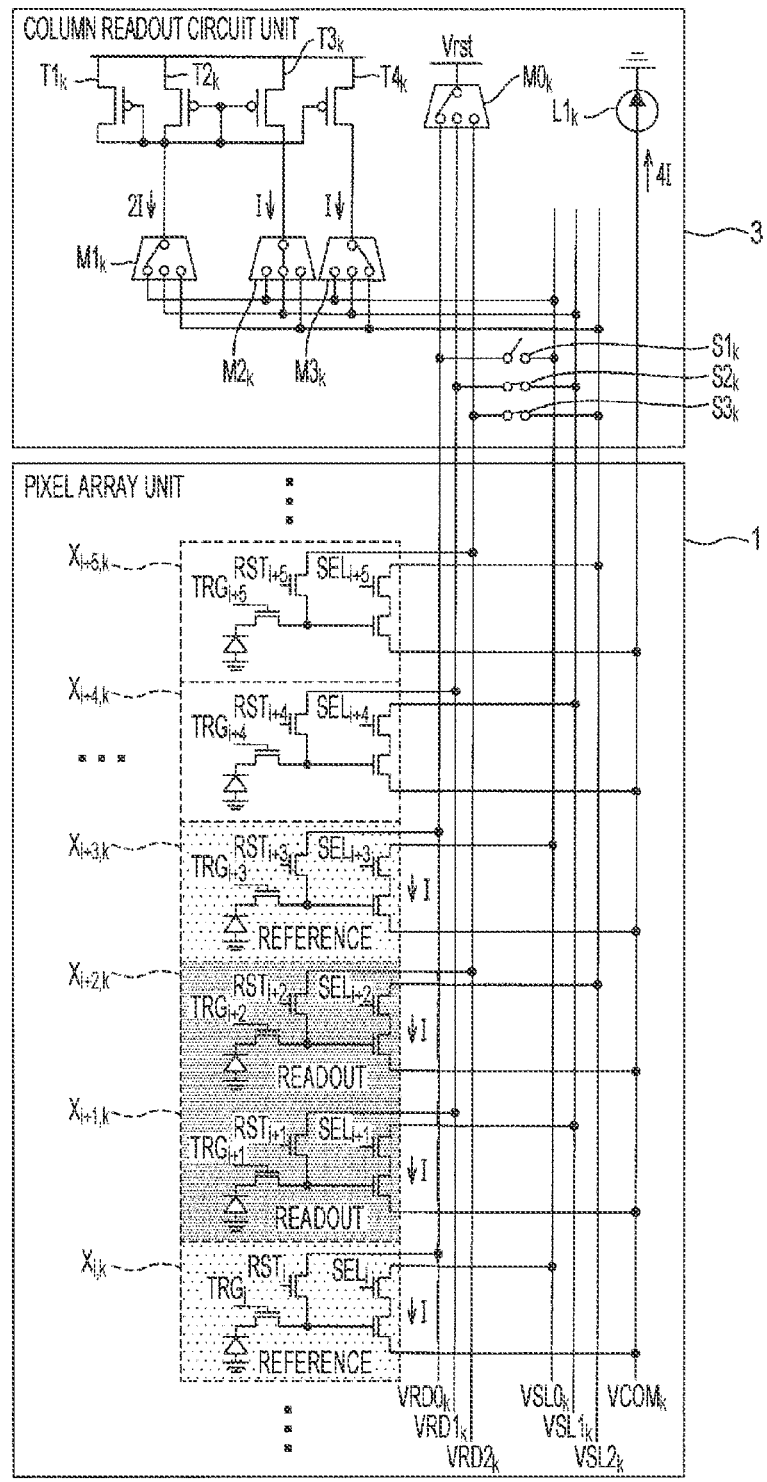
FIG. 4 is a circuit diagram of a part of the solid-state imaging apparatus according to the first embodiment.
Figure 5:
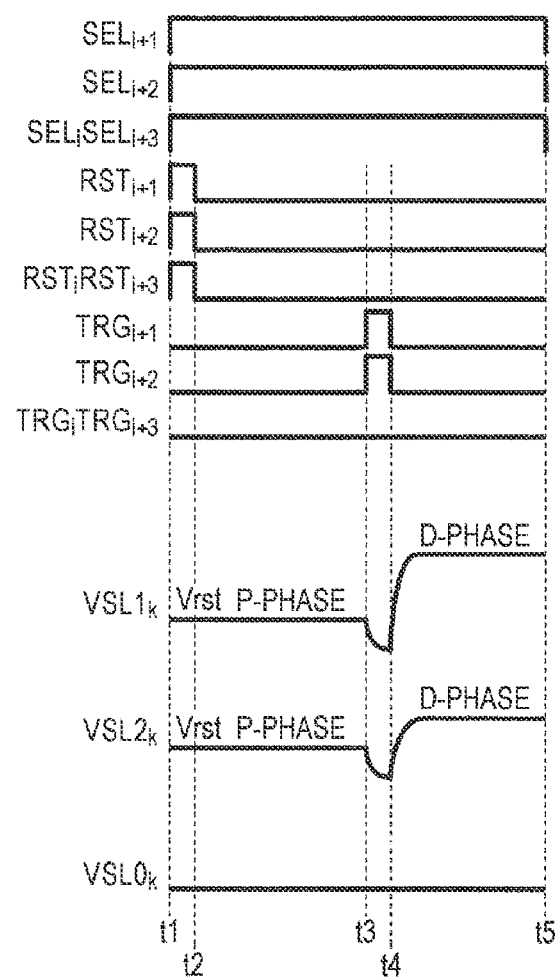
FIG. 5 is a timing chart for explaining a readout operation by the solid-state imaging apparatus according to the first embodiment.

Next, the timing chart in FIG. 5 will be referenced to describe a differential amplification readout operation in the case where the pixels $X_{i,k}$ and $X_{i+3,k}$ in the ith and (i+3)th rows of the kth column are selected as reference pixels while the pixels $X_{i+1,k}$ and $X_{i+2,k}$ in the (i+1)th and (i+2)th rows of the kth column are selected as readout pixels, as illustrated in FIG. 4.

From a time t1 to a time t5, a high (H) level is applied as the select signals $SEL_i$ and $SEL_{i+3}$ of the reference pixels $X_{i,k}$ and $X_{i+3,k}$, and while in addition, the select signals $SEL_{i+1}$ and $SEL_{i+2}$ of the readout pixels $X_{i+1,k}$ and $X_{i+2,k}$ are set to the H level.

From the time t1 to t2, the reset signals $RST_{i+1}$ and $RST_{i+2}$ of the readout pixels $X_{i+1,k}$ and $X_{i+2,k}$ are set to the H level, resetting the readout pixels $X_{i+1,k}$ and $X_{i+2,k}$. At the same time, the reset signals $RST_i$ and $RST_{i+3}$ of the reference pixels $X_{i,k}$ and $X_{i+3,k}$ are set to the H level, resetting the reference pixels $X_{i,k}$ and $X_{i+3,k}$. During the reset, the voltage follower function of the differential amplifier causes the output voltages of the output signal lines $VSL1_k$ and $VSL2_k$ to go to the reset level $V_{rst}$. From the time t2 to t3, the reset level $V_{rst}$ is read out from the output signal lines $VSL1_k$ and $VSL2_k$ as the P-phase level.

From the time t3 to t4, the transfer signals $TRG_{i+1}$ and $TRG_{i+2}$ of the readout pixels $X_{i+1,k}$ and $X_{i+2,k}$ are set to the H level, the reset level $V_{rst}$ of the output signal lines $VSL1_k$ and $VSL2_k$ is inverted and amplified, and the D-phase level is read out. The column signal processing unit 4 outputs the difference between the P-phase level and the D-phase level as image data.

According to the solid-state imaging apparatus according to the first embodiment, by having the reference pixels $X_{i,k}$ and $X_{i+3,k}$ respectively share the reset input line $VRD0_k$ connected to the drain of the reset transistor, the output signal line $VSL0_k$ connected to the drain of the select transistor, and the current supply line $VCOM_k$ connected to the source of the amplification transistor, the number of vertical signal lines can be reduced compared to a non-shared configuration. For this reason, the pixels can he miniaturized, and it is also possible to reduce the line area when performing multi-row readout.

Note that the reference pixels $X_{i,k}$ and $X_{i+3,k}$ do not necessarily have to share all of the reset input line $VRD0_k$, the output signal line $VSL0_k$, and the current supply line $VCOM_k$. The number of vertical signal lines can be reduced if the reference pixels $X_{i,k}$ and $X_{i+3,k}$ share at least one of the reset input line $VRD0_k$, the output signal line $VSL0_k$, and the current supply line $VCOM_k$.

<First Modification of First Embodiment>

Figure 6:
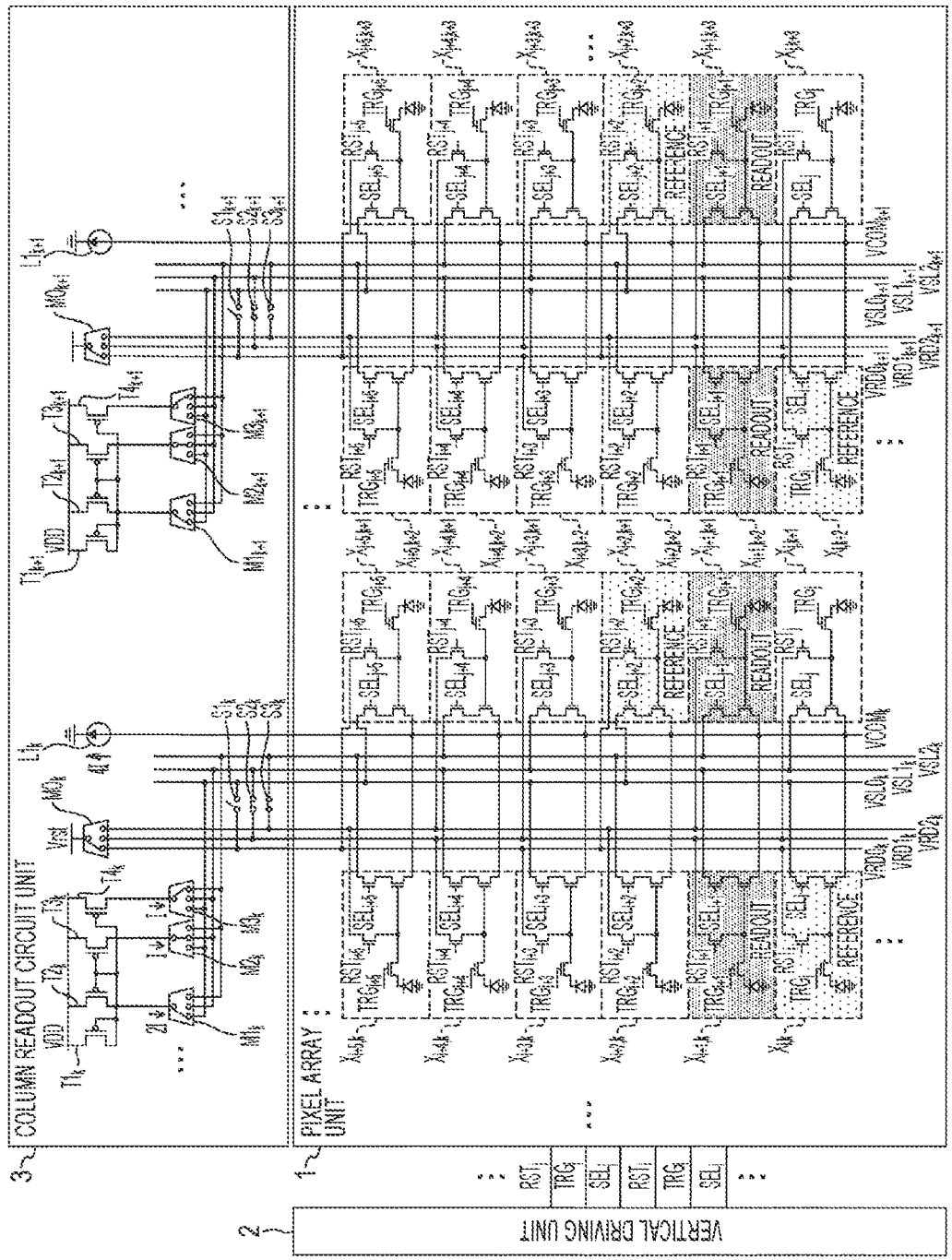
FIG. 6 is a circuit diagram of a part of a solid-state imaging apparatus according to a first modification of the first embodiment.

As illustrated in FIG. 6, in a solid-state imaging apparatus according to a first modification of the first embodiment, the configuration of the pixel array unit 1 is different from the solid-state imaging apparatus according to the first embodiment illustrated in FIG. 2.

The pixel array unit 1 includes pixels $X_{i,k}$, $X_{i+1,k}$, $X_{i+2,k}$, $X_{i+3,k}$, $X_{i+4,k}$, and $X_{i+5,k}$ in the ith to the (i+5)th rows of the kth column, pixels $X_{j,k+1}$, $X_{j+1,k+1}$, $X_{j+2,k+1}$, $X_{j+3,k+1}$, $X_{j+4,k+1}$, and $X_{j+5,k+1}$ in the jth to the (j+5)th rows (where j is an integer) of the (k+1)th column, pixels $X_{i,k+2}$, $X_{i+1,k+2}$, $X_{i+2,k+2}$, $X_{i+3,k+2}$, $X_{i+4,k+2}$, and $X_{i+5,k+2}$ in the ith to the (i+5)th rows of the (k+2)th column, and pixels $X_{j,k+3}$, $X_{j+1,k+3}$, $X_{j+2,k+3}$, $X_{j+3,k+3}$, $X_{j+4,k+3}$, and $X_{j+5,k+3}$ in the jth to the (j+5)th rows of the (k+3)th column.

In the kth column, the pixel $X_{i,k}$ in the ith row is selected as the reference pixel, while the pixel $X_{i+1,k+1}$ in the (i+1)th row is selected as the readout pixel. In the (k+1)th column, the pixel $X_{j+1,k+1}$ in the (j+1)th row is selected as the readout pixel, while the pixel $X_{j+2,k+1}$ in the (j+2)th row is selected as the reference pixel, The readout pixels $X_{i+1,k}$ and $X_{j+1,k+1}$ are adjacent to each other in the same row.

The drains of the respective reset transistors of the readout pixels $X_{i+1,k}$ and $X_{j+1,k+1}$ in the kth and (k+1)th columns are connected to the reset input lines $VRD1_k$ and $VRD2_k$, respectively. The sources of the respective amplification transistors of the readout pixels $X_{i+1,k}$ and $X_{j+1,k+1}$ are connected to a common current supply line $VCOM_k$. The drains of the respective select transistors of the readout pixels $X_{i+1,k}$ and $X_{j+1,k+1}$ are connected to the output signal lines $VSL1_k$ and $VSL2_k$, respectively.

The drains of the respective reset transistors of the reference pixels $X_{i,k}$ and $X_{j+2,k+1}$ in the kth and (k+1)th columns are connected to a common reset input line $VRD0_k$. The sources of the respective amplification transistors of the reference pixels $X_{i,k}$ and $X_{j+2,k+1}$ are connected to a common current supply line $VCOM_k$. The drains of the respective select transistors of the reference pixels $X_{i,k}$ and $X_{j+2,k+1}$ are connected to a common output signal line $VSL0_k$.

Further, in the (k+2)th column, the pixel $X_{i,k+2}$ in the ith row is selected as the reference pixel, while the pixel $X_{i+1,k+2}$ in the (i+1)th row is selected as the readout pixel. In the (k+3)th column, the pixel $X_{j+1,k+1}$ in the (j+1)th row is selected as the readout pixel, while the pixel $X_{j+2,k+3}$ in the (j+2)th row is selected as the reference pixel. The readout pixels $X_{i+1,k+2}$ and $X_{j+1,k+3}$ are adjacent to each other in the same row.

The drains of the respective reset transistors of the readout pixels $X_{i+1,k+2}$ and $X_{j+1,k+3}$ in the (k+2)th and (k+3)th columns are connected to the reset input lines $VRD1_{k+1}$ and $VRD2_{k+1}$, respectively. The sources of the respective amplification transistors of the readout pixels $X_{i+1,k+2}$ and $X_{j+1,k+3}$ are connected to a common current supply line $VCOM_{k+1}$. The drains of the respective select transistors of the readout pixels $X_{i+1,k+2}$ and $X_{j+1,k+3}$ are connected to the output signal lines $VSL1_{k+1}$ and $VSL2_{k+1}$, respectively.

The drains of the respective reset transistors of the reference pixels $X_{i,k+2}$ and $X_{j+2,k+3}$ in the (k+2)th and (k+3)th columns are connected to a common reset input line $VRD0_{k+1}$. The sources of the respective amplification transistors of the reference pixels $X_{i,k+2}$ and $X_{j+2,k+3}$ are connected to a common current supply line $VCOM_{k+1}$. The drains of the respective select transistors of the reference pixels $X_{i,k+2}$ and $X_{j+2,k+3}$ are connected to a common output signal line $VSL0_{k+1}$.

The rest of the configuration of the solid-state imaging apparatus according to the first modification of the first embodiment is similar to the solid-state imaging apparatus according to the first embodiment illustrated in FIG. 2, and therefore a duplicate description will be omitted.

According to the solid-state imaging apparatus according to the first modification of the first embodiment, by having the reference pixels $X_{i,k}$ and $X_{j+2,k+1}$ as well as the reference pixels $X_{i,k+2}$ and $X_{j+2,k+3}$ in adjacent columns respectively share the reset input lines $VRD0_k$ and $VRD0_{k+1}$ connected to the drain of the reset transistor, the output signal lines $VSL0_k$ and $VSL0_{k+1}$ connected to the drain of the select transistor, and the current supply lines $VCOM_k$, $VCOM_{k+1}$ connected to the source of the amplification transistor, the number of vertical signal lines can be reduced.

<Second Modification of First Embodiment>

Figure 7:
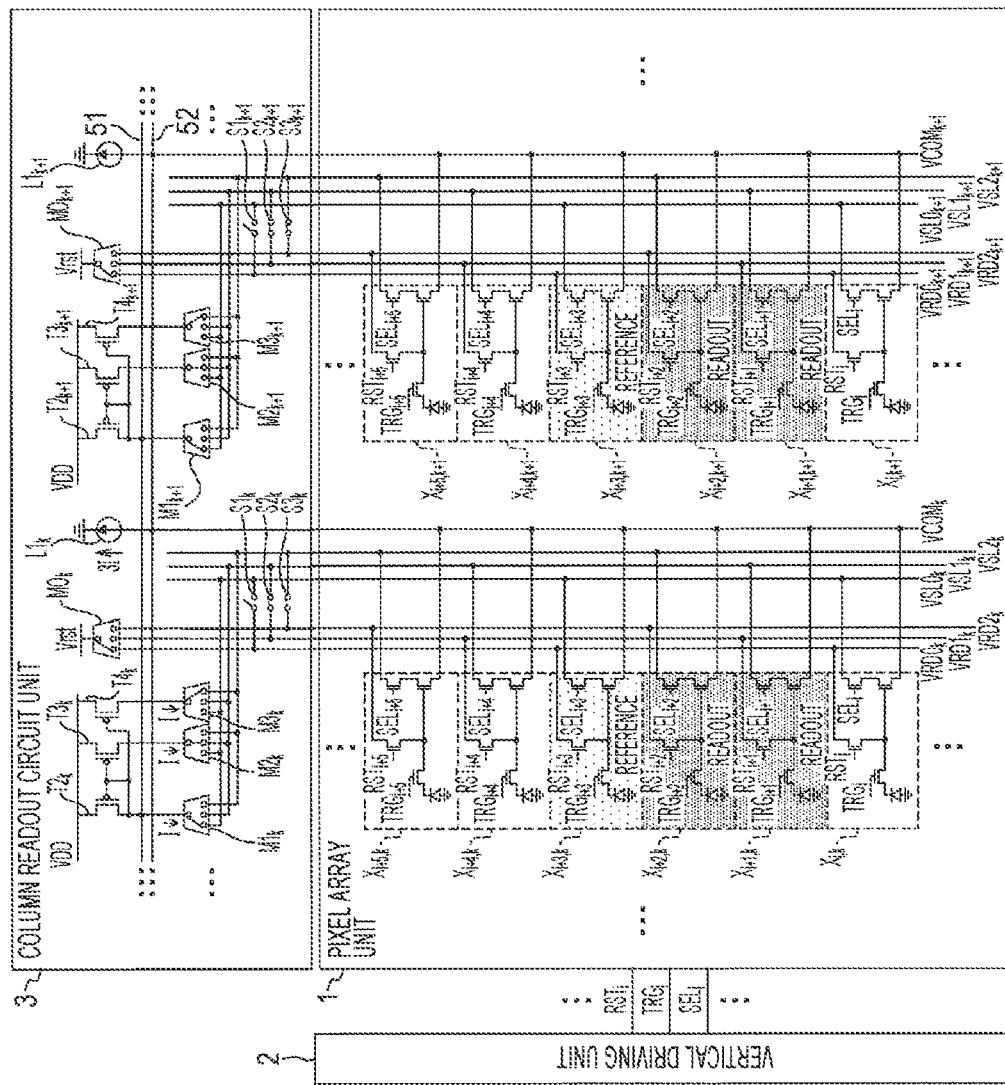
FIG. 7 is a circuit diagram of a part of a solid-state imaging apparatus according to a second modification of the first embodiment.

As illustrated in FIG. 7, a solid-state imaging apparatus according to a second modification of the first embodiment shares a point in common with the solid-state imaging apparatus according to the first embodiment illustrated in FIG. 2, namely that in the pixel array unit 1, the readout pixels $X_{i+1,k}$, $X_{i+2,k}$, $X_{i+1,k+1}$, and $X_{i+2,k+1}$ are disposed two at a time in each of the kth and (k+1)th columns. However, the solid-state imaging apparatus according to the second modification of the first embodiment differs from the solid-state imaging apparatus according to the first embodiment illustrated in FIG. 2 in that the reference pixels $X_{i+3,k}$ and $X_{i+3,k+1}$ are disposed one at a time in each of the kth and (k+1)th columns.

The reference pixels $X_{i+3,k}$ and $X_{i+3,k+1}$ are disposed in the same (i+3)th row. The output signal line $VSL0_k$ connected to the drain of the select transistor of the reference pixel $X_{i+3,k}$ and the output signal line $VSL0_{k+1}$ connected to the drain of the select transistor of the reference pixel $X_{i+3,k+1}$ are shorted by a short line 51 through the switches $M1_k$ and $M1_{k+1}$ in the column readout circuit unit 3.

The current supply line $VCOM_k$ connected to the source of the amplification transistor of the reference pixel $X_{i+3,k}$ and the current supply line $VCOM_{k+1}$ connected to the source of the amplification transistor of the reference pixel $X_{i+3,k+1}$ are shorted by a short line 52 in the column readout circuit unit 3. The rest of the configuration of the solid-state imaging apparatus according to the second modification of the first embodiment is similar to the solid-state imaging apparatus according to the first embodiment illustrated in FIG. 2, and therefore a duplicate description will be omitted.

According to the solid-state imaging apparatus according to the second modification of the first embodiment, as illustrated in FIG. 7, by disposing the reference pixels $X_{i+3,k}$ and $X_{i+3,k+1}$ one at a time in each of the kth and (k+1)th columns and using the short line 51 to short the output signal lines $VSL0_k$ and $VSL0_{k+1}$ connected to the drain of the select transistor of each of the reference pixels $X_{i+3,k}$ and $X_{i+3,k+1}$ in the same row while also using the short line 52 to short the current supply lines $VCOM_k$ and $VCOM_{k+1}$ connected to the source of the amplification transistor of each of the reference pixels $X_{i+3,k}$ and $X_{i+3,k+1}$ in the same row, noise can be reduced. Furthermore, the number of readouts of the reference pixels $X_{i+3,k}$ and $X_{i+3,k+1}$ per column can be reduced, and power consumption can be reduced.

<Third Modification of First Embodiment>

Figure 8:
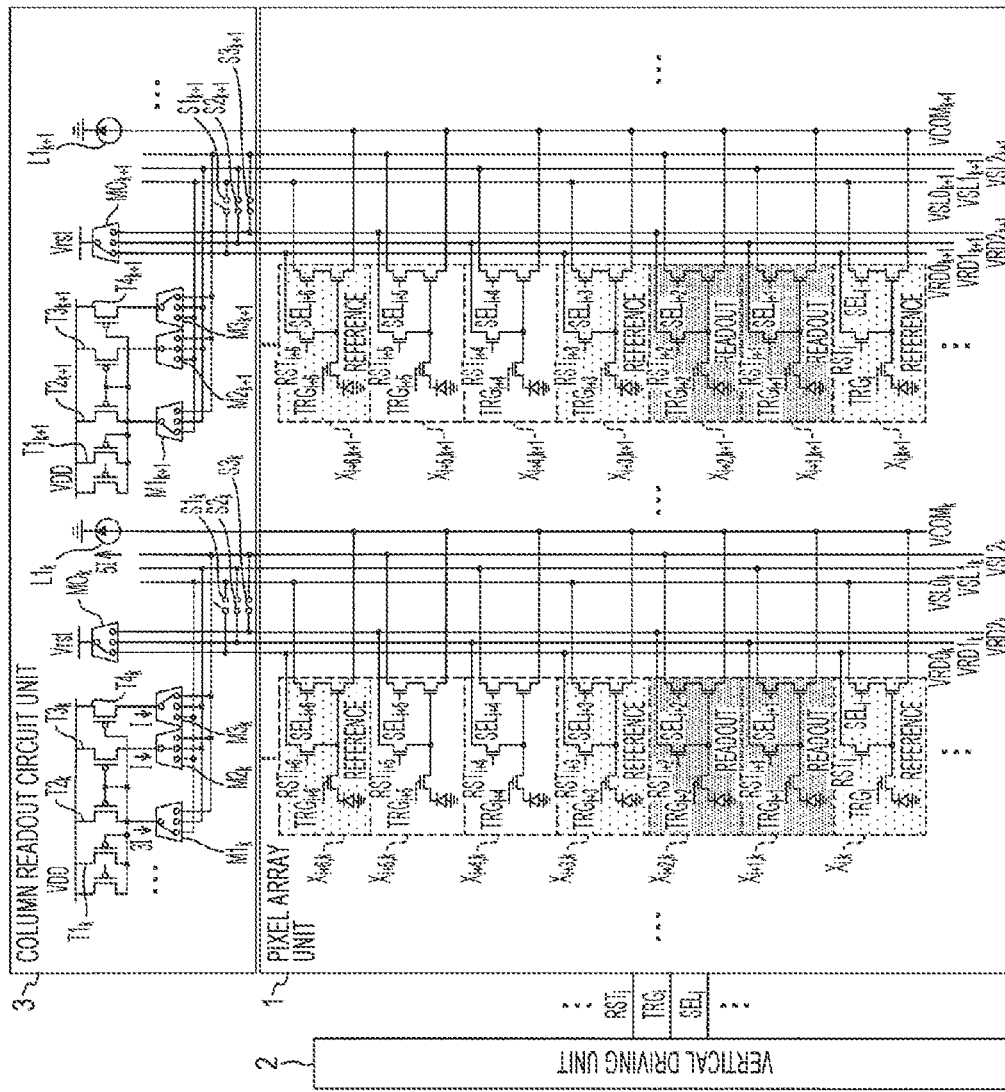
FIG. 8 is a circuit diagram of a part of a solid-state imaging apparatus according to a third modification of the first embodiment.

As illustrated in FIG. 8, a solid-state imaging apparatus according to a third modification of the first embodiment differs from the solid-state imaging apparatus according to the first embodiment illustrated in FIG. 2 in that in the pixel array unit 1, the reference pixels $X_{i,k}$, $X_{i+3,k}$, $X_{i+6,k}$, $X_{i,k+1}$, $X_{i+3,k+1}$, and $X_{i+6,k+1}$ are selected more than the readout pixels $X_{i+1,k}$, $X_{i+2,k}$, $X_{i+1,k+1}$, and $X_{i+2,k+1}$.

In FIG. 8, in the kth column, the three reference pixels $X_{i,k}$, $X_{i+3,k}$, and $X_{i+6,k}$ in the ith, (i+3)th, and (i+6)th rows are selected, while the two readout pixels $X_{i+1,k}$ and $X_{i+2,k}$ in the (i+1)th and (i+2)th rows are selected. In the (k+1)th column, the three reference pixels $X_{i,k+1}$, $X_{i+3,k+1}$, and $X_{i+6,k+1}$ in the ith, (i+3)th, and (i+6)th rows are selected, while the two readout pixels $X_{i+1,k+1}$ and $X_{i+2,k+1}$ in the (i+1)th and (i+2)th rows are selected.

Note that four or more reference pixels may be selected in each column, and three or more readout pixels may be selected in each column. The rest of the configuration of the solid-state imaging apparatus according to the third modification of the first embodiment is similar to the solid-state imaging apparatus according to the first embodiment illustrated in FIG. 2, and therefore a duplicate description will be omitted.

According to the solid-state imaging apparatus according to the third modification of the first embodiment, by selecting more of the reference pixels $X_{i,k}$, $X_{i+3,k}$, $X_{i+6,k}$, $X_{i,k+1}$, $X_{i+3,k+1}$, and $X_{i+6,k+1}$ than the readout pixels $X_{i+1,k}$, $X_{i+2,k}$, $X_{i+1,k+1}$, and $X_{i+2,k+1}$, noise can be reduced further.

<Fourth Modification of First Embodiment>

Figure 9:
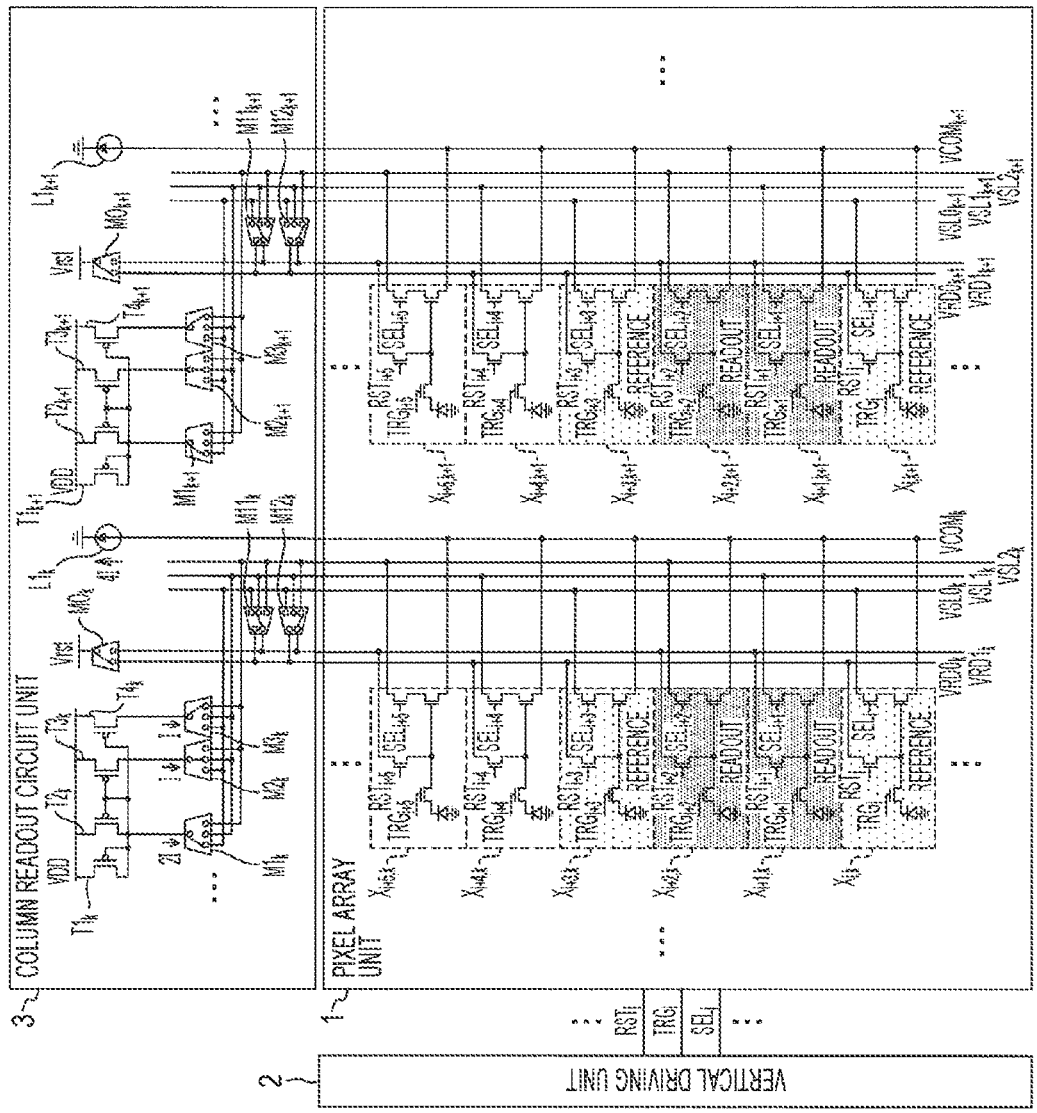
FIG. 9 is a circuit diagram of a part of a solid-state imaging apparatus according to a fourth modification of the first embodiment.

As illustrated in FIG. 9, a solid-state imaging apparatus according to a fourth modification of the first embodiment shares a point in common with the solid-state imaging apparatus according to the first embodiment illustrated in FIG. 2, namely that the reference pixels $X_{i,k}$ and $X_{i+3,k}$ in the same kth column share the output signal line $VSL0_k$, the reset input line $VRD0_k$, and the current supply line $VCOM_k$, and in addition, the reference pixels $X_{i,k+1}$ and $X_{i+3,k+1}$ in the same (k+1)th column share the output signal line $VSL0_{k+1}$, the reset input line $VRD0_{k+1}$, and the current supply line $VCOM_{k+1}$.

However, the solid-state imaging apparatus according to the fourth modification of the first embodiment differs from the solid-state imaging apparatus according to the first embodiment illustrated in FIG. 2 in that the readout pixels $X_{i+1,k}$ and $X_{i+2,k}$ in the kth column share the reset input line $VRD1_k$ connected to the drain of the reset transistor, and additionally, the readout pixels $X_{i+1,k+1}$ and $X_{i+2,k+1}$ in the (k+1)th column share the reset input line $VRD1_{k+1}$ connected to the drain of the reset transistor.

As the configuration corresponding to the kth column, the column readout circuit unit 3 includes switches $M11_k$ and $M12_k$ disposed between the reset input lines $VRD0_k$ and $VRD1_k$ and the output signal lines $VSL0_k$, $VSL1_k$, and $VSL2_k$. The switches $M11_k$ and $M12_k$ switch the connection of one of the reset input lines $VRD0_k$ and $VRD1_k$ and to one of the output signal lines $VSL0_k$, $VSL1_k$, and $VSL2_k$. For example, during a readout operation, the switch $M11_k$ connects the reset input line $VRD1_k$ and the output signal line $VSL1_k$. During a readout operation, the switch $M12_k$ connects the reset input line $VRD1_k$ and the output signal line $VSL2_k$.

Like the configuration corresponding to the kth column, as the configuration corresponding to the (k+1)th column, the column readout circuit unit 3 includes switches $M11_{k+1}$ and $M12_{k+1}$ disposed between the reset input lines $VRD0_{k+1}$ and $VRD1_{k+1}$ and the output signal lines $VSL0_{k+1}$, $VSL1_{k+1}$, and $VSL2_{k+1}$. The rest of the configuration of the solid-state imaging apparatus according to the third modification of the first embodiment is similar to the solid-state imaging apparatus according to the first embodiment illustrated in FIG. 2, and therefore a duplicate description will be omitted.

Figure 10:
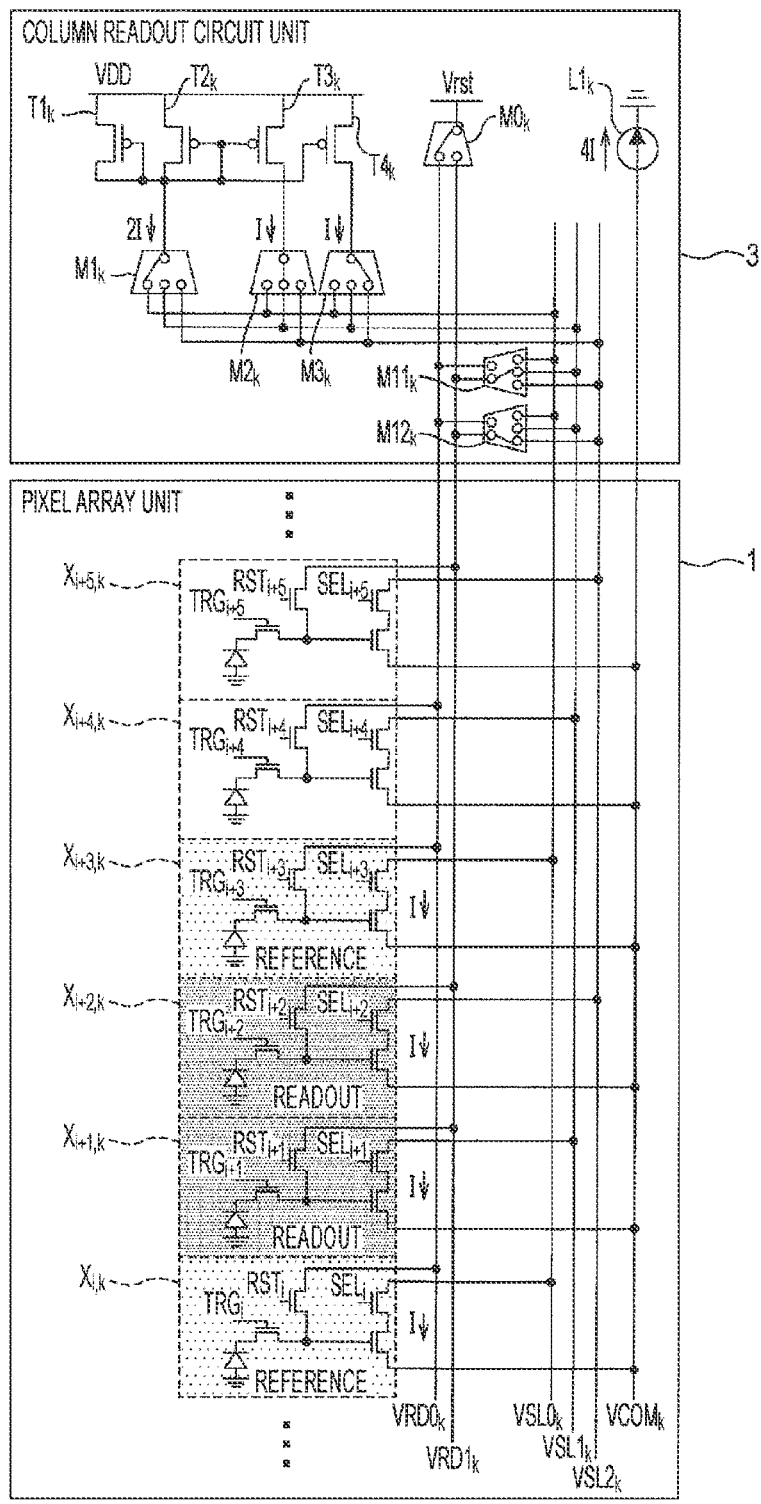
FIG. 10 is a circuit diagram of a part of the solid-state imaging apparatus according to the fourth modification of the first embodiment.
Figure 11:
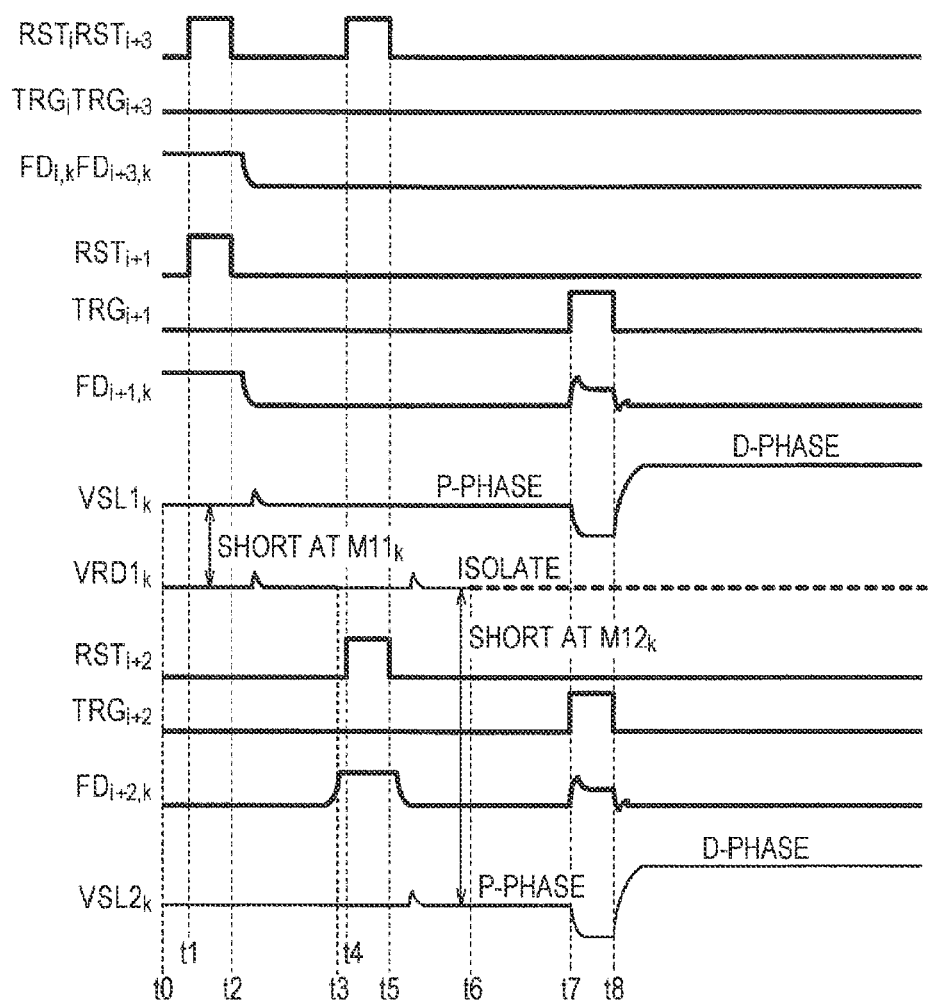
FIG. 11 is a timing chart for explaining a readout operation by the solid-state imaging apparatus according to the fourth modification of the first embodiment.

Next, the timing chart in FIG. 11 will be referenced to describe a differential amplification readout operation in the case where the pixels $X_{i+1,k}$ and $X_{i+2,k}$ in the (i+1)th and (i+2)th rows of the kth column are selected as readout pixels while the pixels $X_{i,k}$ and $X_{i+3,k}$ in the ith and (i+3)th rows are selected as reference pixels, as illustrated in FIG. 10.

From a time t0 to a time t3, the switch $M11_k$ illustrated in FIG. 10 is put in the closed state, shorting the output signal line $VSL1_k$ and the reset input line $VRD1_k$. From the time t1 to t2, the reset signal $RST_{i+1}$ of one readout pixel $X_{i+1,k}$ is set to the H level, resetting the readout pixel $X_{i+1,k}$. At the same time, the reset signals $RST_i$ and $RST_{i+3}$ of the reference pixels $X_{i,k}$ and $X_{i+3,k}$ are set to the H level, resetting the reference pixels $X_{i,k}$ and $X_{i+3,k}$. Because the output signal line $VSL1_k$ and the reset input line $VRD1_k$ are shorted, the output signal line $VSL1_k$ goes to the reset level and is read out as the P-phase level.

At the time t3, the switch $M11_k$ is put in the open state, electrically isolating the output signal line $VSL1_k$ and the reset input line $VRD1_k$. From the time t3 to t6, the switch $M12_k$ is put in the closed state, shorting the reset input line $VRD1_k$ and the output signal line $VSL2_k$.

From the time t4 to t5, the reset signal $RST_{i+2}$ of the other readout pixel $X_{i+2,k}$ is set to the H level, resetting the readout pixel $X_{i+2,k}$. At the same time, the reset signals $RST_i$ and $RST_{i+3}$ of the reference pixels $X_{i,k}$ and $X_{i+3,k}$ are set to the H level, resetting the reference pixels $X_{i,k}$ and $X_{i+3,k}$. Because the reset input line $VRD1_k$ and the output signal line $VSL2_k$ are shorted, the output signal line $VSL2_k$ goes to the reset level and is read out as the P-phase level. At the time t6, the switch $M12_k$ is put in the open state, electrically isolating the reset input line $VRD1_k$ and the output signal line $VSL2_k$.

From the time t7 to t8, the transfer signals $TRG_{i+1}$ and $TRG_{i+2}$ of the readout pixels $X_{i+1,k}$ and $X_{i+2,k}$ are set to the H level, and the reset level of the output signal lines $VSL1_k$ and $VSL2_k$ is inverted and amplified. After that, the D-phase levels of the output signal lines $VSL1_k$ and $VSL2_k$ are read out at the same time.

According to the solid-state imaging apparatus according to the fourth modification of the first embodiment, by having the readout pixels $X_{i+1,k}$ and $X_{i+2,k}$ in the kth column share the reset input line $VRD1_k$ connected to the drain of the reset transistor and also having the readout pixels $X_{i+1,k+1}$ and $X_{i+2,k+1}$ in the (k+1)th column share the reset input line $VRD1_{k+1}$ connected to the drain of the reset transistor, the number of vertical signal lines can be reduced further.

<Fifth Modification of First Embodiment>

Figure 12:
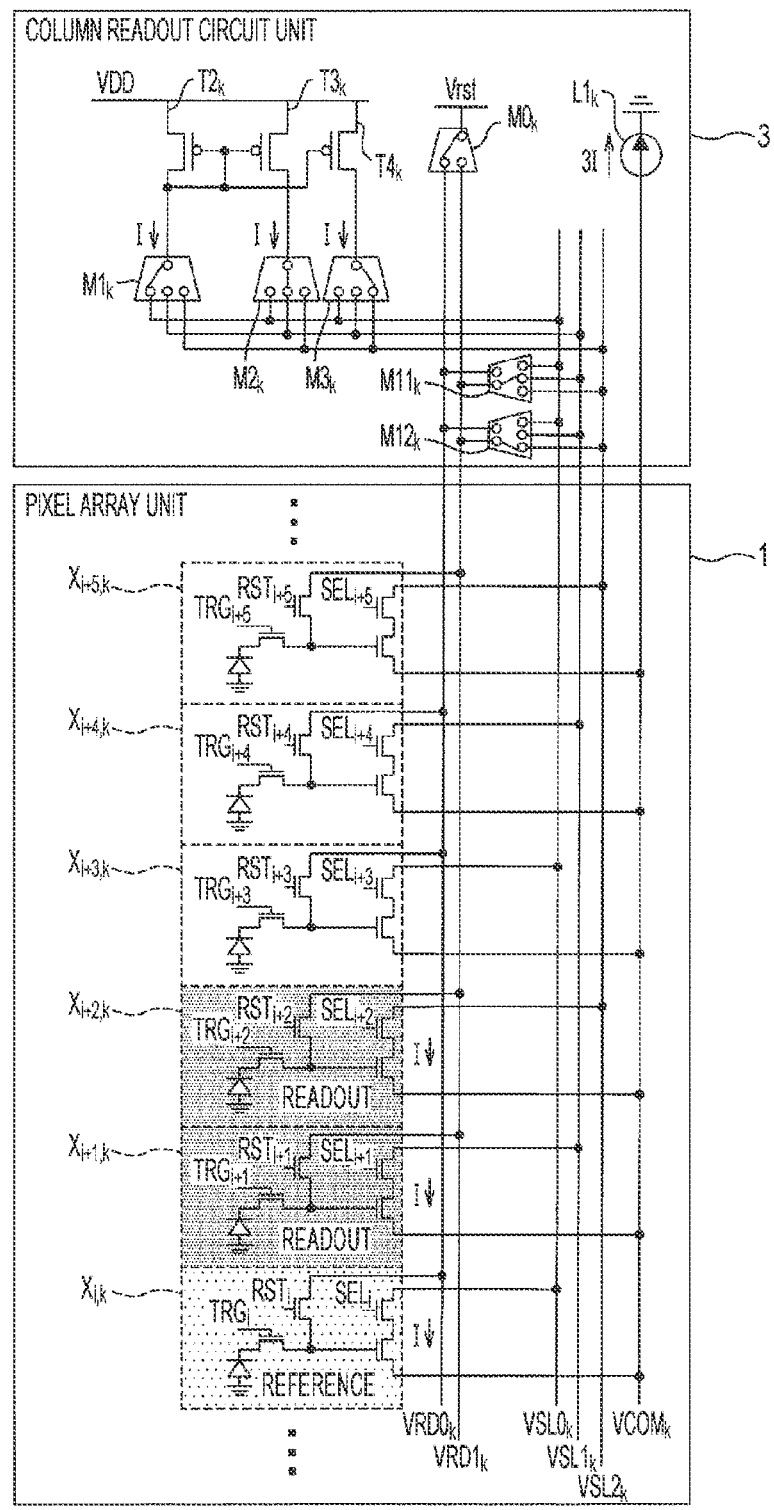
FIG. 12 is a circuit diagram of a part of a solid-state imaging apparatus according to a fifth modification of the first embodiment.
Figure 13:
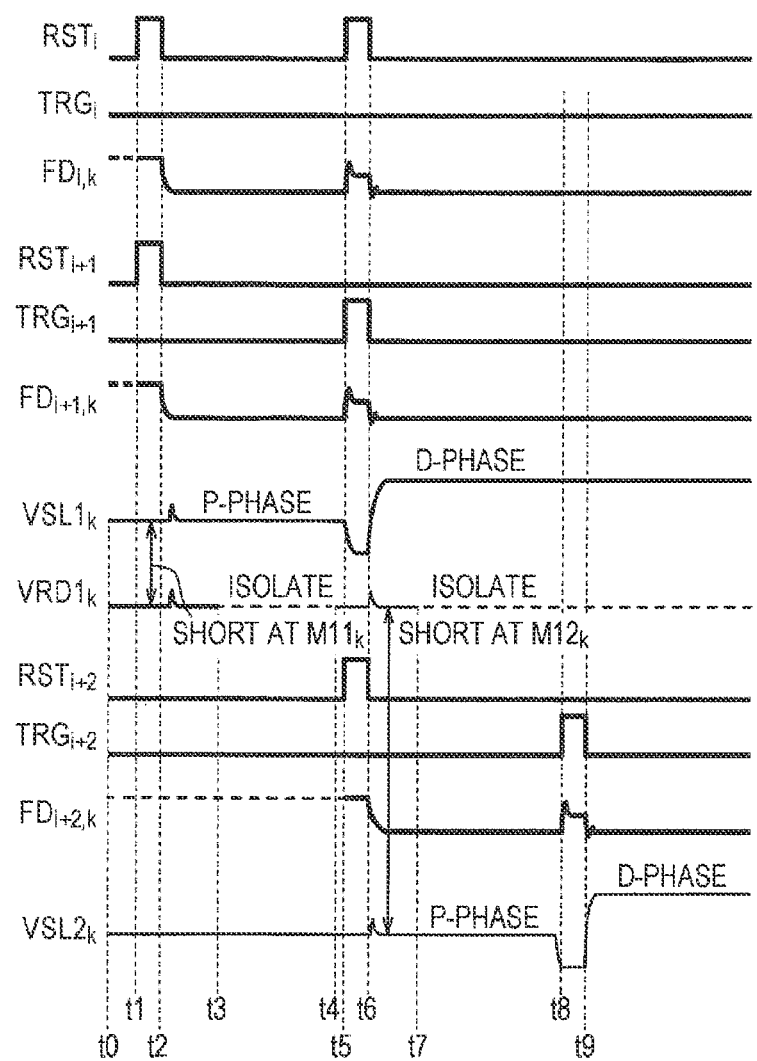
FIG. 13 is a timing chart for explaining a readout operation by the solid-state imaging apparatus according to the fifth modification of the first embodiment.

As illustrated in FIG. 12, a solid-state imaging apparatus according to the fifth modification of the first embodiment differs from the solid-state imaging apparatus according to the fourth modification of the first embodiment illustrated in FIG. 10 in that, in the pixel array unit 1, one reference pixel $X_{i,k}$ is selected in the kth column. The differential amplification readout operation in this case will be described with reference to the timing chart in FIG. 13.

From a time t0 to a time t3, the switch $M11_k$ illustrated in FIG. 10 is put in the closed state, shorting the output signal line $VSL1_k$ and the reset input line $VRD1_k$ connected to the readout pixel $X_{i+1,k}$ reset previously.

From the time t1 to t2, the reset signal $RST_i$ of the reference pixel $X_{i,k}$ is set to the H level, resetting the reference pixel $X_{i,k}$. At the same time, the reset signal $RST_{i+1}$ of one readout pixel $X_{i+1,k}$ is set to the H level, resetting the readout pixel $X_{i+1,k}$. Because the output signal line $VSL1_k$ and the reset input line $VRD1_k$ are shorted, the output signal line $VSL1_k$ goes to the reset level, and the P-phase level is read out. At the time t3, the switch $M11_k$ is put in the open state, electrically isolating the output signal line $VSL1_k$ and the reset input line $VRD1_k$.

From the time t4 to t7, the switch $M12_k$ is put in the closed state, shorting the reset input line $VRD1_k$ and the output signal line $VSL2_k$ connected to the readout pixel $X_{i+2,k}$ reset subsequently.

From the time t5 to t6, the reset signal $RST_i$ of the reference pixel $X_{i,k}$ is set to the H level, resetting the reference pixel $X_{i,k}$. At the same time, the reset signal $RST_{i+2}$ of the other readout pixel $X_{i+2,k}$ is set to the H level, resetting the readout pixel $X_{i+2,k}$. Because the reset input line $VRD1_k$ and the output signal line $VSL2_k$ are shorted, the output signal line $VSL2_k$ goes to the reset level, and the P-phase level is read out. From the time t5 to t6, the transfer signal $TRG_{i+1}$ of the readout pixel $X_{i+1,k}$ is set to the H level, the reset level of the output signal line $VSL1_k$ is inverted and amplified, and the D-phase level is read out.

At the time t7, the switch $M12_k$ is put in the open state, electrically isolating the reset input line $VRD1_k$ and the output signal line $VSL2_k$. From the time t8 to t9, the transfer signal $TRG_{i+2}$ of the readout pixel $X_{i+2,k}$ is set to the H level, the reset level of the output signal line $VSL2_k$ goes to the signal level, and the D-phase level is read out.

According to the solid-state imaging apparatus according to the fifth modification of the first embodiment, the readouts of the P-phase level and the D-phase level of the readout pixels $X_{i+1,k}$ and $X_{i+2,k}$ selected at the same time are performed with shifted a half-phase away from each other, making it possible to read out the signal level (D phase level) of one readout pixel $X_{i+1,k}$ while at the same time to read out the reset level (P-phase level) of the other readout pixel $X_{i+2,k}$. Consequently, readout can be sped up and the readout time can be shortened.

Second Embodiment

As described above, there has been proposed a differential amplification CIS capable of increased gain and significantly higher conversion efficiency compared to a source follower CIS of the related art. On the other hand, a differential amplification CIS has a narrow operating point and the dynamic range is difficult to expand. For this reason, a configuration that switches between a differential amplification readout and source follower readout with a switch has been investigated.

However, compared to a pixel that performs source follower readout only, a pixel that switches between source follower readout and differential amplification readout needs additional vertical lines inside the pixel. For example, in the case of a configuration in which one column ADC is disposed for every pixel column like in PTL 2, there are one or two vertical lines in a pixel that performs source follower readout of the related art only, whereas the number of vertical lines is increased to five lines in a pixel that switches between source follower readout and differential amplification readout. The addition of vertical lines inside a pixel leads to lowered sensitivity in a front-illuminated CIS, and even with a back-illuminated CIS, the freedom of line placement inside the pixel is lowered at fine pixel sizes, and furthermore the metal interconnect layers increase and become more costly. Accordingly, the second embodiment proposes a solid-state imaging apparatus capable of reducing vertical lines inside pixels in a solid-state imaging apparatus capable of switching between differential amplification readout and source follower readout.

<Configuration of Solid-State Imaging Apparatus>

Figure 14:
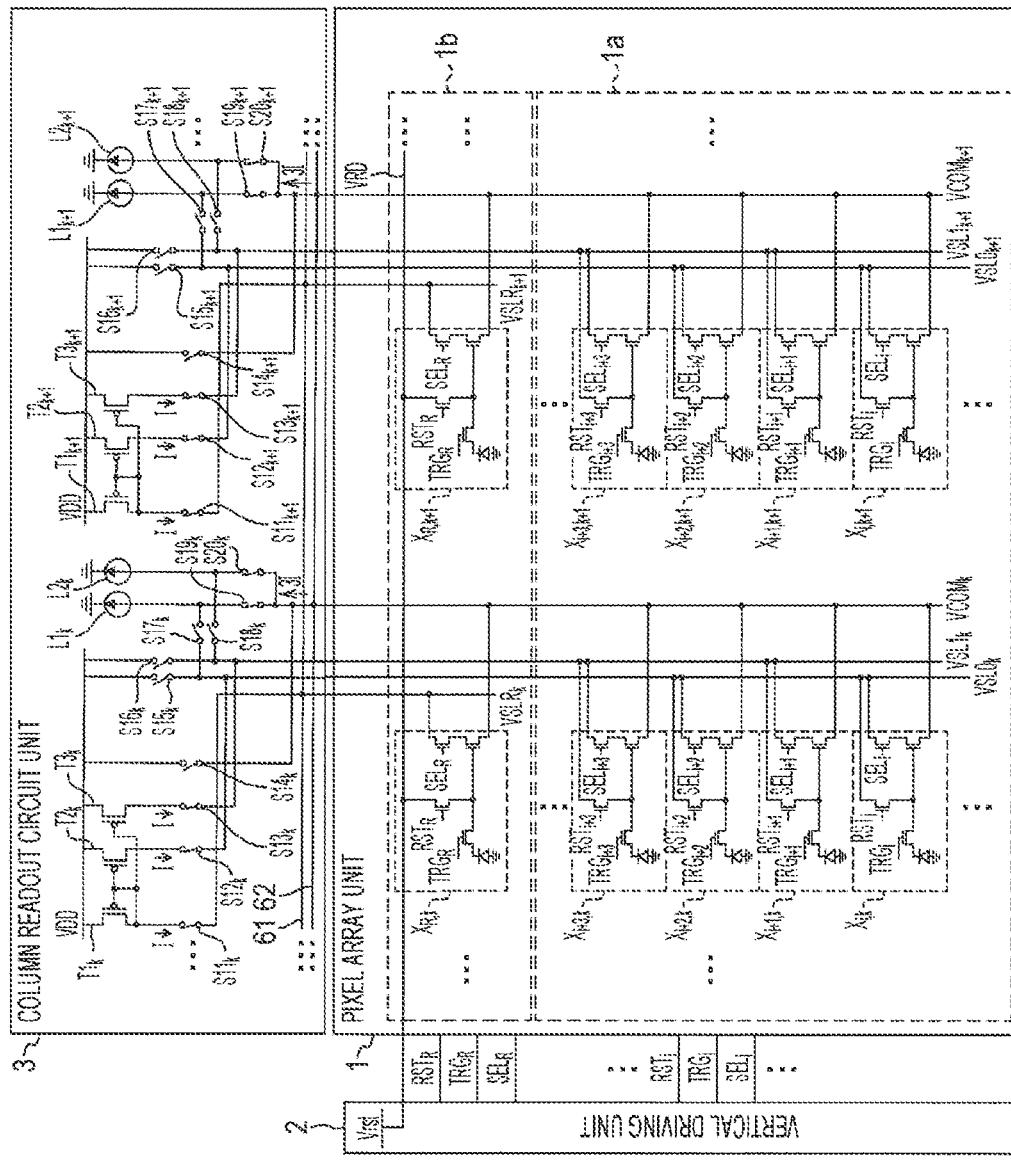
FIG. 14 is a circuit diagram in a differential amplification readout state of a part of a solid-state imaging apparatus according to a second embodiment.

The overall configuration of the solid-state imaging apparatus according to the second embodiment is shared in common with the solid-state imaging apparatus according to the first embodiment illustrated in FIG. 1. However, as illustrated in FIG. 14, the solid-state imaging apparatus according to the second embodiment differs from the solid-state imaging apparatus according to the first embodiment illustrated in FIG. 2 in that the pixel array unit 1 includes a readout pixel region 1a and a reference pixel region 1b.

The readout pixel region 1a includes pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ arranged in a two-dimensional matrix. The pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ included in the readout pixel region 1a are only selectable as readout pixels, and are not selected as reference pixels. The configuration of each of the readout pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ is similar to the configuration of the pixel $X_{i,k}$ illustrated in FIG. 3.

The sources of the respective amplification transistors of the readout pixels $X_{i,k}$ and $X_{i+2,k}$ in the ith and (i+2)th rows of the kth column are connected to a common current supply line $VCOM_k$. The drains of the respective select transistors of the readout pixels $X_{i,k}$ and $X_{i+2,k}$ are connected to a common output signal line $VSL0_k$. The sources of the respective reset transistors of the readout pixels $X_{i,k}$ and $X_{i+2,k}$ are connected to a floating diffusion, and the drains of the respective reset transistors are connected to a common output signal line $VSL0_k$. The readout pixels $X_{i,k}$ and $X_{i+2,k}$ form a negative feedback loop connecting the floating diffusion and the output signal line $VSL1_k$ through the reset transistor, and supply the reset voltage.

The sources of the respective amplification transistors of the readout pixels $X_{i+1,k}$ and $X_{i+3,k}$ in the (i+1)th and (i+3)th rows of the kth column are connected to a common current supply line $VCOM_k$. The drains of the respective select transistors of the readout pixels $X_{i+1,k}$ and $X_{i+3,k}$ are connected to a common output signal line $VSL1_k$. The sources of the respective reset transistors of the readout pixels $X_{i+1,k}$ and $X_{i+3,k}$ are connected to a floating diffusion, and the drains of the respective reset transistors are connected to a common output signal line $VSL1_k$. The readout pixels $X_{i+1,k}$ and $X_{i+3,k}$ form a negative feedback loop connecting the floating diffusion and the output signal $VSL1_k$ through the reset transistor, and supply the reset voltage.

The sources of the respective amplification transistors of the readout pixels $X_{i,k+1}$ and $X_{i+2,k+1}$ in the ith and (i+2)th rows of the (k+1)th column are connected to a common current supply line $VCOM_{k+1}$. The drains of the respective select transistors of the readout pixels $X_{i,k+1}$ and $X_{i+2,k+1}$ are connected to a common output signal line $VSL0_{k+1}$. The sources of the respective reset transistors of the readout pixels and $X_{i,k+1}$ and $X_{i+2,k+1}$ are connected to a floating diffusion, and the drains of the respective reset transistors are connected to a common output signal line $VSL0_{k+1}$. That is, the readout pixels $X_{i,k+1}$ and $X_{i+2,k+1}$ form a negative feedback loop connecting the floating diffusion and the output signal line $VSL1_{k+1}$ through the reset transistor, and supply the reset voltage.

The sources of the respective amplification transistors of the readout pixels $X_{i+1,k+1}$ and $X_{i+3,k+1}$ in the (i+1)th and (i+3)th rows of the (k+1)th column are connected to a common current supply line $VCOM_{k+1}$. The drains of the respective select transistors of the readout pixels $X_{i+1,k+1}$ and $X_{i+3,k+1}$ are connected to a common output signal line $VSL1_{k+1}$. The sources of the respective reset transistors of the readout pixels $X_{i+1,k+1}$ and $X_{i+3,k+1}$ are connected to a floating diffusion, and the drains of the respective reset transistors are connected to a common output signal line $VSL1_{k+1}$. The readout pixels $X_{i+1,k+1}$ and $X_{i+3,k+1}$ form a negative feedback loop connecting the floating diffusion and the output signal line $VSL1_{k+1}$ through the reset transistor, and supply the reset voltage.

On the other hand, the reference pixel region 1b includes a plurality of pixels $X_{R,k}$ and $X_{R,k+1}$ fixed to a specific row of the pixel array unit 1. Herein, an example of a case is illustrated in which the pixels $X_{R,k}$ and $X_{R,k+1}$ are arranged in the Rth row, which is the row positioned closest to the column readout circuit unit 3 among the rows of the pixel array unit 1. The pixels $X_{R,k}$ and $X_{R,k+1}$ are disposed in correspondence with the kth and (k+1)th columns of the readout pixel region 1a. The pixels $X_{R,k}$ and $X_{R,k+1}$ are fixed as reference pixels, and are not selected as readout pixels. The configuration of each of the reference pixels $X_{R,k}$ and $X_{R,k+1}$ is similar to the configuration of the pixel $X_{i,k}$ illustrated in FIG. 3.

The drains of the respective reset transistors of the reference pixels $X_{R,k}$ and $X_{R,k+1}$ in the kth and (k+1)th columns are connected to a common reset input line VRD. In other words, the reference pixels $X_{R,k}$ and $X_{R,k+1}$ share the reset input line VRD. The reset input line VRD is supplied with any reset voltage $V_{rst}$ from a reset voltage source.

The drains of the respective select transistors of the reference pixels $X_{R,k}$ and $X_{R,k+1}$ in the kth and (k+1)th columns are connected to output signal lines $VSLR_k$ and $VSLR_{k+1}$. The output signal lines $VSLR_k$ and $VSLR_{k+1}$ are shorted by a short line 61 in the column readout circuit unit 3.

The sources of the respective amplification transistors of the reference pixels $X_{R,k}$ and $X_{R,k+1}$ in the kth and (k+1)th columns are connected to current supply lines $VCOM_k$ and $VCOM_{k+1}$, respectively. The current supply lines $VCOM_k$ and $VCOM_{k+1}$ are shorted by a short line 62 in the column readout circuit unit 3.

The column readout circuit unit 3 has a corresponding configuration for each of the kth and (k+1)th columns. As the configuration corresponding to the kth column, the column readout circuit unit 3 includes constant current sources $L1_k$ and $L2_k$. The constant current sources $L1_k$ and $L2_k$ are n-channel MOS transistors or the like. The column readout circuit unit 3 includes transistors $T1_k$, $T2_k$, and $T3_k$ that form a current mirror circuit. A power supply voltage VDD are connected to the drains of the transistors $T1_k$, $T2_k$, and $T3_k$. The gates of the transistors $T1_k$, $T2_k$, and $T3_k$ are connected to each other and are also connected to the source of the transistor $T1_k$.

The column readout circuit unit 3 includes a plurality of switches (switching units) $S11_k$, $S12_k$, $S13_k$, $S14_k$, $S15_k$, $S16_k$, $S17_k$, $S18_k$, $S19_k$, and $S20_k$ that switch the operating point of the amplification transistors of the readout pixels $X_{i,k}$, $X_{i+1,k}$, $X_{i+2,k}$ and $X_{i+3,k}$ of the kth column between source follower readout and differential amplification readout.

The switch $S11_k$ is disposed between the source of the transistor $T1_k$ and the output signal line $VSLR_k$. The switch $S12_k$ is disposed between the source of the transistor $T2_k$ and the output signal line $VSL0_k$. The switch $S13_k$ is disposed between the source of the transistor $T3_k$ and the output signal line $VSL1_k$. The switch $S14_k$ is disposed between the power supply voltage VDD and the current supply line $VCOM_k$.

The switch $S15_k$ is disposed between the power supply voltage VDD and the output signal line $VSL0_k$. The switch $S16_k$ is disposed between the power supply voltage VDD and the output signal line $VSL1_k$. The switch $S17_k$ is disposed between the output signal line $VSL0_k$ and the constant current source $L1_k$. The switch $S18_k$ is disposed between the output signal line $VSL1_k$ and the constant current source $L2_k$. The switch $S19_k$ is disposed between the constant current source $L1_k$ and the current supply line $VCOM_k$. The switch $S20_k$ is disposed between the constant current source $L2_k$ and the current supply line $VCOM_k$.

As the configuration for the (k+1)th column, the column readout circuit unit 3 includes constant current sources $L1_{k+1}$ and $L2_{k+1}$, and transistors $T1_{k+1}$, $T2_{k+1}$, and $T3_{k+1}$. The configuration of each of the constant current sources $L1_{k+1}$ and $L2_{k+1}$ and the transistors $T1_{k+1}$, $T2_{k+1}$, and $T3_{k+1}$ is similar to the constant current sources $L1_k$ and $L2_k$ and the transistors $T1_k$, $T2_k$, and $T3_k$ in the configuration of the kth column.

The column readout circuit unit 3 includes a plurality of switches (switching units) $S11_{k+1}$, $S12_{k+1}$, $S13_{k+1}$, $S14_{k+1}$, $S15_{k+1}$, $S16_{k+1}$, $S17_{k+1}$, $S18_{k+1}$, $S19_{k+1}$, and $S20_{k+1}$ that switch the operating point of the amplification transistors of the readout pixels $X_{i,k+1}$, $X_{i+1,k+1}$, $X_{i+2,k+1}$ and $X_{i+3,k+1}$ of the (k+1)th column between source follower readout and differential amplification readout. The configuration of each of the plurality of switches $S11_{k+1}$, $S12_{k+1}$, $S13_{k+1}$, $S14_{k+1}$, $S15_{k+1}$, $S16_{k+1}$, $S17_{k+1}$, $S18_{k+1}$, $S19_{k+1}$, and $S20_{k+1}$ is similar to the plurality of switches $S11_k$, $S12_k$, $S13_k$, $S14_k$, $S15_k$, $S16_k$, $S17_k$, $S18_k$, $S19_k$, and $S20_k$ in the configuration of the kth column.

FIG. 14 illustrates the differential amplification readout state of the solid-state imaging apparatus according to the second embodiment. In the configuration of the kth column of the column readout circuit unit 3, the switches $S11_k$, $S12_k$, $S13_k$, $S19_k$, and $S20_k$ are in the closed state while the switches $S14_k$, $S15_k$, $S16_k$, $S17_k$, and $S18_k$ are in the open state. Also, in the configuration of the (k+1)th column of the column readout circuit unit 3, the switches $S11_{k+1}$, $S12_{k+1}$, $S13_{k+1}$, $S19_{k+1}$, and $S20_{k+1}$ are in the closed state while the switches $S14_{k+1}$, $S15_{k+1}$, $S16_{k+1}$, $S17_{k+1}$, and $S18_{k+1}$ are in the open state.

Figure 15:
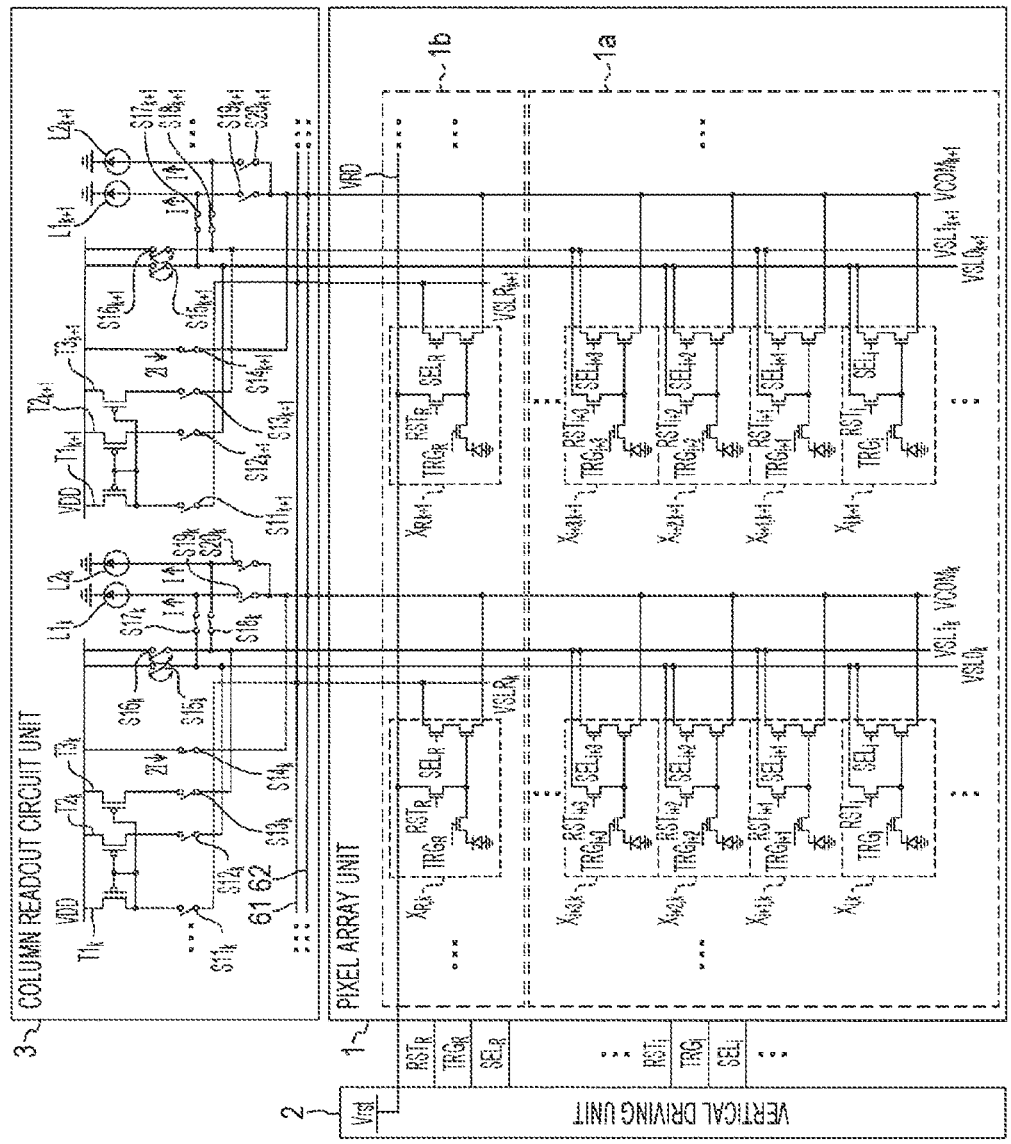
FIG. 15 is a circuit diagram in a source follower readout state of a part of the solid-state imaging apparatus according to the second embodiment.

On the other hand, FIG. 15 illustrates the source follower readout state of the solid-state imaging apparatus according to the second embodiment. In the configuration of the kth column of the column readout circuit unit 3, the switches $S11_k$, $S12_k$, $S13_k$, $S19_k$, and $S20_k$ are in the open state while the switches $S14_k$, $S17_k$, and $S18_k$ are in the closed state. The switches $S15_k$ and $S16_k$ are switched between the open state and the closed state during the source follower readout operation, Also, in the configuration of the (k+1)th column of the column readout circuit unit 3, the switches $S11_{k+1}S12_{k+1}$, $S13_{k+1}$, $S19_{k+1}$, and $S20_{k+1}$ are in the open state while the switches $S14_{k+1}$, $S17_{k+1}$, and $S18_{k+1}$ are in the closed state. The switches $S15_{k+1}$ and $S16_{k+1}$ are switched between the open state and the closed state during the source follower readout operation.

<Differential Amplification Readout Operation>

Figure 16:
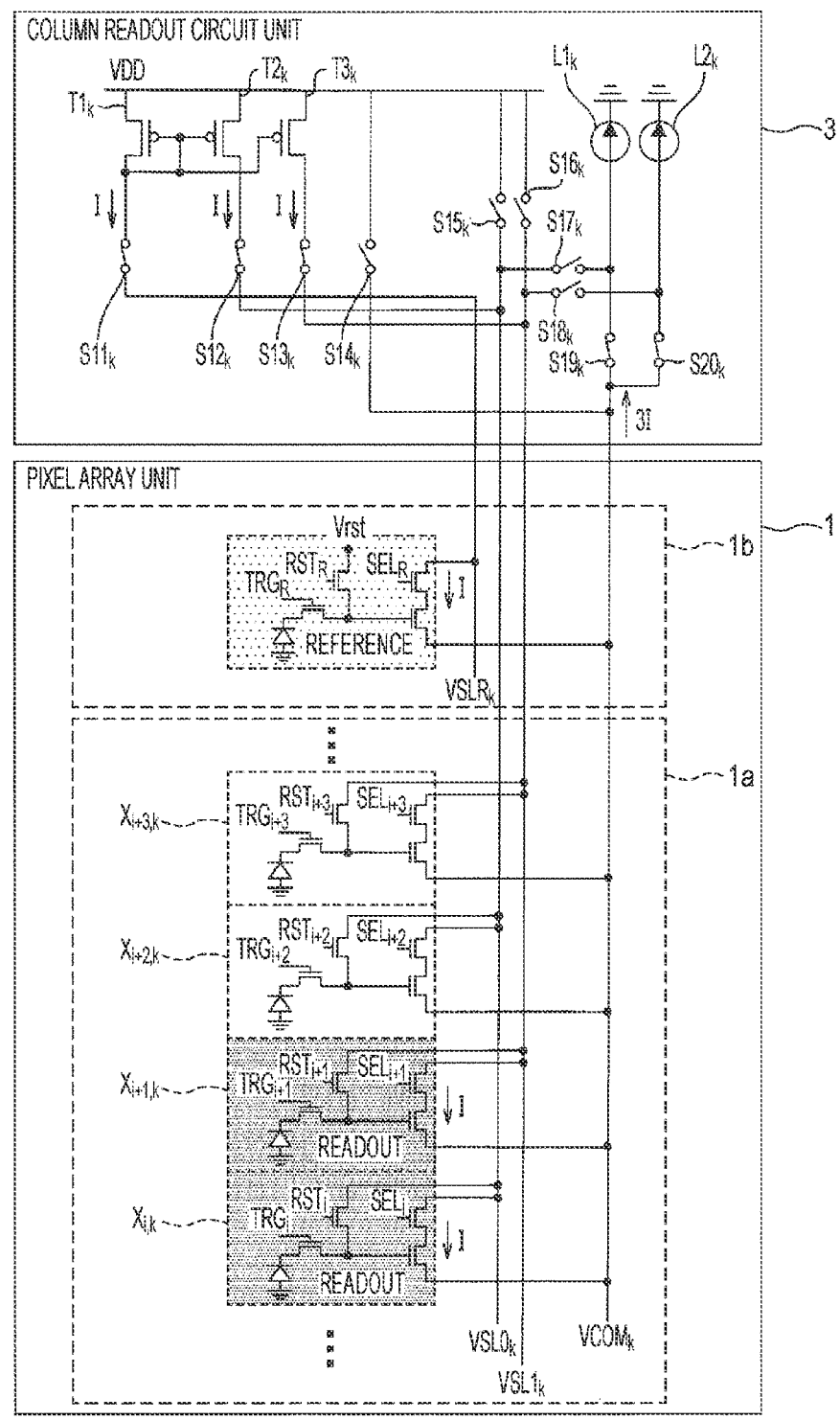
FIG. 16 is a circuit diagram in a differential amplification readout state of a part of the solid-state imaging apparatus according to the second embodiment.
Figure 17:
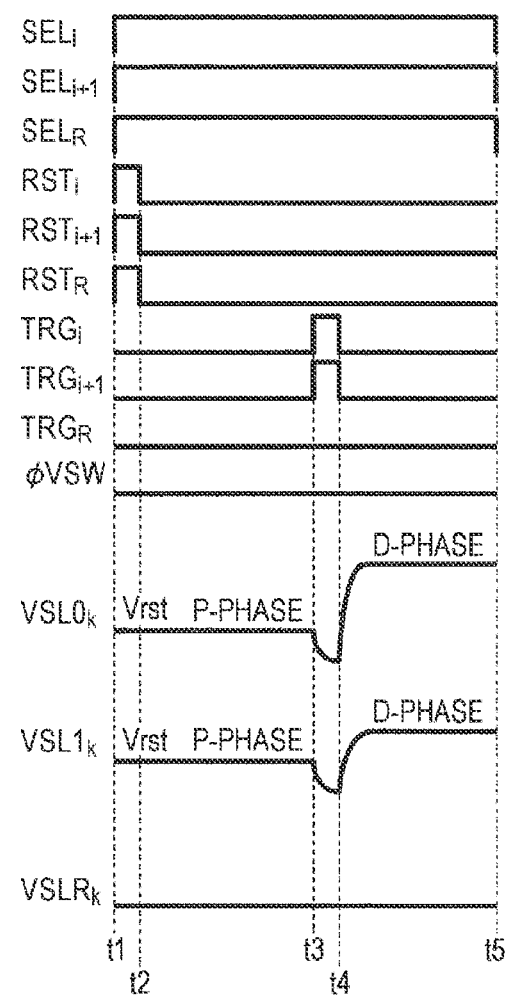
FIG. 17 is a timing chart for explaining a differential amplification readout operation by the solid-state imaging apparatus according to the second embodiment.

Next, the timing chart in FIG. 17 will be referenced to describe a differential amplification readout operation in the case where the pixels $X_{i,k+1}$ and $X_{i+1,k+1}$ in the ith and (i+1)th rows of the kth column are selected as readout pixels while the reference pixel $X_{R,k}$ is fixed, as illustrated in FIG. 16.

From a time t1 to a time t5, a select signal $SEL_R$ of the reference pixel $X_{R,k}$ is set to the H level, while in addition, the select signals $SEL_i$ and $SEL_{i+1}$ of the readout pixels $X_{i,k}$ $X_{i+1,k}$ are set to the H level. Note that from the time t1 to t5, a control signal $\varphi VSW$ of the switches $S15_k$ and $S16_k$ is set to the L level, putting the switches $S15_k$ and $S16_k$ in the open state.

From the time t1 to t2, the reset signals $RST_i$ and $RST_{i+1}$ of the readout pixels $X_{i,k}$ and $X_{i+1,k}$ are set to the H level, resetting the readout pixels $X_{i,k}$ and $X_{i+1,k}$. At the same time, a reset signal $RST_R$ of the reference pixel $X_{R,k}$ is set to the H level, resetting the reference pixel $X_{R,k}$. The output signal lines $VSL0_k$ and $VSL1_k$ go to the reset level $V_{rst}$ according to the voltage follower function of the differential amplifier. From the time t2 to t3, the reset level $V_{rst}$ is read out from the output signal lines $VSL0_k$ and $VSL1_k$ as the P-phase level.

From the time t3 to t4, the transfer signals $TRG_i$ and $TRG_{i+1}$ of the readout pixels $X_{i,k}$ and $X_{i+1,k}$ are set to the H level, the reset level $V_{rst}$ of the output signal lines $VSL0_k$ and $VSL1_k$ is inverted and amplified, and after that, the D-phase level is read out.

<Source Follower Readout Operation>

Figure 18:
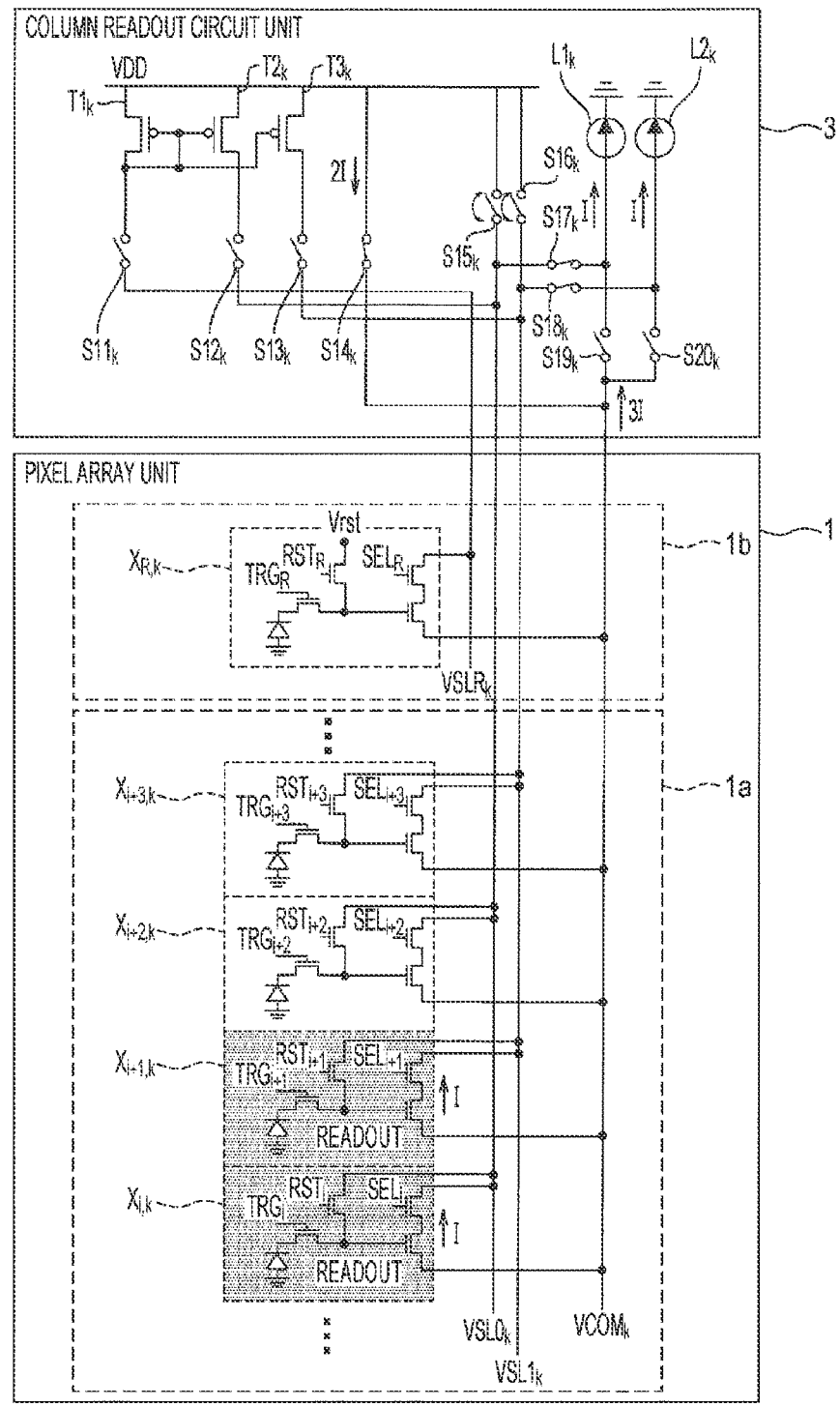
FIG. 18 is a circuit diagram in a source follower readout state of the solid-state imaging apparatus according to the second embodiment.
Figure 19:
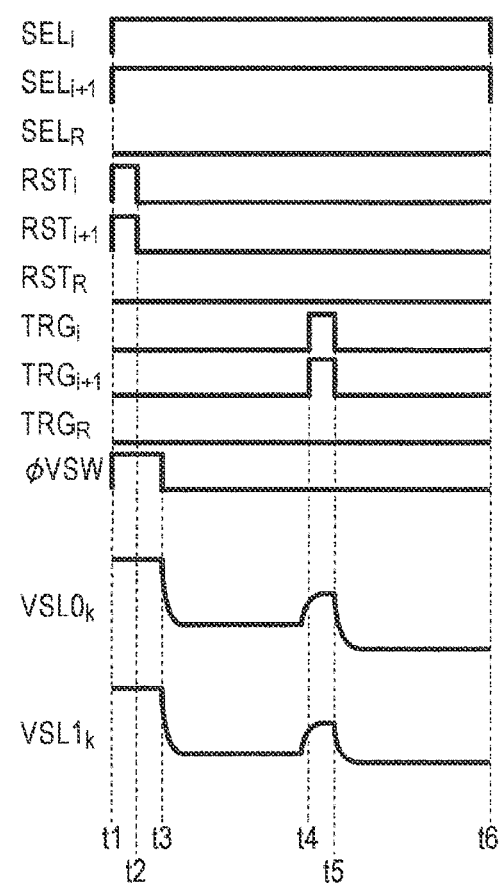
FIG. 19 is a timing chart for explaining a source follower readout operation by the solid-state imaging apparatus according to the second embodiment.

Next, the timing chart in FIG. 19 will be referenced to describe a source follower readout operation in the case where the pixels $X_{i,k}$ and $X_{i+1,k}$ in the ith and (i+1)th rows of the kth column are readout pixels, as illustrated in FIG. 18.

From a time t1 to a time t6, the select signals $SEL_i$ and $SEL_{i+1}$ of the readout pixels $X_{i,k}$ and $X_{i+1,k}$ are set to the H level. The select signal $SEL_R$ of the reference pixel $X_{R,k}$ is at the L level, and the reference pixel $X_{R,k}$ is not selected.

From the time t1 to t2, the reset signals $RST_i$ and $RST_{i+1}$ of the readout pixels $X_{i,k}$ and $X_{i+1,k}$ are set to the H level, resetting the readout pixels $X_{i,k}$ and $X_{i+1,k}$. From the time t1 to t3, the control signal $\varphi VSW$ of the switches $S15_k$ and $S16_k$ is set to the H level to put the switches $S15_k$ and $S16_k$ in the closed state, thereby shorting the output signal lines $VSL0_k$ and $VSL1_k$ and the power supply potential VDD. After that, the P-phase level is read out from the output signal lines $VSL0_k$ and $VSL1_k$.

From the time t4 to t5, the transfer signals $TRG_i$ and $TRG_{i+1}$ of the readout pixels $X_{i,k}$ and $X_{i+1,k}$ are set to the H level, the P-phase level of the output signal lines $VSL0_k$ and $VSL1_k$ is inverted and amplified, and the D-phase level is read out.

According to the solid-state imaging apparatus according to the second embodiment, it is possible to switch between source follower readout and differential amplification readout with the plurality of switches (switching units) $S11_k$, $S12_k$, $S13_k$, $S14_k$, $S15_k$, $S16_k$, $S17_k$, $S18_k$, $S19_k$, and $S20_k$. Furthermore, by having the readout pixels $X_{i,k}$, $X_{i+1,k}$, $X_{i+2,k}$ and $X_{i+3,k}$ form a negative feedback loop connecting the drain of the select transistor and the drain of the reset transistor to the output signal lines $VSL0_k$ and $VSL1_k$, the number of reset input lines can be reduced. Consequently, the vertical lines inside the pixels can be reduced, thereby improving sensitivity and also improving the freedom of line placement.

Furthermore, by fixing the pixels $X_{R,k}$ and $X_{R,k+1}$ of the reference pixel region 1b to the Rth row closest to the column readout circuit unit 3 or a nearby row among the rows of the pixel array unit 1, the line lengths of the output signal lines $VSLR_k$ and $VSLR_{k+1}$ to which the drains of the respective select transistors of the pixels $X_{R,k}$ and $X_{R,k+1}$ are connected can be shortened.

<Modification of Second Embodiment>

Figure 20:
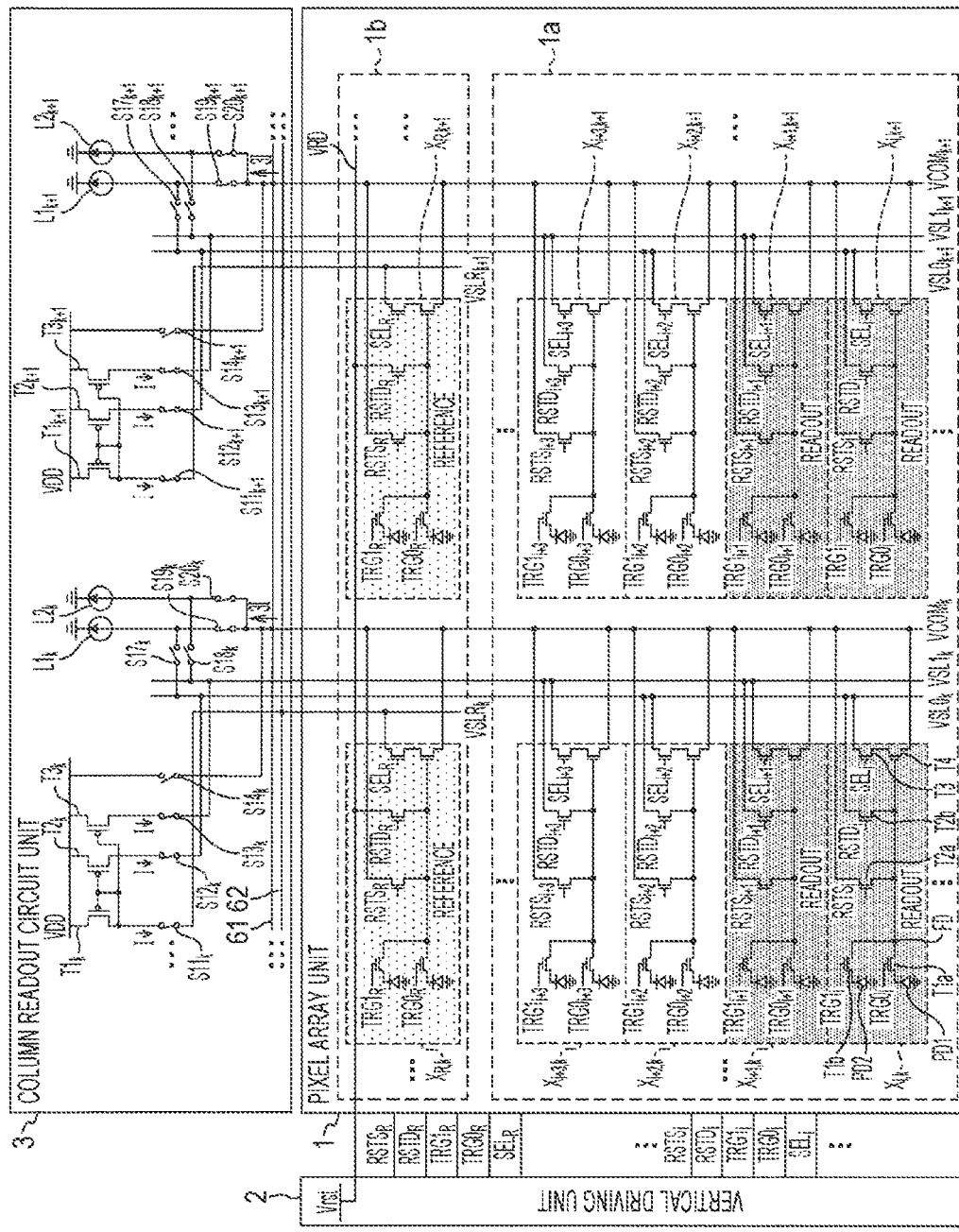
FIG. 20 is a circuit diagram in a differential amplification readout state of a part of a solid-state imaging apparatus according to a modification of the second embodiment.

As illustrated in FIG. 20, a solid-state imaging apparatus according to a modification of the second embodiment shares a point in common with the solid-state imaging apparatus according to the second embodiment illustrated in FIG. 14, namely a configuration capable of switching between source follower readout and differential amplification readout. FIG. 20 illustrates the state of differential amplification readout. In the solid-state imaging apparatus according to the modification of the second embodiment, the configuration of the readout pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ included in the readout pixel region 1a and the reference pixels $X_{R,k}$ and $X_{R,k+1}$ included in the reference pixel region 1b is different from the solid-state imaging apparatus according to the second embodiment illustrated in FIG. 14.

The readout pixel $X_{i,k}$ included in the readout pixel region 1a includes two photoelectric conversion units including photodiodes PD1 and PD2 that photoelectrically convert incident light, and a plurality of pixel transistors (T1a, T1b, T2a, T2b, T3, and T4) that controls the photoelectrically-converted signal charge. The plurality of pixel transistors (T1a, T1b, T2a, T2b, T3, and T4) includes transfer transistors T1a and T1b, a reset transistor for source follower readout (source follower reset transistor) T2a, a reset transistor for differential amplification readout (differential amplification reset transistor) T2b, a select transistor T3, and an amplification transistor T4, for example, The respective anodes of the photoelectric conversion units, that is, the photodiodes PD1 and PD2, are grounded, while the respective cathodes of the photodiodes PD1 and PD2 are connected to the sources of the transfer transistors T1a and T1b, respectively. The drains of the transfer transistors T1a and T1b are connected to the floating diffusion FD. Transfer signals $TRG0_i$ and $TRG1_i$ are respectively applied to the gates of the transfer transistors T1a and T1b.

The floating diffusion FD is connected to the sources of the source follower reset transistor T2a and the differential amplification reset transistor T2b, and to the gate of the amplification transistor T4. The source of the amplification transistor T4 is connected to a current supply line $VCOM_k$, while the drain of the amplification transistor T4 is connected to the source of the select transistor T3. The drain of the select transistor T3 is connected to the output signal line $VSL0_k$. A select signal $SEL_i$ is applied to the gate of the select transistor T3.

The drain of the source follower reset transistor T2a is connected to the current supply line $VCOM_k$. The drain of the differential amplification reset transistor T2b is connected to the output signal line $VSL0_k$. Reset signals $RSTS_i$ and $RSTD_i$ are respectively applied to the gates of the source follower reset transistor T2a and the differential amplification reset transistor T2b. Each of the other readout pixels $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ included in the readout pixel region 1a as well as the reference pixels $X_{R,k}$ and $X_{R,k+1}$ included in the reference pixel region 1b has a configuration similar to the readout pixel $X_{i,k}$.

On the other hand, in the reference pixel region 1b, a reset signal $RSTS_R$ is applied to the gates of the respective source follower reset transistors of the reference pixels $X_{R,k}$ and $X_{R,k+1}$. The drains of the respective source follower reset transistors of the reference pixels $X_{R,k}$ and $X_{R,k+1}$ are connected to the current supply lines $VCOM_k$ and $VCOM_{k+1}$.

A reset signal $RSTD_R$ is applied to the gates of the respective differential amplification reset transistors of the reference pixels $X_{R,k}$ and $X_{R,k+1}$. The drains of the respective differential amplification reset transistors of the reference pixels $X_{R,k}$ and $X_{R,k+1}$ are connected to a common reset input line VRD. The rest of the configuration, including the column readout circuit unit 3, of the solid-state imaging apparatus according to the modification of the second embodiment is similar to the solid-state imaging apparatus according to the second embodiment illustrated in FIG. 14, and therefore a duplicate description will be omitted.

<Differential Amplification Readout Operation>

Figure 21:
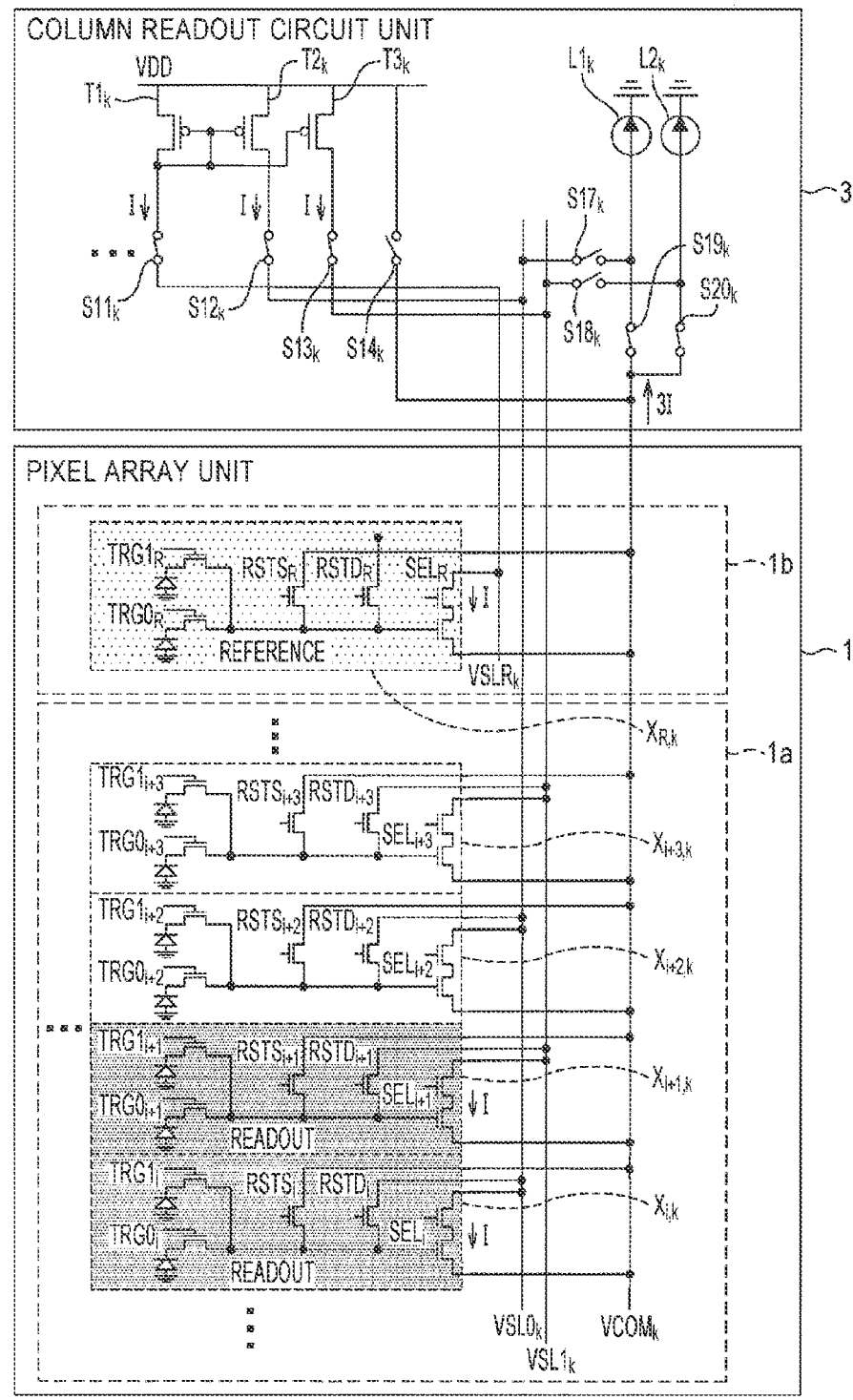
FIG. 21 is a circuit diagram in a differential amplification readout state of a part of the solid-state imaging apparatus according to the modification of the second embodiment.
Figure 22:
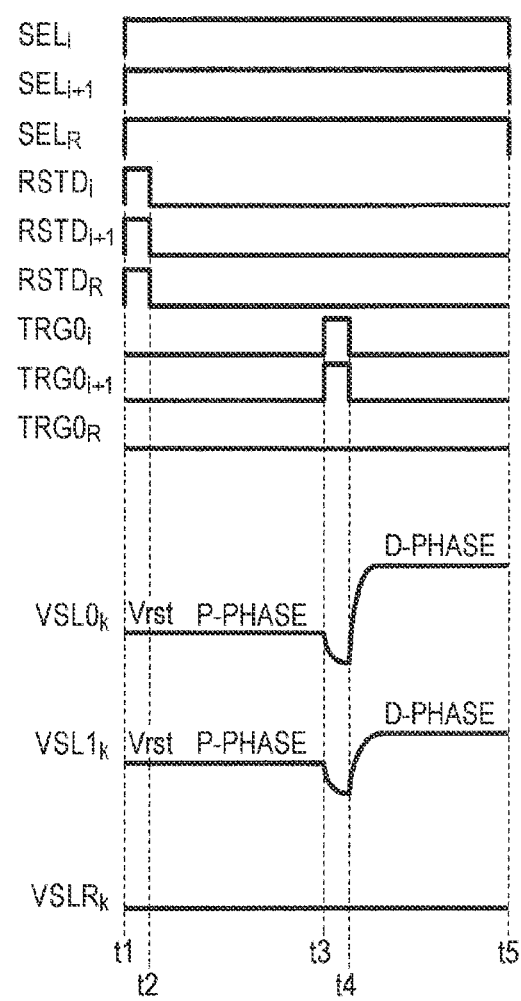
FIG. 22 is a timing chart for explaining a differential amplification readout operation by the solid-state imaging apparatus according to the modification of the second embodiment.

Next, the timing chart in FIG. 22 will be referenced to describe a differential amplification readout operation in the modification of the second embodiment in the case where the pixels $X_{i,k+1}$ and $X_{i+1,k+1}$ in the ith and (i+1)th rows of the kth column are the readout pixels while the reference pixel $X_{R,k}$ is fixed, as illustrated in FIG. 21.

From a time t1 to a time t5, a select signal $SEL_R$ of the reference pixel $X_{R,k}$ is set to the H level, while in addition, the select signals $SEL_i$ and $SEL_{i+1}$ of the readout pixels $X_{i,k}$ and $X_{i+1,k}$ are set to the H level. Note that from the time t1 to t5, a control signal $\varphi VSW$ of the switches $S15_k$ and $S16_k$ is set to the L level, putting the switches $S15_k$ and $S16_k$ in the open state. Also, from the time t1 to t5, the reset signals $RSTS_i$ and $RSTS_{i+1}$ of the readout pixels $X_{i,k}$ and $X_{i+1,k}$ as well as the reset signal $RSTS_R$ of the reference pixel $X_{R,k}$ are set to the L level.

From the time t1 to t2, the reset signals $RSTD_i$ and $RSTD_{i+1}$ of the readout pixels $X_{i,k}$ and $X_{i+1,k}$ are set to the H level, resetting the readout pixels $X_{i,k}$ and $X_{i+1,k}$. At the same time, a reset signal $RSTD_R$ of the reference pixel $X_{R,k}$ is set to the H level, resetting the reference pixel $X_{R,k}$. The output signal lines $VSL0_k$ and $VSL1_k$ go to the reset level $V_{rst}$ according to the voltage follower function of the differential amplifier. From the time t2 to t3, the reset level $V_{rst}$ is read out from the output signal lines $VSL0_k$ and $VSL1_k$ as the P-phase level.

From the time t3 to t4, the transfer signals $TRG0_i$ and $TRG0_{i+1}$ of the readout pixels $X_{i,k}$ and $X_{i+1,k}$ are set to the H level, the reset level $V_{rst}$ of the output signal lines $VSL0_k$ and $VSL1_k$ is inverted and amplified, and the D-phase level is read out.

<Source Follower Readout Operation>

Figure 23:
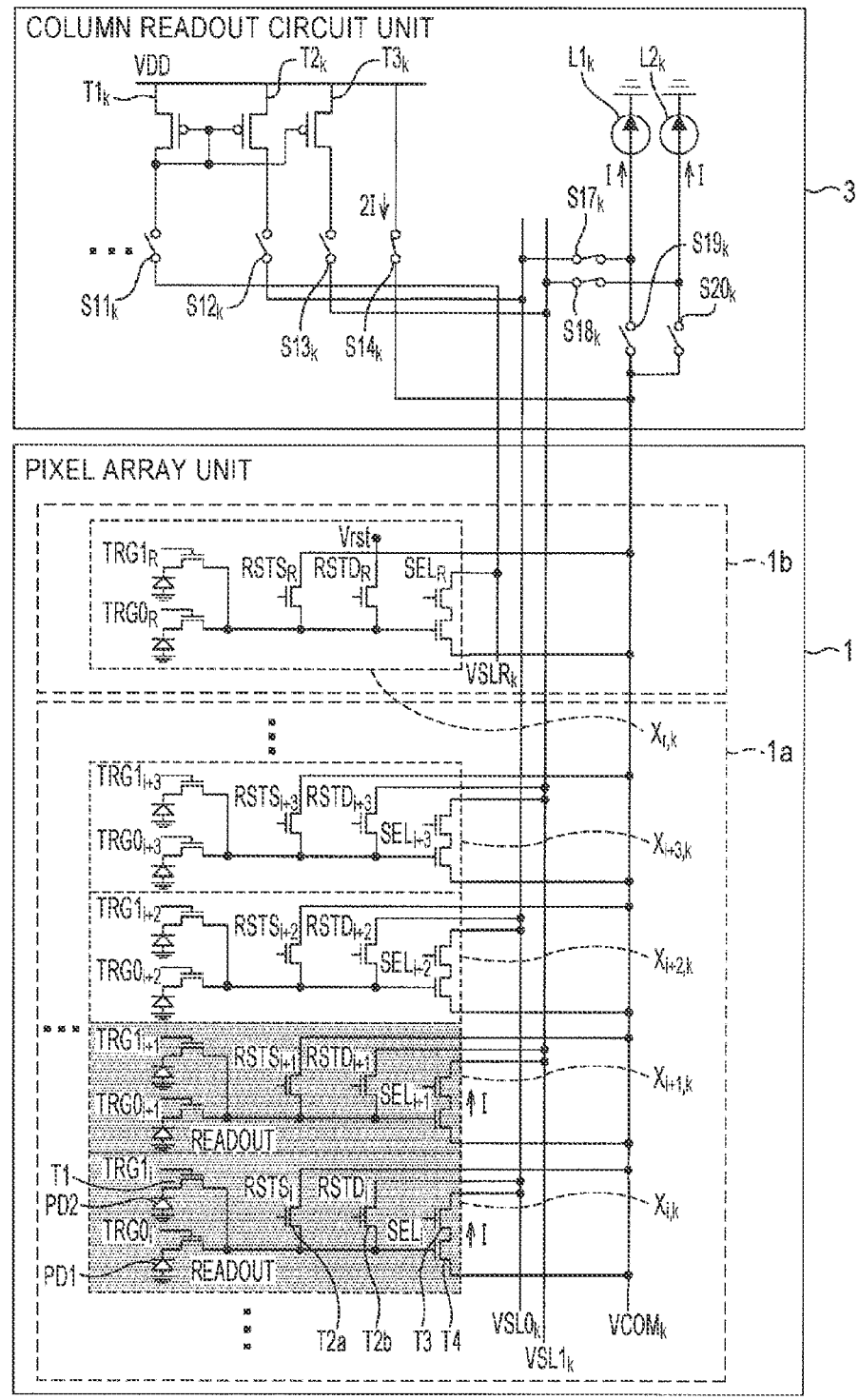
FIG. 23 is a circuit diagram in a source follower readout state of the solid-state imaging apparatus according to the modification of the second embodiment.
Figure 24:
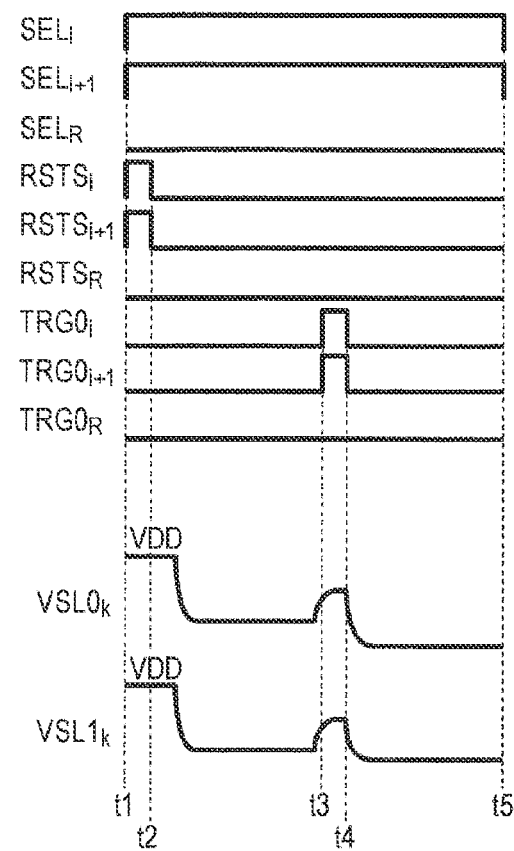
FIG. 24 is a timing chart for explaining a source follower readout operation by the solid-state imaging apparatus according to the modification of the second embodiment.

Next, the timing chart in FIG. 24 will be referenced to describe a source follower readout operation in the modification of the second embodiment in the case where the pixels $X_{i,k+1}$ and $X_{i+1,k+1}$ in the ith and (i+1)th rows are the readout pixels, as illustrated in FIG. 23.

From a time t1 to a time t5, the select signals $SEL_i$ and $SEL_{i+1}$ of the readout pixels $X_{i,k}$ $X_{i+1,k}$ are set to the H level. The select signal $SEL_R$ of the reference pixel $X_{R,k}$ is at the L level, and the reference pixel $X_{R,k}$ is not selected. Note that the reset signals $RSTD_i$ and $RSTD_{+1}$ of the readout pixels $X_{i,k}$ and $X_{i+1,k}$ are set to the L level.

From the time t1 to t2, the reset signals $RSTS_i$ and $RSTS_{i+1}$ of the readout pixels $X_{i,k}$ $X_{i+1,k}$ are set to the H level, resetting the readout pixels $X_{i,k}$ and $X_{i+1,k}$. From the time t1 to t3, the control signal $\varphi VSW$ of the switches $S15_k$ and $S16_k$ is set to the H level to put the switches $S15_k$ and $S16_k$ in the closed state, thereby shorting the output signal lines $VSL0_k$ and $VSL1_k$ and the power supply potential VDD. After that, the P-phase level is read out from the output signal lines $VSL0_k$ and $VSL1_k$.

From the time t4 to t5, the transfer signals $TRG_i$ $TRG_{i+1}$ and of the readout pixels $X_{i,k}$ and $X_{i+1,k}$ are set to the H level, the P-phase level of the output signal lines $VSL0_k$ and $VSL1_k$ is inverted and amplified, and the D-phase level is read out.

According to the solid-state imaging apparatus according to the modification of the second embodiment, by having each of the readout pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ as well as the reference pixels $X_{R,k}$ and $X_{R,k+1}$ include the source follower reset transistor T2a and the differential amplification reset transistor T2b, compared to the solid-state imaging apparatus according to the second embodiment illustrated in FIG. 15, it is possible to switch between source follower readout and differential amplification readout even without the switch $S15_k$ disposed between the power supply voltage VDD and the output signal line $VSL0_k$ and the switch $S16_k$ disposed between the power supply voltage VDD and the output signal line $VSL1_k$.

Third Embodiment

As described above, there has been proposed a differential amplification CIS capable of increased gain and significantly higher conversion efficiency compared to a source follower CIS of the related art. However, in a differential amplification CIS, it is necessary to keep the reset voltage of the floating diffusion below the power supply voltage of the pixels to secure the output amplitude range during readout. For this reason, in a source follower CIS of the related art, the source diffusion layer of the amplification transistor and the source diffusion layer of the reset transistor can be shared among the pixels, whereas in a differential amplification CIS, the source diffusion layer of the amplification transistor and the source diffusion layer of the reset transistor is not shared among the pixels. For this reason, a differential amplification CIS has poor layout efficiency compared to a source follower CIS. Particularly, in the case of small pixels at sub-micron sizes, the gate length of the amplification transistor becomes short, and RTS noise worsens. Accordingly, a third embodiment proposes a solid-state imaging apparatus in which the gate length of the amplification transistor can be lengthened and the RTS noise can be improved even at small pixel sizes.

<Configuration of Solid-State Imaging Apparatus>

Figure 25:
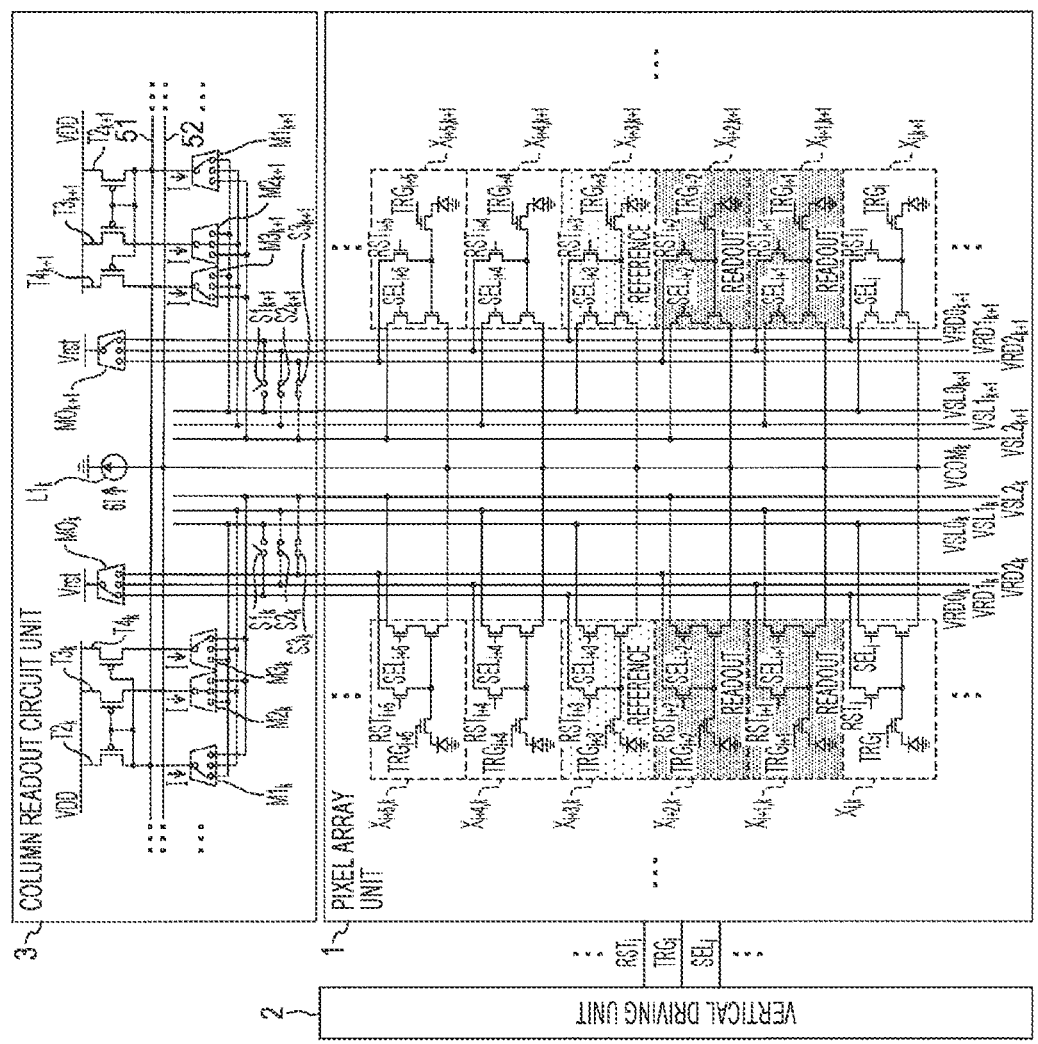
FIG. 25 is a circuit diagram of a part of a solid-state imaging apparatus according to a third embodiment.

The overall configuration of the solid-state imaging apparatus according to the third embodiment is shared in common with the solid-state imaging apparatus according to the first embodiment illustrated in FIG. 1. As illustrated in FIG. 25, in the solid-state imaging apparatus according to the third embodiment, a pixel array unit 1 includes pixels $X_{i,k}$, $X_{i+1,k}$, $X_{i+2,k}$, $X_{i+3,k}$, $X_{i+4,k}$, $X_{i+5,k}$, $X_{i,k+1}$, $X_{i+1,k+1}$, $X_{i+2,k+1}$, $X_{i+3,k+1}$, $X_{i+4,k+1}$, and $X_{i+5,k+1}$ arranged in a matrix.

In FIG. 25, in the kth column, the pixels $X_{i+1,k}$ and $X_{i+2,k}$ in the (i+1)th and (i+2)th rows are selected as readout pixels while the pixel $X_{i+3,k}$ in the (i+3)th row is selected as the reference pixel. Also, in the (k+1)th column, the pixels $X_{i+1,k+1}$ and $X_{i+2,k+1}$ in the (i+1)th and (i+2)th rows are selected as readout pixels while the pixel $X_{i+3,k}$ in the (i+3)th row is selected as the reference pixel.

The sources of the respective amplification transistors of the readout pixels $X_{i+1,k}$, $X_{i+2,k}$, $X_{i+1,k+1}$, and $X_{i+2,k+1}$ as well as the reference pixels $X_{i+3,k}$ and $X_{i+3,k+1}$ are connected to a common current supply line $VCOM_k$. The rest of the circuit configuration of the solid-state imaging apparatus according to the third embodiment is similar to the solid-state imaging apparatus according to the second modification of the first embodiment illustrated in FIG. 7, and therefore a duplicate description will be omitted.

Figure 26:
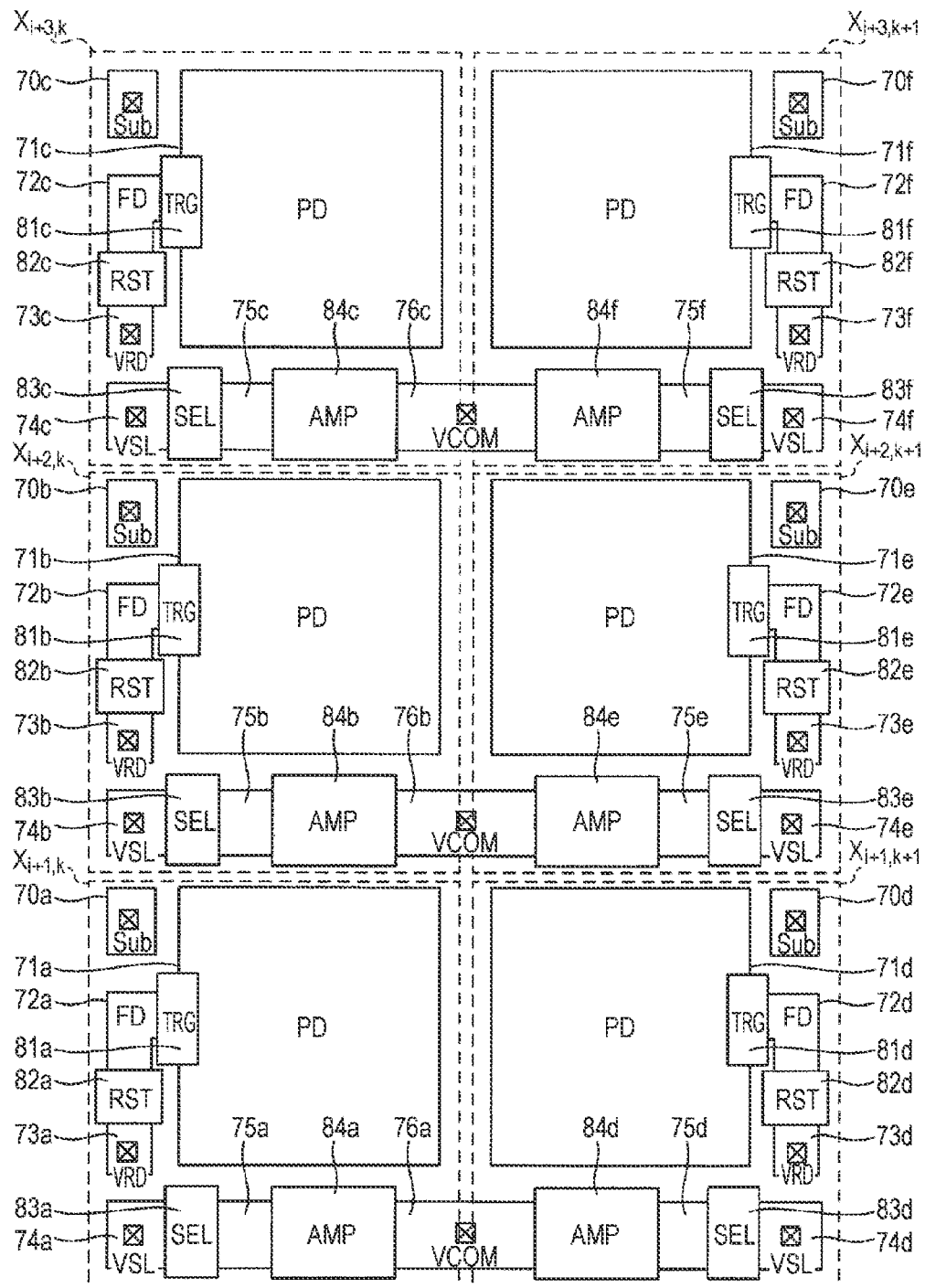
FIG. 26 is a schematic plan view of a part of the solid-state imaging apparatus according to the third embodiment.

FIG. 26 illustrates a plan-view layout of the portion of the readout pixels $X_{i+1,k}$, $X_{i+2,k}$, $X_{i+1,k+1}$, and $X_{i+2,k+1}$ as well as the reference pixels $X_{i+3,k}$ and $X_{i+3,k+1}$ illustrated in FIG. 25. The readout pixels $X_{i+1,k}$ and $X_{i+2,k}$ as well as the reference pixel $X_{i+3,k}$ in the kth column and the readout pixels $X_{i+1,k+1}$ and $X_{i+2,k+1}$ as well as the reference pixel $X_{i+3,k+1}$ in the (k+1)th column have a plan-view layout (plan-view pattern) with left/right line symmetry in FIG. 26. In other words, in the readout pixels $X_{i+1,k}$ and $X_{i+2,k}$ as well as the reference pixel $X_{i+3,k}$ in the kth column and the readout pixels $X_{i+1,k+1}$ and $X_{i+2,k+1}$ as well as the reference pixel $X_{i+3,k+1}$ in the (k+1)th column, the arrangement of components such as the floating diffusion, the reset transistor, the amplification transistor, and the select transistor has line symmetry. Note that in the plan-view layouts illustrated in FIG. 26 and subsequent drawings, to facilitate understanding, each part is denoted with a label such as "PD", "TRG", "FD", "RST", "VRD", "VSL", "SEL", "AMP", or "VCOM".

The readout pixel $X_{i+1,k}$ the (i+1)th row of the kth column is provided with a diffusion layer 70a for applying a substrate potential, a diffusion layer 71a that forms a photodiode, a gate electrode 81a of the transfer transistor, a common diffusion layer 72a that acts as the floating diffusion and the source diffusion layer of the reset transistor, a gate electrode 82a of the reset transistor, a drain diffusion layer 73a of the reset transistor, a source diffusion layer 74a of the select transistor, a gate electrode 83a of the select transistor, a common diffusion layer 75a that acts as the source diffusion layer of the select transistor and the drain diffusion layer of the amplification transistor, a gate electrode 84a of the amplification transistor, and a source diffusion layer 76a of the amplification transistor.

The readout pixel $X_{i+1,k+1}$ in the (i+1)th row of the (k+1)th column, which is adjacent in the row direction to the readout pixel $X_{i+1,k}$, is provided with a diffusion layer 70d for applying a substrate potential, a diffusion layer 71d that forms a photodiode, a gate electrode 81d of the transfer transistor, a common diffusion layer 72d that acts as the floating diffusion and the source diffusion layer of the reset transistor, a gate electrode 82d of the reset transistor, a drain diffusion layer 73d of the reset transistor, a drain diffusion layer 74d of the select transistor, a gate electrode 83d of the select transistor, a common diffusion layer 75d that acts as the source diffusion layer of the select transistor and the drain diffusion layer of the amplification transistor, a gate electrode 84d of the amplification transistor, and a source diffusion layer 76a of the amplification transistor. In other words, in the same (i+1)th row, the readout pixels $X_{i+1,k}$ and $X_{i+1,k+1}$ that are adjacent to each other share the source diffusion layer 76a of the amplification transistor.

The readout pixel $X_{i+2,k}$ in the (i+2)th row of the kth column is provided with a diffusion layer 70b for applying a substrate potential, a diffusion layer 71b that forms a photodiode, a gate electrode 81b of the transfer transistor, a common diffusion layer 72b that acts as the floating diffusion and the source diffusion layer of the reset transistor, a gate electrode 82b of the reset transistor, a drain diffusion layer 73b of the reset transistor, a source diffusion layer 74b of the select transistor, a gate electrode 83b of the select transistor, a common diffusion layer 75b that acts as the source diffusion layer of the select transistor and the drain diffusion layer of the amplification transistor, a gate electrode 84b of the amplification transistor, and a source diffusion layer 76b of the amplification transistor.

The readout pixel $X_{i+2,k+1}$ in the (i+2)th row of the (k+1)th column, which is adjacent in the row direction to the readout pixel $X_{i+2,k}$, is provided with a diffusion layer 70e for applying a substrate potential, a diffusion layer 71e that forms a photodiode, a gate electrode 81e of the transfer transistor, a common diffusion layer 72e that acts as the floating diffusion and the source diffusion layer of the reset transistor, a gate electrode 82e of the reset transistor, a drain diffusion layer 73e of the reset transistor, a drain diffusion layer 74e of the select transistor, a gate electrode 83e of the select transistor, a common diffusion layer 75e that acts as the source diffusion layer of the select transistor and the drain diffusion layer of the amplification transistor, a gate electrode 84e of the amplification transistor, and a source diffusion layer 76b of the amplification transistor. In other words, in the same (i+2)th row, the readout pixels $X_{i+2,k}$ and $X_{i+2,k+1}$ that are adjacent to each other share the source diffusion layer 76b of the amplification transistor.

The reference pixel $X_{i+3,k}$ in the (i+3)th row of the kth column is provided with a diffusion layer 70c for applying a substrate potential, a diffusion layer 71c that forms a photodiode, a gate electrode 81c of the transfer transistor, a common diffusion layer 72c that acts as the floating diffusion and the source diffusion layer of the reset transistor, a gate electrode 82c of the reset transistor, a drain diffusion layer 73c of the reset transistor, a source diffusion layer 74c of the select transistor, a gate electrode 83b of the select transistor, a common diffusion layer 75c that acts as the source diffusion layer of the select transistor and the drain diffusion layer of the amplification transistor, a gate electrode 84c of the amplification transistor, and a source diffusion layer 76c of the amplification transistor.

The reference pixel $X_{i+3,k+1}$ in the (i+3)th row of the (k+1)th column, which is adjacent in the row direction to the reference pixel $X_{i+3,k}$, is provided with a diffusion layer 70f for applying a substrate potential, a diffusion layer 71f that forms a photodiode, a gate electrode 81f of the transfer transistor, a common diffusion layer 72f that acts as the floating diffusion and the source diffusion layer of the reset transistor, a gate electrode 82f of the reset transistor, a drain diffusion layer 73f of the reset transistor, a drain diffusion layer 74f of the select transistor, a gate electrode 83f of the select transistor, a common diffusion layer 75f that acts as the source diffusion layer of the select transistor and the drain diffusion layer of the amplification transistor, a gate electrode 84f of the amplification transistor, and a source diffusion layer 76c of the amplification transistor. In other words, in the same (i+3)th row, the reference pixels $X_{i+3,k}$ and $X_{i+3,k+1}$ that are adjacent to each other share the source diffusion layer 76c of the amplification transistor.

According to the solid-state imaging apparatus according to the third embodiment, the readout pixels $X_{i+1,k}$, $X_{i+2,k}$, $X_{i+1,k+1}$, $X_{i+2,k+1}$ as well as the reference pixels $X_{i+3,k}$ and $X_{i+3,k+1}$ adjacent to each other in the same rows share source diffusion layers 76a, 76b, and 76c of the amplification transistor. With this arrangement, the gate length of the amplification transistor of each of the readout pixels $X_{i+1,k}$, $X_{i+2,k}$, $X_{i+1,k+1}$, $X_{i+2,k+1}$ as well as the reference pixels $X_{i+3,k}$ and $X_{i+3,k+1}$ can be lengthened and the RTS noise can be improved, even at small pixel sizes.

<First Modification of Third Embodiment>

Like the solid-state imaging apparatus according to the first embodiment, a solid-state imaging apparatus according to a first modification of the third embodiment includes the pixel array unit 1 illustrated in FIG. 2. As illustrated in FIG. 2, in the kth column, the pixels $X_{i,k}$ and $X_{i+3,k}$ are selected as readout pixels while the pixels $X_{i+1,k}$ and $X_{i+2,k}$ are selected as reference pixels. In the (k+1)th column, the pixels $X_{i,k+1}$ and $X_{i+3,k+1}$ are selected as readout pixels while the pixels $X_{i+1,k+1}$ and $X_{i+2,k+1}$ are selected as reference pixels.

Figure 27:
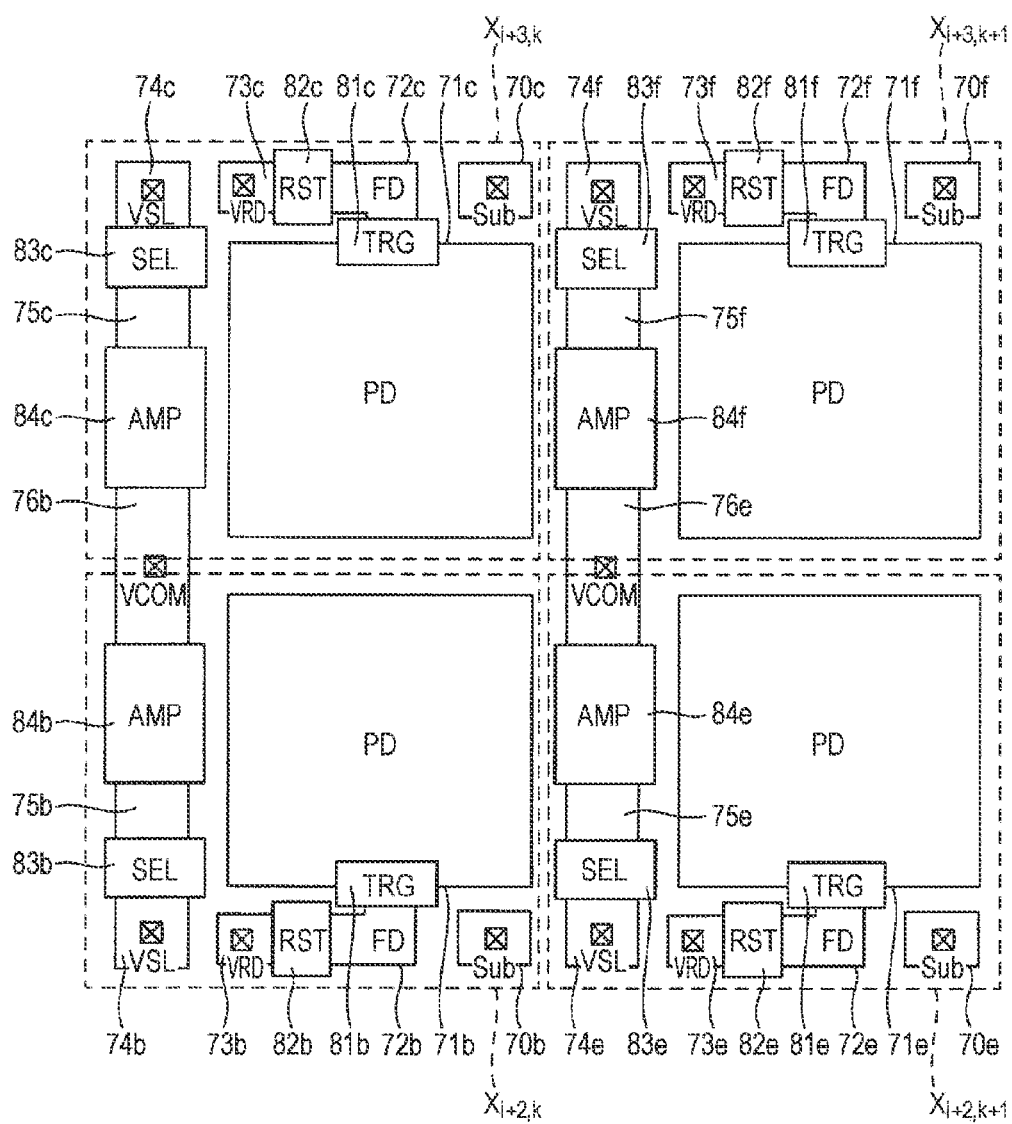
FIG. 27 is a schematic plan view of a part of a solid-state imaging apparatus according to a first modification of the third embodiment.

FIG. 27 illustrates a plan-view layout of the portion of the readout pixel $X_{i+2,k}$ as well as the reference pixel $X_{i+3,k}$ in the kth column and the readout pixel $X_{i+2,k+1}$ as well as the reference pixel $X_{i+3,k+1}$ in the (k+1)th column of the pixel array unit 1 illustrated in FIG. 2. The readout pixels $X_{i+2,k}$ and $X_{i+2,k+1}$ in the same (i+2)th row as well as the reference pixels $X_{i+3,k}$ and $X_{i+3,k+1}$ and in the same (i+3)th row have a plan-view layout with top/bottom line symmetry in FIG. 27. In other words, in the readout pixels $X_{i+2,k}$ and $X_{i+2,k+1}$ in the same (i+2)th row as well as the reference pixels $X_{i+3,k}$ and $X_{i+3,k+1}$ in the same (i+3)th row, the arrangement of components such as the floating diffusion, the reset transistor, the amplification transistor, and the select transistor has line symmetry.

The readout pixel $X_{i+2,k}$ in the (i+2)th row of the kth column is provided with a diffusion layer 70b for applying a substrate potential, a diffusion layer 71b that forms a photodiode, a gate electrode 81b of the transfer transistor, a common diffusion layer 72b that acts as a drain diffusion layer of a transfer transistor, the floating diffusion, and the source diffusion layer of the reset transistor, a gate electrode 82b of the reset transistor, a drain diffusion layer 73b of the reset transistor, a source diffusion layer 74b of the select transistor, a gate electrode 83b of the select transistor, a common diffusion layer 75b that acts as the source diffusion layer of the select transistor and the drain diffusion layer of the amplification transistor, a gate electrode 84b of the amplification transistor, and a source diffusion layer 76b of the amplification transistor.

Further, the reference pixel $X_{i+3,k}$ in the (i+3)th row of the kth row, which is adjacent in the column direction to the readout pixel $X_{i+2,k}$, is provided with a diffusion layer 70c for applying a substrate potential, a diffusion layer 71c that forms a photodiode, a gate electrode 81c of the transfer transistor, a common diffusion layer 72c that acts as a drain diffusion layer of a transfer transistor, the floating diffusion, and the source diffusion layer of the reset transistor, a gate electrode 82c of the reset transistor, a drain diffusion layer 73c of the reset transistor, a source diffusion layer 74c of the select transistor, a gate electrode 83b of the select transistor, a common diffusion layer 75c that acts as the source diffusion layer of the select transistor and the drain diffusion layer of the amplification transistor, a gate electrode 84c of the amplification transistor, and a source diffusion layer 76b of the amplification transistor. In other words, in the same kth column, the readout pixel $X_{i+2,k}$ and the reference pixel $X_{i+3,k}$ that are adjacent to each other share the source diffusion layer 76b of the amplification transistor.

The readout pixel $X_{i+2,k+1}$ in the (i+2)th row of the (k+1)th column is provided with a diffusion layer 70e for applying a substrate potential, a diffusion layer 71e that forms a photodiode, a gate electrode 81e of the transfer transistor, a common diffusion layer 72e that acts as a drain diffusion layer of a transfer transistor, the floating diffusion, and the source diffusion layer of the reset transistor, a gate electrode 82e of the reset transistor, a drain diffusion layer 73e of the reset transistor, a drain diffusion layer 74e of the select transistor, a gate electrode 83e of the select transistor, a common diffusion layer 75e that acts as the source diffusion layer of the select transistor and the drain diffusion layer of the amplification transistor, a gate electrode 84e of the amplification transistor, and a source diffusion layer 76e of the amplification transistor.

Further, the reference pixel $X_{i+3,k+1}$ in the (i+3)th row of the (k+1)th row, which is adjacent in the column direction to the readout pixel $X_{i+2,k+1}$ is provided with a diffusion layer 70f for applying a substrate potential, a diffusion layer 71f that forms a photodiode, a gate electrode 81f of the transfer transistor, a common diffusion layer 72f that acts as a drain diffusion layer of a transfer transistor, the floating diffusion, and the source diffusion layer of the reset transistor, a gate electrode 82f of the reset transistor, a drain diffusion layer 73f of the reset transistor, a drain diffusion layer 74f of the select transistor, a gate electrode 83f of the select transistor, a common diffusion layer 75f that acts as the source diffusion layer of the select transistor and the drain diffusion layer of the amplification transistor, a gate electrode 84f of the amplification transistor, and a source diffusion layer 76e of the amplification transistor. In other words, in the same (k+1)th column, the readout pixel $X_{i+2,k+1}$ and the reference pixel $X_{i+3,k+1}$ that are adjacent to each other share the source diffusion layer 76c of the amplification transistor.

According to the solid-state imaging apparatus according to the first modification of the third embodiment, the readout pixels $X_{i+2,k}$ and the reference pixel $X_{i+3,k}$ as well as the readout pixel $X_{i+2,k+1}$ and the reference pixel $X_{i+3,k+1}$ adjacent to each other in the same columns share respective source diffusion layers 76b and 76f of the amplification transistor. With this arrangement, the gate length of the amplification transistor of each of the readout pixels $X_{i+2,k}$ and $X_{i+2,k+1}$ as well as the reference pixels $X_{i+3,k}$ and $X_{i+3,k+1}$ can be lengthened and the RTS noise can be improved, even at small pixel sizes.

Note that although FIG. 27 illustrates an example of a case in which the readout pixels $X_{i+2,k}$ and the reference pixel $X_{i+3,k}$ as well as the readout pixel $X_{i+2,k+1}$ and the reference pixel $X_{i+3,k+1}$ adjacent to each other in the same columns share respective source diffusion layers 76b and 76f of the amplification transistor, the pairs of a readout pixel and a reference pixel are not limited to sharing a source diffusion layer. For example, in the kth column of the pixel array unit 1 illustrated in FIG. 2, the readout pixels $X_{i+1,k}$ and $X_{i+2,k}$ adjacent to each other may share the source diffusion layer of the amplification transistor. Also, in the case where reference pixels are adjacent to each other in the same column, the adjacent reference pixels may share the drain diffusion layer of the amplification transistor.

<Second Modification of Third Embodiment>

Figure 28:
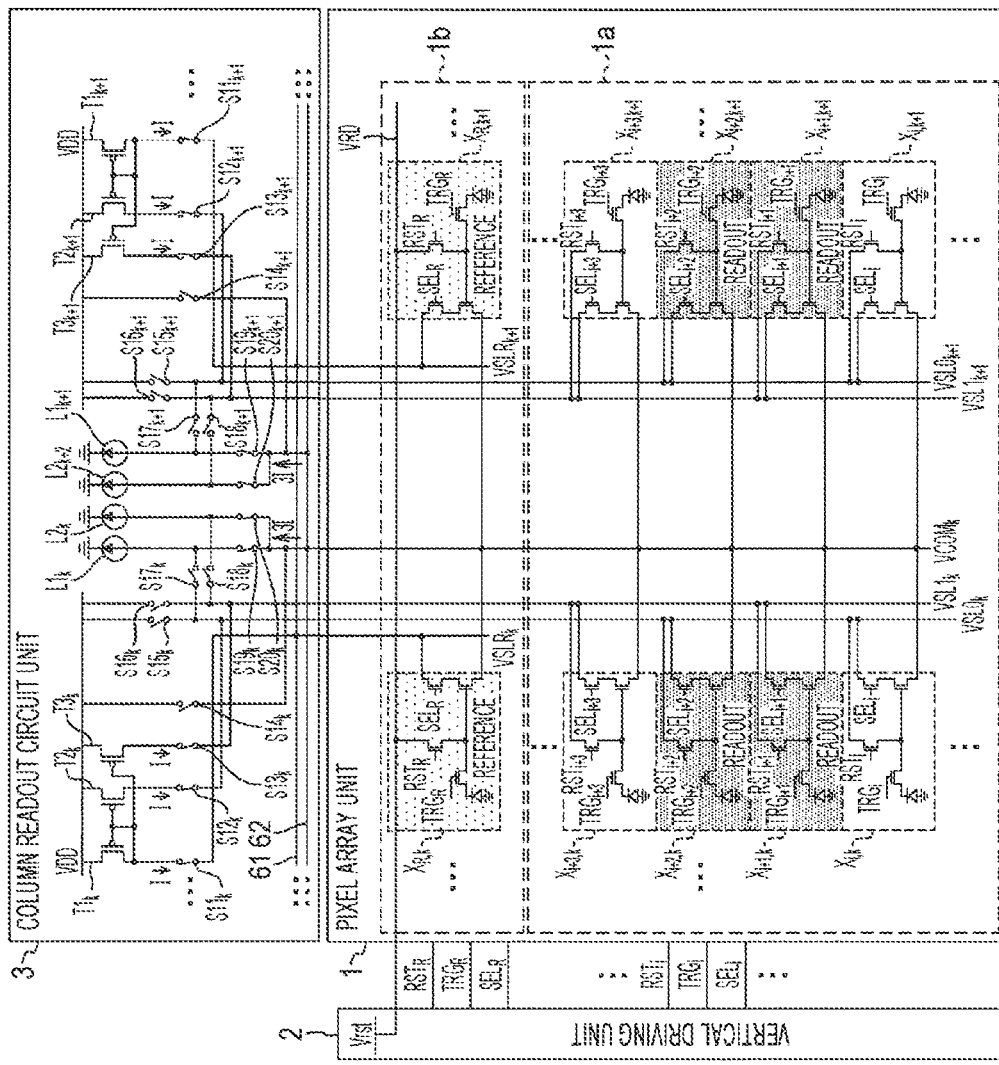
FIG. 28 is a circuit diagram of a part of a solid-state imaging apparatus according to a second modification of the third embodiment.

As illustrated in FIG. 28, a solid-state imaging apparatus according to a second modification of the third embodiment shares a point in common with the solid-state imaging apparatus according to the second embodiment illustrated in FIG. 14, namely that the pixel array unit 1 includes the readout pixel region 1a and the reference pixel region 1b.

However, the solid-state imaging apparatus according to the second modification of the third embodiment differs from the solid-state imaging apparatus according to the second embodiment illustrated in FIG. 14 in that the drains of the respective amplification transistors of the pixels $X_{i,k}$, $X_{i+1,k}$, $X_{i+2,k}$, $X_{i+3,k}$, $X_{i+4,k}$, and $X_{i+5,k}$ in the kth column as well as the pixels $X_{i,k+1}$, $X_{i+1,k+1}$, $X_{i+2,k+1}$, $X_{i+3,k+1}$, $X_{i+4,k+1}$, and $X_{i+5,k+1}$ in the (k+1)th column in the readout pixel region 1a are connected to a common current supply line $VCOM_k$. The common current supply line $VCOM_k$ is shorted with the current supply line of each of the other columns omitted from illustration in FIG. 28 by the short line 61 of the column readout circuit unit 3.

In the kth column, the pixels $X_{i,k}$ and $X_{i+3,k}$ are selected as readout pixels while the pixel $X_{R,k}$ is fixed as the reference pixel. In the (k+1)th column, the pixels $X_{i,k+1}$ and $X_{i+3,k+1}$ are selected as readout pixels while the pixel $X_{R,k+1}$ is fixed as the reference pixel. The rest of the configuration of the solid-state imaging apparatus according to the second modification of the third embodiment is similar to the solid-state imaging apparatus according to the second embodiment illustrated in FIG. 14, and therefore a duplicate description will be omitted.

Figure 29:
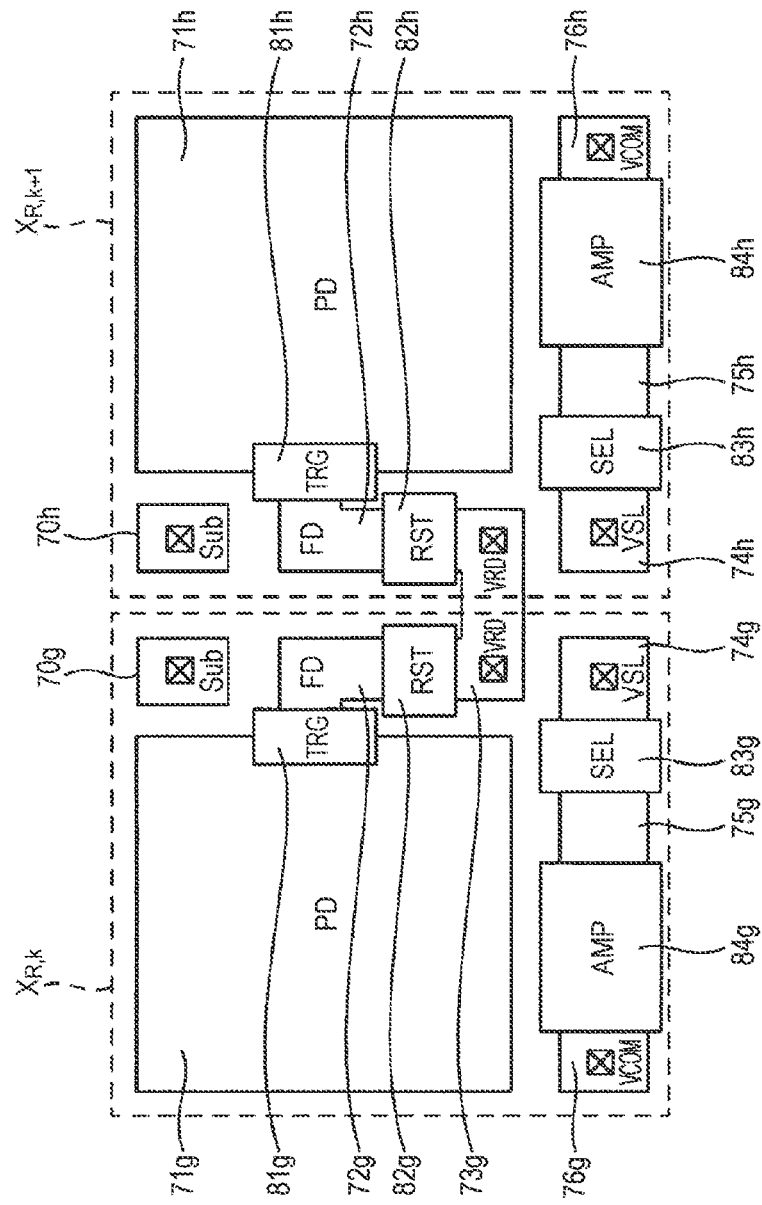
FIG. 29 is a schematic plan view of a part of a solid-state imaging apparatus according to the second modification of the third embodiment.

FIG. 29 illustrates a plan-view layout of the reference pixels $X_{R,k}$ and $X_{R,k+1}$ illustrated in FIG. 28. The reference pixels $X_{R,k}$ and $X_{R,k+1}$ in the same row have a plan-view layout with left/right line symmetry in FIG. 29. In other words, in the reference pixels $X_{R,k}$ and $X_{R,k+1}$ in the same row, the arrangement of components such as the floating diffusion, the reset transistor, the amplification transistor, and the select transistor has line symmetry.

The reference pixel $X_{R,k}$ is provided with a diffusion layer 70g for applying a substrate potential, a diffusion layer 71g that forms a photodiode, a gate electrode 81g of the transfer transistor, a common diffusion layer 72g that acts as a drain diffusion layer of a transfer transistor, the floating diffusion, and the source diffusion layer of the reset transistor, a gate electrode 82g of the reset transistor, a drain diffusion layer 73g of the reset transistor, a drain diffusion layer 74g of the select transistor, a gate electrode 83g of the select transistor, a common diffusion layer 75g that acts as the source diffusion layer of the select transistor and the drain diffusion layer of the amplification transistor, a gate electrode 84g of the amplification transistor, and a source diffusion layer 76g of the amplification transistor.

The reference pixel $X_{R,k+1}$, which is adjacent in the row direction to the reference pixel $X_{R,k}$, is provided with a diffusion layer 70h for applying a substrate potential, a diffusion layer 71h that forms a photodiode, a gate electrode 81h of the transfer transistor, a common diffusion layer 72h that acts as a drain diffusion layer of a transfer transistor, the floating diffusion, and the source diffusion layer of the reset transistor, a gate electrode 82h of the reset transistor, a drain diffusion layer 73g of the reset transistor, a drain diffusion layer 74h of the select transistor, a gate electrode 83h of the select transistor, a common diffusion layer 75h that acts as the source diffusion layer of the select transistor and the drain diffusion layer of the amplification transistor, a gate electrode 84h of the amplification transistor, and a source diffusion layer 76h of the amplification transistor. That is, the reference pixel $X_{R,k}$ and $X_{R,k+1}$ share the drain diffusion layer 73g of the reset transistor.

According to the solid-state imaging apparatus according to the second modification of the third embodiment, by having the reference pixels $X_{R,k}$ and $X_{R,k+1}$ adjacent to each other in the same row share a drain diffusion layer 73g of the reset transistor, the gate length of the reset transistor of each of the reference pixels $X_{R,k}$ and $X_{R,k+1}$ can be lengthened and the RTS noise can be improved, even at small pixel sizes.

<Third Modification of Third Embodiment>

A solid-state imaging apparatus according to a third modification of the third embodiment shares a common circuit configuration with the solid-state imaging apparatus according to the second modification of the third embodiment illustrated in FIG. 28. However, the plan-view layout of the reference pixels $X_{R,k}$ and $X_{R,k+1}$ differs from the solid-state imaging apparatus according to the second modification of the third embodiment illustrated in FIG. 29.

Figure 30A:
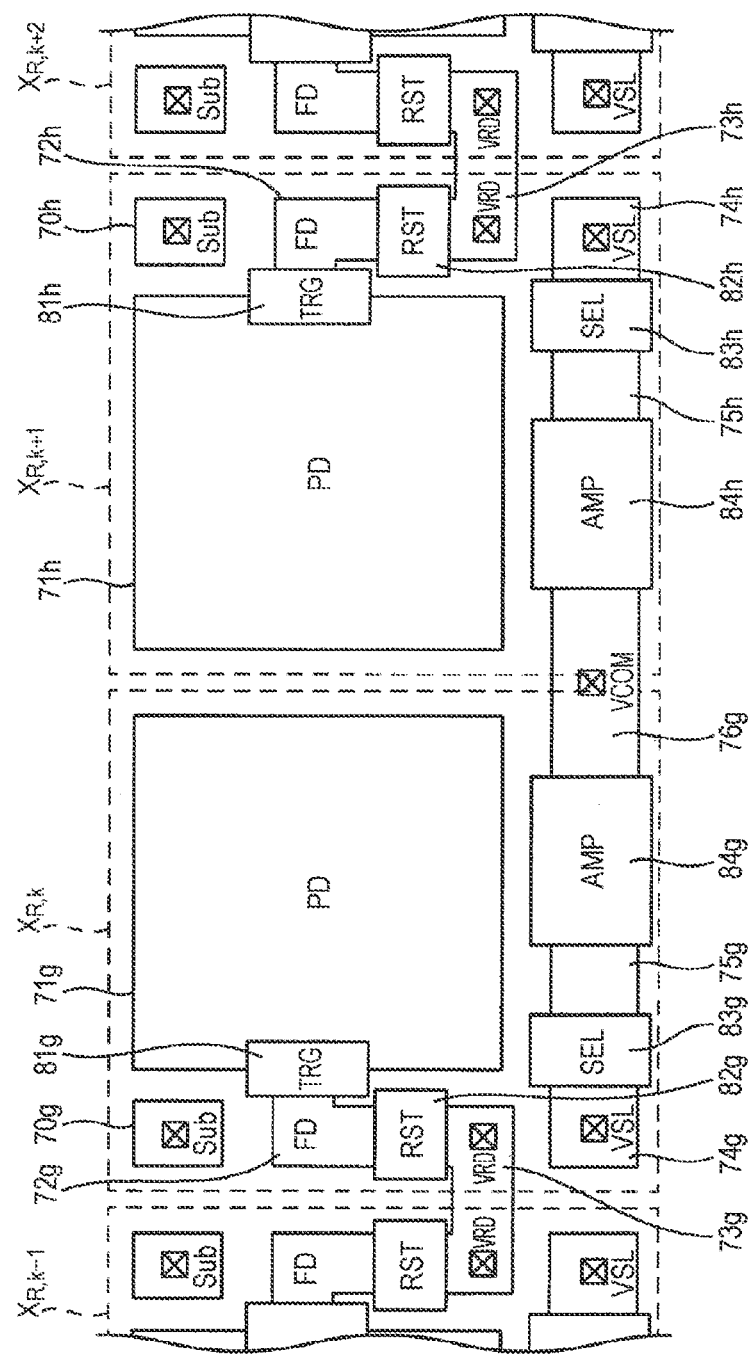
FIG. 30A is a schematic plan view of a part of a solid-state imaging apparatus according to a third modification of the third embodiment.

FIG. 30A illustrates a plan-view layout of the reference pixels $X_{R,k}$ and $X_{R,k+1}$ illustrated in FIG. 28. A reference pixel $X_{R,k-1}$ in the (k−1)th column is adjacent to the left of the reference pixel $X_{R,k}$, while a reference pixel $X_{R,k+2}$ in the (k+2)th column is adjacent to the right of the reference pixel $X_{R,k+1}$. The reference pixels $X_{R,k-1}$, $X_{R,k}$, $X_{R,k+1}$, and $X_{R,k+2}$ in the same row have a plan-view layout with left/right line symmetry in FIG. 30A. In other words, in the reference pixels $X_{R,k-1}$, $X_{R,k}$, $X_{R,k+1}$, and $X_{R,k+2}$ in the same row, the arrangement of components such as the floating diffusion, the reset transistor, the amplification transistor, and the select transistor has line symmetry.

The reference pixel $X_{R,k}$ is provided with a diffusion layer 70g for applying a substrate potential, a diffusion layer 71g that forms a photodiode, a gate electrode 81g of the transfer transistor, a common diffusion layer 72g that acts as a drain diffusion layer of a transfer transistor, the floating diffusion and the source diffusion layer of the reset transistor, a gate electrode 82g of the reset transistor, a drain diffusion layer 73g of the reset transistor, a drain diffusion layer 74g of the select transistor, a gate electrode 83g of the select transistor, a common diffusion layer 75g that acts as the source diffusion layer of the select transistor and the drain diffusion layer of the amplification transistor, a gate electrode 84g of the amplification transistor, and a source diffusion layer 76g of the amplification transistor. The reference pixel $X_{R,k}$ shares the drain diffusion layer 73g of the reset transistor together with the reference pixel $X_{R,k-1}$, which is adjacent in the row direction to the reference pixel $X_{R,k}$.

The reference pixel $X_{R,k+1}$, which is adjacent in the row direction to the reference pixel $X_{R,k}$, is provided with a diffusion layer 70h for applying a substrate potential, a diffusion layer 71h that forms a photodiode, a gate electrode 81h of the transfer transistor, a common diffusion layer 72h that acts as a drain diffusion layer of a transfer transistor, the floating diffusion, and the source diffusion layer of the reset transistor, a gate electrode 82h of the reset transistor, a drain diffusion layer 73h of the reset transistor, a drain diffusion layer 74h of the select transistor, a gate electrode 83h of the select transistor, a common diffusion layer 75h that acts as the source diffusion layer of the select transistor and the drain diffusion layer of the amplification transistor, a gate electrode 84h of the amplification transistor, and a source diffusion layer 76g of the amplification transistor. That is, the reference pixel $X_{R,k}$ and $X_{R,k+1}$ share the source diffusion layer 76g of the amplification transistor. Further, the reference pixel $X_{R,k+1}$ shares the drain diffusion layer 73h of the reset transistor, together with the reference pixel $X_{R,k+2}$, which is adjacent in the row direction to the reference pixel $X_{R,k+1}$.

Figure 30B:
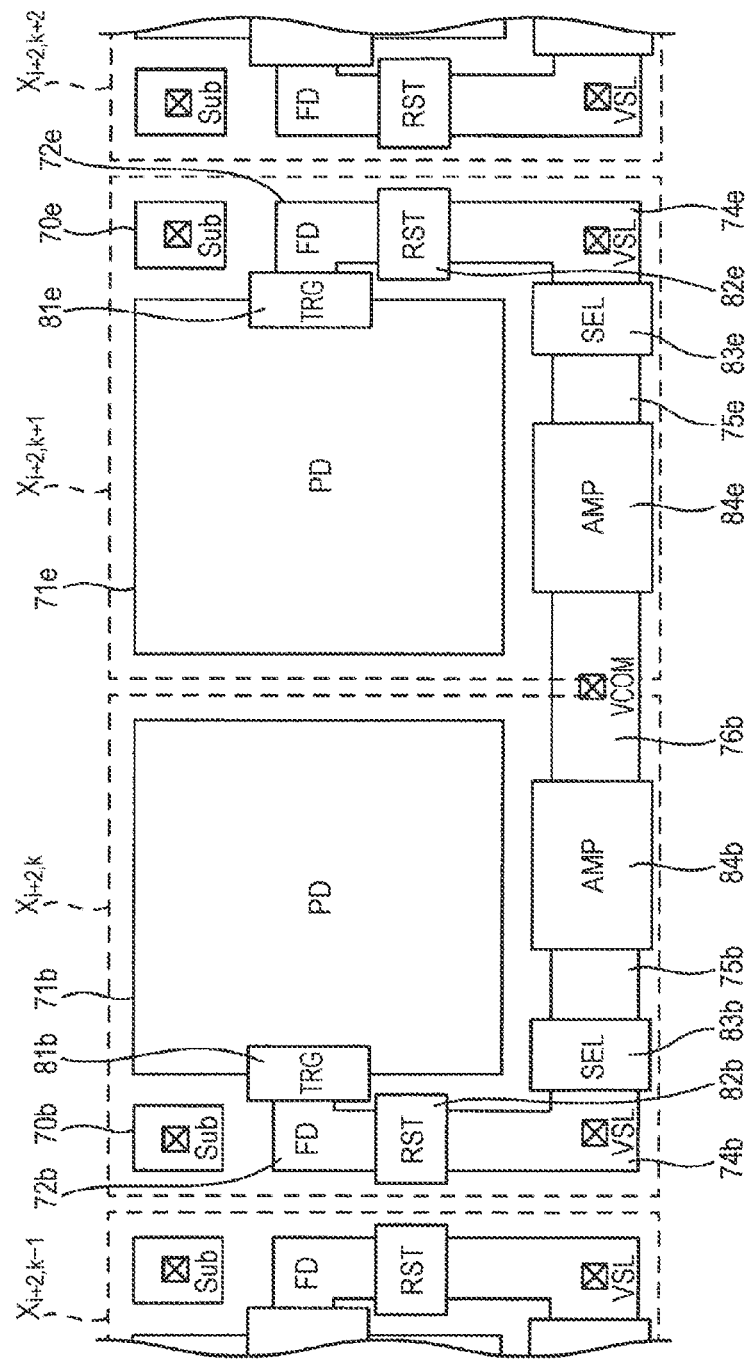
FIG. 30B is a schematic plan view of another part of a solid-state imaging apparatus according to the third modification of the third embodiment.

FIG. 30B illustrates a plan-view layout of the readout pixels $X_{i+2,k}$ and $X_{i+2,k+1}$ illustrated in FIG. 28. A readout pixel $X_{i+2,k-1}$ in the (k−1)th column is adjacent to the left of the readout pixel $X_{i+2,k}$, while a readout pixel $X_{i+2,k+2}$ in the (k+2)th column is adjacent to the right of the readout pixel $X_{i+2,k+1}$. The readout pixels $X_{i+2,k-1}$, $X_{i+2,k}$, $X_{i+2,k+1}$, and $X_{i+2,k+2}$ in the same row have a plan-view layout with left/right line symmetry in FIG. 30B. In other words, in the readout pixels $X_{i+2,k-1}$, $X_{i+2,k}$, $X_{i+2,k+1}$, and $X_{i+2,k+2}$ in the same row, the arrangement of components such as the floating diffusion, the reset transistor, the amplification transistor, and the select transistor has line symmetry.

The readout pixel $X_{i+2,k}$ is provided with a diffusion layer 70b for applying a substrate potential, a diffusion layer 71b that forms a photodiode, a gate electrode 81b of the transfer transistor, a common diffusion layer 72b that acts as a drain diffusion layer of a transfer transistor, the floating diffusion, and the source diffusion layer of the reset transistor, a gate electrode 82b of the reset transistor, a drain diffusion layer 73b of the reset transistor, a source diffusion layer 74b of the select transistor, a gate electrode 83b of the select transistor, a common diffusion layer 75b that acts as the source diffusion layer of the select transistor and the drain diffusion layer of the amplification transistor, a gate electrode 84b of the amplification transistor, and a source diffusion layer 76b of the amplification transistor.

Further, the readout pixel $X_{i+2,k+1}$, which is adjacent in the row direction to the pixel $X_{i+2,k}$, is provided with a diffusion layer 70e for applying a substrate potential, a diffusion layer 71e that forms a photodiode, a gate electrode 81e of the transfer transistor, a common diffusion layer 72e that acts as a drain diffusion layer of a transfer transistor, the floating diffusion, and the source diffusion layer of the reset transistor, a gate electrode 82e of the reset transistor, the common drain diffusion layer 74e that acts as the drain diffusion layer of the reset transistor and the select transistor of the select transistor, a gate electrode 83e of the select transistor, a common diffusion layer 75e that acts as the source diffusion layer of the select transistor and the drain diffusion layer of the amplification transistor, a gate electrode 84e of the amplification transistor, and a source diffusion layer 76b of the amplification transistor. In other words, in the same (i+2)th row, the readout pixels $X_{i+2,k}$ and $X_{i+2,k+1}$ that are adjacent to each other share the source diffusion layer 76b of the amplification transistor.

According to the solid-state imaging apparatus according to the third modification of the third embodiment, the adjacent reference pixels $X_{R,k-1}$, $X_{R,k}$, $X_{R,k+1}$, and $X_{R,k+2}$ in the same row share drain diffusion layers 73g and 73h of the reset transistor, and in addition, the reference pixels $X_{R,k}$ and $X_{R,k+1}$ share a source diffusion layer 76g of the amplification transistor. Furthermore, the readout pixels $X_{i+2,k}$ and $X_{i+2,k+1}$ adjacent to each other in the same row share the drain diffusion layer 73g of the reset transistor. With this arrangement, the gate lengths of the amplification transistor and the reset transistor of each of the reference pixels $X_{R,k-1}$, $X_{R,k}$, $X_{R,k+1}$, and $X_{R,k+2}$ as well as the readout pixels $X_{i+2,k}$ and $X_{i+2,k+1}$ can be lengthened and the RTS noise can be improved, even at small pixel sizes.

<Fourth Modification of Third Embodiment>

Like the solid-state imaging apparatus according to the modification of the second embodiment, a solid-state imaging apparatus according to a fourth modification of the third embodiment includes the pixel array unit 1 illustrated in FIG. 20. As illustrated in FIG. 20, in the kth column, the pixels $X_{i,k}$ and $X_{i+1,k}$ are selected as readout pixels while the reference pixel $X_{R,k}$ is fixed. In the (k+1)th column, the pixels $X_{i,k+1}$ and $X_{i+1,k+1}$ are selected as readout pixels while the reference pixel $X_{R,k+1}$ is fixed.

Figure 31:
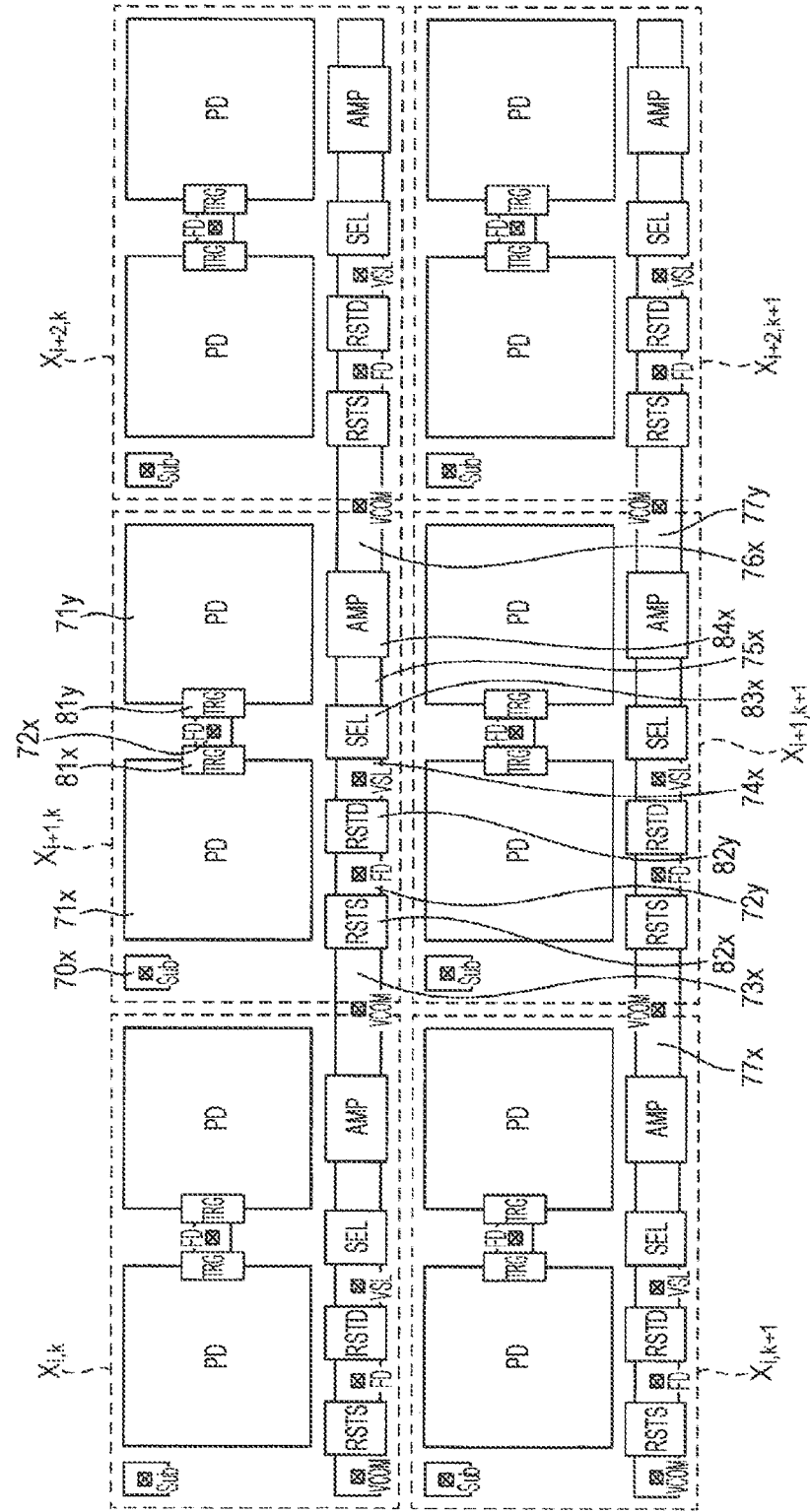
FIG. 31 is a schematic plan view of a part of a solid-state imaging apparatus according to a fourth modification of the third embodiment.

FIG. 31 illustrates a plan-view layout of the readout pixels $X_{i,k}$, $X_{i+1,k}$, $X_{i,k+1}$, and $X_{i+1,k+1}$ as well as the pixels (non-selected pixels) $X_{i+2,k}$ and $X_{i+2,k+1}$ not selected as readout pixels illustrated in FIG. 20. The top-and-bottom direction of FIG. 31 indicates the row direction of the pixel array unit 1, while the left-and-right direction of FIG. 31 indicates the column direction of the pixel array unit 1. The readout pixels $X_{i,k}$ and $X_{i+1,k}$ as well as the non-selected pixel $X_{i+2,k}$ in the same kth column and the readout pixels $X_{i,k+1}$ and $X_{i+1,k+1}$ as well as the non-selected pixel $X_{i+2,k+1}$ the same (k+1)th column have a plan-view layout with top/bottom line symmetry in FIG. 31. In other words, in the readout pixels $X_{i,k}$ and $X_{i+1,k}$ as well as the non-selected pixel $X_{i+2,k}$ in the same kth column and the readout pixels $X_{i,k+1}$ and $X_{i+1,k+1}$ as well as the non-selected pixel $X_{i+2,k+1}$ in the same (k+1)th column, the arrangement of components such as the floating diffusion, the reset transistor, the amplification transistor, and the select transistor has line symmetry.

The readout pixel $X_{i+1,k}$ in the (i+1)th row and the kth column is provided with a diffusion layer 70x for applying a substrate potential, diffusion layers 71x and 71y that form respective photodiodes, gate electrodes 81x and 81y of the transfer transistors, a diffusion layer 72x that forms a floating diffusion, a drain diffusion layer 73x of a source follower reset transistor, a gate electrode 82x of a source follower reset transistor, a common diffusion layer 72y that acts as a floating diffusion, the source diffusion layer of the source follower reset transistor, and the source diffusion layer of a differential amplification reset transistor, a gate electrode 82y of the differential amplification reset transistor, a common diffusion layer 74x that acts as the drain diffusion layer of the differential amplification reset transistor and the source diffusion layer of the select transistor, a gate electrode 83x of the select transistor, a common diffusion layer 75x that acts as the source diffusion layer of the select transistor and the drain diffusion layer of the amplification transistor, a gate electrode 84x of the amplification transistor, and a source diffusion layer 76x of the amplification transistor. Each of the other readout pixels $X_{i,k}$, $X_{i,k+1}$, and $X_{i+1,k+1}$ as well as the non-selected pixels $X_{i+2,k}$ and $X_{i+2,k+1}$ illustrated in FIG. 31 also has a configuration similar to the readout pixel $X_{i+1,k}$.

In the same kth column, the drain diffusion layer 73x of the source follower reset transistor of the readout pixel $X_{i,k}$ is a common diffusion layer shared with the source diffusion layer of the amplification transistor of the readout pixel $X_{i+1,k}$ adjacent to the readout pixel $X_{i,k}$. Also, the source diffusion layer 76x of the amplification transistor of the readout pixel $X_{i+1,k}$ is a common diffusion layer shared with the drain diffusion layer of the source follower reset transistor of the non-selected pixel $X_{i+2,k}$ adjacent to the readout pixel $X_{i+1,k}$.

In the same (k+1)th column, the drain diffusion layer 77x of the source follower reset transistor of the readout pixel $X_{i,k+1}$ is a common diffusion layer shared with the source diffusion layer of the amplification transistor of the readout pixel $X_{i+1,k+1}$ adjacent to the readout pixel $X_{i,k+1}$. Also, the source diffusion layer 77y of the amplification transistor of the readout pixel $X_{i+1,k+1}$ is a common diffusion layer shared with the drain diffusion layer of the source follower reset transistor of the non-selected pixel $X_{i+2,k+1}$ adjacent to the readout pixel $X_{i+1,k+1}$.

According to the solid-state imaging apparatus according to the fourth modification of the third embodiment, by having the readout pixels $X_{i,k}$, $X_{i+1,k}$, $X_{i,k+1}$, and $X_{i+1,k+1}$ as well as the non-selected pixels $X_{i+2,k}$ and $X_{i+2,k+1}$ adjacent to each other in the same columns share the diffusion layers 73x, 77x, 76x, and 77y, the gate lengths of the transistors sharing diffusion layers can be lengthened and the RTS noise can be improved, even at small pixel sizes.

Fourth Embodiment

As described above, there has been proposed a differential amplification CIS capable of increased gain and significantly higher conversion efficiency compared to a source follower CIS of the related art (see PTLs 1 and 2). However, in a differential amplification CIS, because the output resistance of the amplification transistor is large compared to a source follower CIS, the RC time constant of the vertical signal lines increases, and the readout speed becomes slower.

On the other hand, there is technology that speeds up the readout speed by including a sample and hold circuit as a peripheral circuit and causing the AD conversion period and the settling period of the vertical signal lines to overlap (see NPL 1). However, to keep the kTC noise of the sample and hold circuit down to a level that does not influence the image quality, it is necessary to use a large capacitance of several pF for example, and the chip size increases. Accordingly, a fourth embodiment provides a solid-state imaging apparatus capable of speeding up the readout speed while also suppressing an increase in the chip size.

<Configuration of Solid-State Imaging Apparatus>

The overall configuration of the solid-state imaging apparatus according to the fourth embodiment is shared in common with the solid-state imaging apparatus according to the first embodiment illustrated in FIG. 1. As illustrated in FIG. 32, in the solid-state imaging apparatus according to the fourth embodiment, the configuration of the pixel array unit 1 and the column readout circuit unit 3 is shared in common with the solid-state imaging apparatus according to the second embodiment illustrated in FIG. 14. However, as illustrated in FIG. 32, in the solid-state imaging apparatus according to the fourth embodiment, the configuration of the column signal processing unit 4 is different from the solid-state imaging apparatus according to the second embodiment illustrated in FIG. 14.

The column signal processing unit 4 includes two systems of sample and hold circuits 41 and 42 respectively connected to the output signal lines $VSL0_k$ and $VSL1_k$, and two analog-to-digital conversion units 43 and 44 respectively connected to the sample and hold circuits 41 and 42. The sample and hold circuits 41 and 42 successively sample the reset level and the signal level read out from the output signal lines $VSL0_k$ and $VSL1_k$, and successively output the sampled reset level and signal level to the analog-to-digital conversion units 43 and 44.

The sample and hold circuit 41 is provided with switches S31 and S32 connected in parallel with each other to the output signal line $VSL0_k$, capacitors C1 and C2 having one end respectively connected to the switches S31 and S32 and the other end grounded, and switches S33 and S34 respectively connected to one ends of the capacitors C1 and C2 and also connected in parallel with each other to the analog-to-digital conversion unit 43. The open or closed states of the switches S31, S32, S33, and S34 are controlled by control signals $\varphi P_{SMP}$, $\varphi D_{SMP}$, $\varphi P_{AD}$, and $\varphi D_{AD}$.

The sample and hold circuit 42 is provided with switches S35 and S36 connected in parallel with each other to the output signal line $VSL1_k$, capacitors C3 and C4 having one end grounded to the switches S35 and S36 and the other end grounded, and switches S37 and S38 respectively connected to one ends of the capacitors C3 and C4 and also connected in parallel with each other to the analog-to-digital conversion unit 44. The open or closed states of the switches S35, S36, S37, and S38 are controlled by control signals $\varphi P_{SMP}$, $\varphi D_{SMP}$, $\varphi P_{AD}$, and $\varphi D_{AD}$.

The analog-to-digital conversion unit 43 outputs an image signal by performing analog-to-digital (AD) conversion of the reset level and the signal level output from the sample and hold circuit 41. The analog-to-digital conversion unit 44 outputs an image signal by performing AD conversion of the reset level and the signal level output from the sample and hold circuit 42.

<Differential Amplification Readout Operation>

Next, the differential amplification readout operation by the solid-state imaging apparatus according to the fourth embodiment will be described with reference to the timing chart in FIG. 33. Herein, it is assumed that the reference pixel $X_{R,k}$ is fixed, and the pixels $X_{i-2,k}$, $X_{i-1,k}$, $X_{i,k}$, $X_{i+1,k}$, $X_{i+2,k}$, and $X_{i+3,k}$ are successively selected as readout pixels.

From a time t1 to t9, the select signal $SEL_R$ of the reference pixel $X_{R,k}$ is set to the H level. From the time t1 to t5, the select signals $SEL_i$ and $SEL_{i+1}$ of the pixels $X_{i,k}$ and $X_{i+1,k}$ are set to the H level, selecting the pixels $X_{i,k}$ and $X_{i+1,k}$ as readout pixels. From the time t1 to t2, the reset signals $RST_i$ and $RST_{i+1}$ of the readout pixels $X_{i,k}$ and $X_{i+1,k}$ are set to the H level, resetting the readout pixels $X_{i,k}$ and $X_{i+1,k}$. At the same time, a reset signal $RST_R$ of the reference pixel $X_{R,k}$ is set to the H level, resetting the reference pixel $X_{R,k}$. The output signal lines $VSL0_k$ and $VSL1_k$ go to the reset level of the readout pixels $X_{i,k}$ and $X_{i+1,k}$, and the P-phase level is read out.

From the time t1 to t3, the control signal $\varphi P_{SMP}$ is set to the H level to put the switches S31 and S35 in the closed state, while in addition, the control signal $\varphi P_{AD}$ is set to the L level to put the switches S33 and S37 in the open state, thereby causing the capacitors C1 and C3 to sample the P-phase levels of the readout pixels $X_{i,k}$ and $X_{i+1,k}$. At the same time, the control signal $\varphi D_{AD}$ is set to the H level to put the switches S34 and S38 in the closed state, while in addition, the control signal $\varphi D_{SMP}$ is set to the L level to put the switches S32 and S36 in the open state, thereby causing the capacitors C2 and C4 to respectively output the sampled D-phase levels of the readout pixels $X_{i-2,k}$ and $X_{i-1,k}$. In other words, the AD conversion period of the D-phase levels of the previous readout pixels $X_{i-2,k}$ and $X_{i-1,k}$ is made to overlap with the sampling period (settling period) of the P-phase levels of the readout pixels $X_{i,k}$ and $X_{i+1,k}$. The analog-to-digital conversion units 43 and 44 perform AD conversion of the D-phase levels of the readout pixels $X_{i-2,k}$ and $X_{i-1,k}$, and output image signals.

From the time t3 to t4, the transfer signals $TRG_i$ and $TRG_{i+1}$ of the readout pixels $X_{i,k}$ and $X_{i+1,k}$ are set to the H level, the P-phase levels of the output signal lines $VSL0_k$ and $VSL1_k$ are inverted and amplified, and after that, the D-phase levels of the readout pixels $X_{i,k}$ and $X_{i+1,k}$ are read out.

From the time t3 to t5, the control signal $\varphi D_{SMP}$ is set to the H level to put the switches S32 and S36 in the closed state, while in addition, the control signal $\varphi D_{AD}$ is set to the L level to put the switches S34 and S38 in the open state, thereby causing the capacitors C1 and C3 to sample the D-phase levels of the readout pixels $X_{i,k}$ and $X_{i+1,k}$. At the same time, the control signal $\varphi P_{AD}$ is set to the H level to put the switches S33 and S37 in the closed state, while in addition, the control signal $\varphi P_{SMP}$ is set to the L level to set the switches S31 and S35 in the open state, thereby causing the capacitors C1 and C3 to respectively output the sampled P-phase levels of the readout pixels $X_{i,k}$ and $X_{i+1,k}$. In other words, the AD conversion period of the P-phase levels of the previous readout pixels $X_{i,k}$ and $X_{i+1,k}$ is made to overlap with the sampling period (settling period) of the D-phase levels of the readout pixels $X_{i,k}$ and $X_{i+1,k}$. The analog-to-digital conversion units 43 and 44 perform AD conversion of the P-phase levels of the readout pixels $X_{i,k}$ and $X_{i+1,k}$, and output image signals.

From the time t5 to t9, the select signals $SEL_{i+2}$ and $SEL_{i+3}$ of the pixels $X_{i+2,k}$ and $X_{i+3,k}$ are set to the H level, selecting the pixels $X_{i+2,k}$ and $X_{i+3,k}$ as readout pixels. From the time t5 to t6, the reset signals $RST_{i+2}$ and $RST_{i+3}$ of the readout pixels $X_{i+2,k}$ and $X_{i+3,k}$ are set to the H level, resetting the readout pixels $X_{i+2,k}$ and $X_{i+3,k}$. At the same time, a reset signal $RST_R$ of the reference pixel $X_{R,k}$ is set to the H level, resetting the reference pixel $X_{R,k}$. The output signal lines $VSL0_k$ and $VSL1_k$ go to the reset level of the pixels $X_{i+2,k}$ and $X_{i+3,k}$, and the P-phase level is read out.

From the time t5 to t7, the control signal $\varphi P_{SMP}$ is set to the H level to put the switches S31 and S35 in the closed state, while in addition, the control signal $\varphi P_{AD}$ is set to the L level to put the switches S33 and S37 in the open state, thereby causing the capacitors C1 and C3 to sample the P-phase levels of the pixels $X_{i+2,k}$ and $X_{i+3,k}$. At the same time, the control signal $\varphi D_{AD}$ is set to the H level to put the switches S34 and S38 in the closed state, while in addition, the control signal $\varphi D_{SMP}$ is set to the L level to set the switches S32 and S36 in the open state, thereby causing the capacitors C2 and C4 to respectively output the sampled D-phase levels of the readout pixels $X_{i,k}$ and $X_{i+1,k}$. In other words, the AD conversion period of the D--phase levels of the previous readout pixels $X_{i,k}$ and $X_{i+1,k}$ is made to overlap with the sampling period (settling period) of the P-phase levels of the readout pixels $X_{i+2,k}$ and $X_{i+3,k}$. The analog-to-digital conversion units 43 and 44 perform AD conversion of the D-phase levels of the readout pixels $X_{i,k}$ and $X_{i+1,k}$, and output image signals.

From the time t7 to t8, the transfer signals $TRG_{i+2}$ and $TRG_{i+3}$ of the readout pixels $X_{i+2,k}$ and $X_{i+3,k}$ are set to the H level, the P-phase level of the output signal lines $VSL0_k$ and $VSL1_k$ is inverted and amplified, and the D-phase level is read out.

From the time t7 to t9, the control signal $\varphi D_{SMP}$ is set to the H level to put the switches S32 and S36 in the closed state, while in addition, the control signal $\varphi D_{AD}$ is set to the L level to put the switches S34 and S38 in the open state, thereby causing the capacitors C1 and C3 to sample the D-phase levels of the readout pixels $X_{i+2,k}$ and $X_{i+3,k}$. At the same time, the control signal $\varphi P_{AD}$ is set to the H level to put the switches S33 and S37 in the closed state, while in addition, the control signal $\varphi P_{SMP}$ is set to the L level to set the switches S31 and S35 in the open state, thereby causing the capacitors C1 and C3 to respectively output the sampled P-phase levels of the readout pixels $X_{i,k}$ and $X_{i+1,k}$. In other words, the AD conversion period of the P-phase levels of the previous readout pixels $X_{i,k}$ and $X_{i+1,k}$ is made to overlap with the sampling period (settling period) of the D-phase levels of the readout pixels and $X_{i+2,k}$ and $X_{i+3,k}$. The analog-to-digital conversion units 43 and 44 perform AD conversion of the P-phase levels of the readout pixels $X_{i,k}$ and $X_{i+1,k}$, and output image signals.

According to the solid-state imaging apparatus according to the fourth embodiment, by including two or more systems of sample and hold circuits 41 and 42 per line of the output signal lines $VSL0_k$ and $VSL1_k$, it is possible to achieve both fast and low-noise readout while also keeping the sample and hold circuits 41 and 42 to approximately 1/10 the size compared to the configuration of NPL 1. Note that although the fourth embodiment illustrates an example of a case where two systems of the sample and hold circuits 41 and 42 are included, it is sufficient to have two or more systems of sample and hold circuits. For example, if four or eight systems of sample and hold circuits are configured, an even greater speedup may be attained.

Fifth Embodiment

As described above, there has been proposed a differential amplification CIS capable of increased gain and significantly higher conversion efficiency compared to a source follower CIS of the related art. However, a differential amplification CIS has the problems of large inconsistencies in conversion efficiency and slow settling as well as a narrow readout signal range. These problems are primarily caused by inconsistencies in the parasitic capacitance between the gate and drain of the amplification transistors, the output resistance of the select transistor and the amplification transistor, and the high conversion efficiency. Accordingly, a fifth embodiment provides a solid-state imaging apparatus capable of reducing inconsistencies in the conversion efficiency, speeding up settling, and widening the readout signal range.

<Configuration of Solid-State Imaging Apparatus>

The overall configuration of the solid-state imaging apparatus according to the fifth embodiment is shared in common with the solid-state imaging apparatus according to the first embodiment illustrated in FIG. 1. As illustrated in FIG. 34, in a solid-state imaging apparatus according to the fifth embodiment, the configuration of the pixel array unit 1 is different from the solid-state imaging apparatus according to the first embodiment illustrated in FIG. 2.

The pixel array unit 1 includes a plurality of pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$. The configuration of each of the pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ is basically similar to the configuration of the pixel $X_{i,k}$ illustrated in FIG. 2. The sources of the respective amplification transistors of the pixels $X_{i,k}$, $X_{i+1,k}$, $X_{i+2,k}$, and $X_{i+3,k}$ in the kth column and the sources of the respective amplification transistors of the pixels $X_{i,k+1}$, $X_{i+1,k+1}$, $X_{i+2,k+1}$, and $X_{i+3,k+1}$ in the (k+1)th column are connected to a common current supply line $VCOM_k$. The drains of the respective select transistors of the pixels $X_{i,k}$, $X_{i+1,k}$, $X_{i+2,k}$, and $X_{i+3,k}$ in the kth column are connected to a common output signal line $VSL0_k$. The drains of the respective select transistors of the pixels $X_{i,k+1}$, $X_{i+1,k+1}$, $X_{i+2,k+1}$, and $X_{i+3,k+1}$ in the (k+1)th column are connected to a common output signal line $VSL1_k$.

The pixel array unit 1 is provided with switches $S41_i$, $S41_{i+1}$, $S41_{i+2}$, and $S41_{i+3}$ that short the floating diffusions of the pixels $X_{i,k}$, $X_{i+1,k}$, $X_{i+2,k}$, and $X_{i+3,k}$ in the kth column and switches $S42_i$, $S42_{i+1}$, $S42_{i+2}$, and $S42_{i+3}$ that short the floating diffusions of the pixels $X_{i,k+1}$, $X_{i+1,k+1}$, $X_{i+2,k+1}$, and $X_{i+3,k+1}$ in the (k+1)th column in units of pixel cells.

The on-off state of the switches $S41_i$ and $S42_i$ in the same ith row is controlled by a control signal $FDL_i$. The on-off state of the switches $S41_{i+1}$ and $S42_{i+1}$ in the same (i+1)th row is controlled by a control signal $FDL_{i+1}$. The on-off state of the switches $S41_{i+2}$ and $S42_{i+2}$ in the same (i+2)th row is controlled by a control signal $FDL_{i+2}$. The on-off state of the switches $S41_{i+3}$ and $S42_{i+3}$ in the same (i+3)th row is controlled by a control signal $FDL_{i+3}$.

In the pixel array unit 1, the pixel $X_{i,k}$ in the ith row of the kth column is selected as the reference pixel, while the pixel $X_{i,k+1}$ in the ith row of the (k+1)th column is selected as the readout pixel. The respective select transistors of the readout pixel $X_{i,k+1}$ and the reference pixel $X_{i,k}$ are turned on. On the other hand, the respective select transistors of the pixels (non-selected pixels) $X_{i+1,k}$, $X_{i+2,k}$, $X_{i+3,k}$, $X_{i+1,k+1}$, $X_{i+2,k+1}$, and $X_{i+3,k+1}$ not selected as a readout pixel or a reference pixel are not turned on.

The switch $S41_i$ between the reference pixel $X_{i,k}$ in the kth column and the non-selected pixel $X_{i+1,k}$ adjacent to the reference pixel $X_{i,k}$ in the column direction is turned off, shorting the floating diffusion of the reference pixel $X_{i,k}$ and the floating diffusion of the non-selected pixel $X_{i+1,k}$. On the other hand, the switches $S41_{i+1}$, $S41_{i+2}$, and $S41_{i+3}$ between the non-selected pixels $X_{i+1,k}$, $X_{i+2,k}$, and $X_{i+3,k}$ in the kth column are turned on.

The switch $S42_i$ between the readout pixel $X_{i,k+1}$ in the (k+1)th column and the non-selected pixel $X_{i+1,k+1}$ adjacent to the readout pixel $X_{i,k+1}$ in the column direction is turned off, shorting the floating diffusion of the readout pixel $X_{i,k}$ and the floating diffusion of the non-selected pixel $X_{i+1,k+1}$. On the other hand, the switches $S42_{i+1}$, $S42_{i+2}$, and $S42_{i+3}$ between the non-selected pixels $X_{i+1,k+1}$, $X_{i+2,k+1}$, and $X_{i+3,k+1}$ in the (k+1)th column are turned on.

Note that although the fifth embodiment illustrates an example of a case where only the switches $S41_i$ and $S42_i$ are turned off, the switches $S41_{i+1}$, $S41_{i+2}$, $S41_{i+3}$, $S42_{i+1}$, $S42_{i+2}$, and $S42_{i+3}$ may also be turned off to join additional floating diffusions.

Herein, the output resistance R of the select transistor and the amplification transistor in a certain pixel is expressed by the following Formula (1).

$$R = R_{VSL} + R_{AMPTr} + R_{SELTr} \tag{1}$$

In Formula (1), $R_{VSL}$ is the line resistance, $R_{AMPTr}$ is the output resistance of the amplification transistor, and $R_{SELTr}$ is the output resistance of the select transistor.

Also, the conversion efficiency η is expressed by the following Formula (2).

[Math. 1]

$$\eta = \frac{e}{\frac{C_{FD\_total}}{Av} + C_{FD\_VSL} + C_{gd}} \tag{2}$$

In Formula (2), $C_{FD\_total}$ is the total amount of the floating diffusion capacitance, Av is the average value of the floating diffusion capacitance, $C_{FD\_VSL}$ is the line parasitic capacitance, and $C_{gd}$ is the parasitic capacitance between the gate and the drain of the amplification transistor. The inconsistencies in the parasitic capacitance $C_{gd}$ of the amplification transistor are relatively larger than the inconsistencies in the line parasitic capacitance $C_{FD\_VSL}$. Also, the higher the conversion efficiency η, the narrower the signal readout range becomes.

In contrast, according to the solid-state imaging apparatus according to the fifth embodiment, by using the switch $S41_i$ to short the floating diffusion of the reference pixel $X_{i,k}$ and the floating diffusion of the non-selected pixel $X_{i+1,k}$ and additionally using the switch $S42_i$ to short the floating diffusion of the readout pixel $X_{i,k}$ and the floating diffusion of the non-selected pixel $X_{i+1,k+1}$, the total amount of the floating diffusion capacitance $C_{FD\_total}$ indicated in Formula (1) is doubled, and the conversion efficiency η can be lowered. Consequently, the signal readout range can be widened.

Note that in the pixel array unit 1 of the solid-state imaging apparatus according to the fifth embodiment, the floating diffusions of the pixels $X_{i,k}$, $X_{i+1,k}$, $X_{i+2,k}$, and $X_{i+3,k}$ in the kth column may be shorted without including the switches $S41_i$, $S41_{i+1}$, $S41_{i+2}$, and $S41_{i+3}$ that join the floating diffusions of a plurality of pixels disposed in the same column, and the floating diffusions of the pixels $X_{i,k+1}$, $X_{i+1,k+1}$, and $X_{i+3,k+1}$ in the (k+1)th column may be shorted without including the switches $S42_i$, $S42_{i+1}$, $S42_{i+2}$, and $S42_{i+3}$. In other words, the floating diffusion capacitance can be shared and the conversion efficiency can be lowered without performing the switching by the switches $S41_i$, $S41_{i+1}$, $S41_{i+2}$, $S41_{i+3}$, $S42_i$, $S42_{i+1}$, $S42_{i+2}$, and $S42_{i+3}$. Consequently, the signal readout range can be widened.

<First Modification of Fifth Embodiment>

As illustrated in FIG. 35, in a solid-state imaging apparatus according to a first modification of the fifth embodiment, the configuration of the pixel array unit 1 and the column readout circuit unit 3 is shared in common with the solid-state imaging apparatus according to the fifth embodiment illustrated in FIG. 34.

However, the solid-state imaging apparatus according to the first modification of the fifth embodiment differs from the solid-state imaging apparatus according to the fifth embodiment illustrated in FIG. 34 in that the select transistor of the pixel $X_{i+1,k}$ whose floating diffusion is shorted with the floating diffusion of the reference pixel $X_{i,k}$ is turned on, and in addition, the select transistor of the pixel $X_{i+1,k+1}$ whose floating diffusion is shorted with the floating diffusion of the readout pixel $X_{i,k}$ is turned on.

Note that although the first modification of the fifth embodiment illustrates an example of a case where only the switches $S41_i$ and $S42_i$ are turned off, the switches $S41_{i+1}$, $S41_{i+2}$, $S41_{i+3}$, $S42_{i+1}$, $S42_{i+2}$, and $S42_{i+3}$ may also be turned off to join three or more floating diffusions. Furthermore, the select transistors of two or more pixels whose floating diffusions are shorted with the floating diffusion of the reference pixel $X_{i,k}$ may be turned on, and in addition, the select transistors of two or more pixels whose floating diffusions are shorted with the floating diffusion of the readout pixel $X_{i,k}$ may be turned on.

According to the solid-state imaging apparatus according to the first modification of the fifth embodiment, by using the switch $S41_i$ to short the floating diffusion of the reference pixel $X_{i,k}$ and the floating diffusion of the non-selected pixel $X_{i+1,k}$ and additionally using the switch $S42_i$ to short the floating diffusion of the readout pixel $X_{i,k}$ and the floating diffusion of the non-selected pixel $X_{i+1,k+1}$, the floating diffusion capacitance can be increased, and the conversion efficiency can be lowered. Consequently, the signal readout range can be widened.

Furthermore, by turning on the select transistor of the pixel $X_{i+1,k}$ whose floating diffusion is shorted with the floating diffusion of the reference pixel $X_{i,k}$ and additionally turning on the select transistor of the pixel $X_{i+1,k+1}$ whose floating diffusion is shorted with the floating diffusion of the readout pixel $X_{i,k}$, a parallel readout from multiple (two) rows of readout pixels $X_{i,k}$ and $X_{i+1,k+1}$ can be performed.

As illustrated in FIG. 36A, in the case where the parasitic capacitances C11 and C12 of two amplification transistors are connected in parallel, if $C_{gd0}$ is taken to be a reference value of the parasitic capacitances C11 and C12 of the amplification transistors, the respective values of the parasitic capacitances C11 and C12 of the amplification transistors become $C_{gd0} + \Delta C_{gd0}$. On the other hand, as illustrated in FIG. 36B, the value of the parasitic capacitance C13 of a single amplification transistor becomes $2C_{gd0} + \sqrt{2}\Delta C_{gd0}$.

Herein, the inconsistency $\Delta C_{gd}/C_{gd}$ in the parasitic capacitance $C_{gd}$ of the amplification transistors in the case of performing a parallel readout of N rows (where N is an integer equal to or greater than 2) is expressed by the following Formula (3).

[Math. 2]

$$\frac{\Delta C_{gd}}{C_{gd}} = \frac{\sqrt{N}\Delta C_{gd0}}{NC_{gd0}} = \frac{\Delta C_{gd0}}{\sqrt{N}C_{gd0}} \tag{3}$$

In other words, by performing a parallel readout of N rows, the inconsistency $\Delta C_{gd}/C_{gd}$ in the parasitic capacitance $C_{gd}$ between the gate and the drain is multiplied by $1/\sqrt{N}$, and the inconsistency in the conversion efficiency η is reduced.

Also, in the case of performing a parallel readout of N rows, the output resistance R of the select transistor and the amplification transistor is expressed by the following Formula (4).

$$R = R_{VSL} + 1/N(R_{AMPTr} + R_{SELTr}) \tag{4}$$

In other words, in the case of a parallel readout of N rows, compared to the case of not performing the parallel readout indicated in Formula (4), the output resistance $R_{AMPT}$ of the amplification transistor and the output resistance $R_{SELT}$ of the select transistor are multiplied by 1/N, and the readout speed is improved.

Also, the photodiode area loss due to the addition of the switches $S41_i$ and $S41_{i+1}$ is less than the photodiode area loss in the case of doubling the gate width of the amplification transistor.

<Second Modification of Fifth Embodiment>

As illustrated in FIG. 37, in a solid-state imaging apparatus according to a second modification of the fifth embodiment, the configuration of the pixel array unit 1 and the column readout circuit unit 3 is shared in common with the solid-state imaging apparatus according to the first modification of the fifth embodiment illustrated in FIG. 35.

However, the solid-state imaging apparatus according to the second modification of the fifth embodiment differs from the solid-state imaging apparatus according to the first modification of the fifth embodiment illustrated in FIG. 35 in that in the pixel array unit 1, the number of shorts of the floating diffusions of the pixels $X_{i,k}$, $X_{i+1,k}$, $X_{i+2,k}$, $X_{i,k+1}$, $X_{i+1,k+1}$, and $X_{i+2,k+1}$ by the switches $S41_i$, $S41_{i+1}$, $S42_i$, and $S42_{i+1}$ is increased to three. The switches $S41_i$ and $S41_{i+1}$ are turned off, shorting the floating diffusions of the reference pixel $X_{i,k}$ and the pixels $X_{i+1,k}$ and $X_{i+2,k}$ adjacent to the reference pixel $X_{i,k}$ in the kth column. Also, the switches $S42_i$ and $S42_{i+1}$ are turned off, shorting the floating diffusions of the readout pixel $X_{i,k+1}$ and the pixels $X_{i+1,k+1}$ and $X_{i+2,k+1}$ adjacent to the readout pixel $X_{i,k+1}$ in the (k+1)th column. Note that the switches $S41_{i+2}$, $S41_{i+3}$, $S42_{i+2}$, and $S42_{i+3}$ may also be turned off to increase the number of shorts of the floating diffusions of the pixels $X_{i,k}$, $X_{i+1,k}$, $X_{i+2,k}$, $X_{i+3,k}$, $X_{i,k+1}$, $X_{i+1,k+1}$, $X_{i+2,k+1}$, and $X_{i+3,k+1}$ to four or more.

In addition, the respective select transistors of the pixels $X_{i+1,k}$ and $X_{i+2,k}$ adjacent to the reference pixel $X_{i,k}$ are also turned on, while in addition, the respective select transistors of the pixels $X_{i+1,k+1}$ and $X_{i+2,k+1}$ adjacent to the readout pixel $X_{i,k+1}$ are also turned on. The rest of the configuration of the solid-state imaging apparatus according to the second modification of the fifth embodiment is similar to the solid-state imaging apparatus according to the first modification of the fifth embodiment illustrated in FIG. 35, and therefore a duplicate description will be omitted.

According to the solid-state imaging apparatus according to the second modification of the fifth embodiment, by increasing the number of shorts of the floating diffusions of the pixels $X_{i,k}$, $X_{i+1,k}$, $X_{i+2,k}$, $X_{i,k+1}$, $X_{i+1,k+1}$, and $X_{i+2,k+1}$ by the switches $S41_i$, $S41_{i+1}$, $S42_i$, and $S42_{i+1}$ to three or more, the floating diffusion capacitance can be increased further, and the conversion efficiency can be lowered further. As a result, the signal readout range can be widened further.

<Third Modification of Fifth Embodiment>

As illustrated in FIG. 38, a solid-state imaging apparatus according to a third modification of the fifth embodiment shares a point in common with the solid-state imaging apparatus according to the fifth embodiment illustrated in FIG. 34, namely that the pixel array unit 1 includes a plurality of pixels $X_{i,k}$, $X_{i+1,k}$, $X_{i+2,k}$, $X_{i+3,k}$, $X_{i+4,k}$, and $X_{i+5,k}$, and additionally includes switches $S41_i$, $S41_{i+1}$, $S41_{i+2}$, $S41_{i+3}$, $S41_{i+4}$, and $S41_{i+5}$.

However, the solid-state imaging apparatus according to the third modification of the fifth embodiment differs from the solid-state imaging apparatus according to the fifth embodiment illustrated in FIG. 35 in that in the same kth column, the pixels $X_{i,k}$ and $X_{i+2,k}$ are selected as readout pixels while the pixel $X_{i+4,k}$ is selected as the reference pixel.

The readout pixel $X_{i,k}$ and the non-selected pixel $X_{i+1,k}$ share a reset input line $VRD1_k$, $VSL1_k$, and $VCOM_k$. The readout pixel $X_{i+2,k}$ and the non-selected pixel $X_{i+3,k}$ share a reset input line $VRD2_k$, $VSL2_k$, and $VCOM_k$. The reference pixel $X_{i+4,k}$ and the non-selected pixel $X_{i+5,k}$ share a reset input line $VRD0_k$, $VSL0_k$, and $VCOM_k$.

The switch $S41_i$ is turned off, shorting the floating diffusion of the readout pixel $X_{i,k}$ and the floating diffusion of the non-selected pixel $X_{i+1,k}$. The switch $S41_{i+2}$ is turned off, shorting the floating diffusion of the readout pixel $X_{i+2,k}$ and the floating diffusion of the non-selected pixel $X_{i+3,k}$. The switch $S41_{i+4}$ is turned off, shorting the floating diffusion of the readout pixel $X_{i+4,k}$ and the floating diffusion of the non-selected pixel $X_{i+5,k}$. The rest of the configuration of the solid-state imaging apparatus according to the third modification of the fifth embodiment is similar to the solid-state imaging apparatus according to the fifth embodiment illustrated in FIG. 34, and therefore a duplicate description will be omitted.

According to the solid-state imaging apparatus according to the third modification of the fifth embodiment, in the same kth column, even in the case where the pixels $X_{i,k}$ and $X_{i+2,k}$ are selected as the readout pixels and the pixel $X_{i+4,k}$ is selected as the reference pixel, by using the switch $S41_{i+4}$ to short the floating diffusion of the reference pixel $X_{i+4,k}$ and the floating diffusion of the non-selected pixel $X_{i+5,k}$, using the switch $S41_i$ to short the floating diffusion of the readout pixel $X_{i,k}$ and the floating diffusion of the non-selected pixel $X_{i+1,k}$, and using the switch $S41_{i+2}$ to short the floating diffusion of the readout pixel $X_{i+2,k}$ and the floating diffusion of the non-selected pixel $X_{i+3,k}$, the floating diffusion capacitance can be increased, and the conversion efficiency can be lowered. Consequently, the signal readout range can be widened.

<Fourth Modification of Fifth Embodiment>

As illustrated in FIG. 39, a solid-state imaging apparatus according to a fourth modification of the fifth embodiment shares a point in common with the solid-state imaging apparatus according to the third modification of the fifth embodiment illustrated in FIG. 38, namely that the pixel array unit 1 includes a plurality of pixels $X_{i,k}$, $X_{i+1,k}$, $X_{i+2,k}$, $X_{i+3,k}$, $X_{i+4,k}$, and $X_{i+5,k}$, and additionally includes switches $S41_i$, $S41_{i+1}$, $S41_{i+2}$, $S41_{i+3}$, $S41_{i+4}$, and $S41_{i+5}$.

However, the solid-state imaging apparatus according to the fourth modification of the fifth embodiment differs from the solid-state imaging apparatus according to the third modification of the fifth embodiment illustrated in FIG. 38 in that the switches $S41_i$, $S41_{i+1}$, $S41_{i+2}$, $S41_{i+3}$, $S41_{i+4}$, and $S41_{i+5}$ connect the floating diffusions of the pixels $X_{i,k}$, $X_{i+1,k}$, $X_{i+2,k}$, $X_{i+3,k}$, $X_{i+4,k}$, and $X_{i+5,k}$ not adjacent in the same column.

In the same kth column, the pixel $X_{i,k}$ is selected as the reference pixel while the pixels $X_{i+1,k}$ and $X_{i+2,k}$ are selected as readout pixels. The switch $S41_i$ is connected between the floating diffusion of the reference pixel $X_{i,k}$ and the floating diffusion of the non-selected pixel $X_{i+3,k}$, and is also connected to the switch $S41_{i+3}$. The switch $S41_{i+1}$ is connected between the floating diffusion of the readout pixel $X_{i+1,k}$ and the floating diffusion of the non-selected pixel $X_{i+4,k}$, and is also connected to the switch $S41_{i+4}$. The switch $S41_{i+2}$ is connected between the floating diffusion of the readout pixel $X_{i+2,k}$ and the floating diffusion of the non-selected pixel $X_{i+5,k}$, and is also connected to the switch $S41_{i+5}$. The rest of the configuration of the solid-state imaging apparatus according to the fourth modification of the fifth embodiment is similar to the solid-state imaging apparatus according to the third modification of the fifth embodiment illustrated in FIG. 38, and therefore a duplicate description will be omitted.

According to the solid-state imaging apparatus according to the fourth modification of the fifth embodiment, even in the case where the switches $S41_i$, $S41_{i+1}$, $S41_{i+2}$, $S41_{i+3}$, $S41_{i+4}$, and $S41_{i+5}$ connect the floating diffusions of the pixels $X_{i,k}$, $X_{i+1,k}$, $X_{i+2,k}$, $X_{i+3,k}$, $X_{i+4,k}$, and $X_{i+5,k}$ distanced from each other and not adjacent in the same column, the floating diffusion capacitance can be increased, and the conversion efficiency can be lowered. Consequently, the signal readout range can be widened.

<Fifth Modification of Fifth Embodiment>

As illustrated in FIG. 40, a solid-state imaging apparatus according to a fifth modification of the fifth embodiment shares a point in common with the solid-state imaging apparatus according to the fifth embodiment illustrated in FIG. 34, namely that the pixel array unit 1 includes a plurality of pixels $X_{i,k}$, $X_{i+1,k}$, $X_{i+2,k}$, and $X_{i+3,k}$, and additionally includes switches $S41_i$, $S41_{i+1}$, $S41_{i+2}$, and $S41_{i+3}$.

However, as illustrated in FIG. 40, the solid-state imaging apparatus according to the fifth modification of the fifth embodiment differs from the solid-state imaging apparatus according to the fifth embodiment illustrated in FIG. 34 in that the pixel array unit 1 includes the reference pixel region 1b fixed discretely from the readout pixel region 1a. The reference pixel region 1b is disposed in the row positioned at the edge of the pixel array unit 1, or in other words, on the side of the pixel array unit 1 closest to the column readout circuit unit 3.

Among the pixels $X_{i,k}$, $X_{i+1,k}$, $X_{i+2,k}$, and $X_{i+3,k}$ included in the readout pixel region 1a, the pixels $X_{i,k}$ and $X_{i+2,k}$ are selected as readout pixels while the pixels $X_{i+1,k}$ and $X_{i+3,k}$ are non-selected pixels. The pixel array unit 1 includes switches $S41_i$, $S41_{i+1}$, $S41_{i+2}$, and $S41_{i+3}$ that join the respective floating diffusions of the readout pixels $X_{i,k}$ and $X_{i+2,k}$ as well as the non-selected pixels $X_{i+1,k}$ and $X_{i+3,k}$ in the readout pixel region 1a. The switch $S41_i$ is turned off, connecting the floating diffusion of the readout pixel $X_{i,k}$ and the floating diffusion of the non-selected pixel $X_{i+1,k}$. The switch $S41_{i+2}$ is turned off, connecting the floating diffusion of the readout pixel $X_{i+2,k}$ and the floating diffusion of the non-selected pixel $X_{i+3,k}$.

The reference pixel region 1b includes a plurality of pixels $X_{R,k}$ and $X_{R+1,k}$ arranged in the Rth and (R+1)th rows. Note that the reference pixel region 1b may also include a plurality of pixels arranged in three or more rows. Of the pixels $X_{R,k}$ and $X_{R+1,k}$ included in the reference pixel region 1b, the pixel $X_{R,k}$ in the Rth row is selected as the reference pixel, and the pixel $X_{R+1,k}$ is a non-selected pixel.

The pixel array unit 1 includes switches $S41_R$ and $S41_{R+1}$ that join the respective floating diffusions of the reference pixel $X_{R,k}$ and the non-selected pixel $X_{R+1,k}$ of the reference pixel region 1b. The switch $S41_R$ is turned off, connecting the floating diffusion of the reference pixel $X_{R,k}$ and the floating diffusion of the non-selected pixel $X_{R+1,k}$. The rest of the configuration of the solid-state imaging apparatus according to the fifth modification of the fifth embodiment is similar to the solid-state imaging apparatus according to the fifth embodiment illustrated in FIG. 34, and therefore a duplicate description will be omitted.

According to the solid-state imaging apparatus according to the fifth modification of the fifth embodiment, in the case where the pixel array unit 1 includes the reference pixel region 1b fixed in a specific row discretely from the readout pixel region 1a, the respective floating diffusions of the reference pixel $X_{R,k}$ and the non-selected pixel $X_{R+1,k}$ in the reference pixel region 1b are connected by the switches $S41_R$ and $S41_{R+1}$. For this reason, the floating diffusion capacitance can be increased and the conversion efficiency can be lowered. Consequently, the signal readout range can be widened.

<Sixth Modification of Fifth Embodiment>

As illustrated in FIG. 41, a solid-state imaging apparatus according to a sixth modification of the fifth embodiment shares a point in common with the solid-state imaging apparatus according to the fifth modification of the fifth embodiment illustrated in FIG. 40, namely that the pixel array unit 1 includes the readout pixel region 1a and the reference pixel region 1b, and additionally includes switches $S41_i$, $S41_{i+1}$, $S41_{i+2}$, $S41_{i+3}$ and switches $S41_R$ and $S41_{R+1}$.

However, the solid-state imaging apparatus according to the sixth modification of the fifth embodiment differs from the solid-state imaging apparatus according to the fourth modification of the fifth embodiment illustrated in FIG. 40 in that the select transistor of the non-selected pixel $X_{R+1,k}$ whose floating diffusion is joined with the floating diffusion of the reference pixel $X_{R,k}$ is turned on, and in addition, the respective select transistors of the pixels $X_{i+1,k}$ and $X_{i+3,k}$ whose floating diffusions are joined with the floating diffusions of the readout pixels $X_{i,k}$ and $X_{i+2,k}$ are turned on. The rest of the configuration of the solid-state imaging apparatus according to the sixth modification of the fifth embodiment is similar to the solid-state imaging apparatus according to the fifth modification of the fifth embodiment illustrated in FIG. 40, and therefore a duplicate description will be omitted.

According to the solid-state imaging apparatus according to the sixth modification of the fifth embodiment, by turning on the select transistor of the non-selected pixel $X_{R+1,k}$ whose floating diffusion is joined with the floating diffusion of the reference pixel $X_{R,k}$, and in addition, turning on the respective select transistors of the pixels $X_{i+1,k}$ and $X_{i+3,k}$ whose floating diffusions are joined with the floating diffusions of the readout pixels $X_{i,k}$ and $X_{i+2,k}$, a parallel readout from multiple (two) rows can be performed.

Sixth Embodiment

An example of applying the solid-state imaging apparatus according to the first to fifth embodiments is described as a sixth embodiment.

<Example of Application to Front-Illuminated CIS>

FIG. 42 illustrates an example of applying the solid-state imaging apparatus according to the first to fifth embodiments to a front-illuminated CIS. As illustrated in FIG. 42, the front-illuminated CIS includes the plurality of pixels $X_{i,k}$, $X_{i+1,k}$, and $X_{i+2,k}$ of the solid-state imaging apparatus according to the first to fifth embodiments.

In each of the plurality of pixels $X_{i,k}$, $X_{i+1,k}$, and $X_{i+2,k}$, a photodiode 92 containing a p-n junction is provided in an upper part of a substrate 91 such as silicon (Si). A pixel transistor 93 is provided above the photodiode 92. The pixel transistor 93 is one example of the transfer transistor, the reset transistor, the amplification transistor, and the select transistor. Above the photodiode 92, interconnect layers 95, 96, and 97 are provided with an insulating layer 94 in between. On the upper face of the interconnect layers 95, 96, and 97, a color filter 98 and an on-chip lens (OCL) 99 are provided.

<Example of Application to Back-Illuminated CIS>

FIG. 43 illustrates an example of applying the solid-state imaging apparatus according to the first to fifth embodiments to a back-illuminated CIS. As illustrated in FIG. 43, the back-illuminated CIS includes the plurality of pixels $X_{i,k}$, $X_{i+1,k}$, and $X_{i+2,k}$ of the solid-state imaging apparatus according to the first to fifth embodiments.

In each of the plurality of pixels $X_{i,k}$, $X_{i+1,k}$, and $X_{i+2,k}$, on the upper face of a substrate 91 such as silicon (Si), interconnect layers 95, 96, and 97 are provided with an insulating layer 94 in between. A pixel transistor 93 is provided in an upper part of the interconnect layers 95, 96, and 97. The pixel transistor 93 is one example of the transfer transistor, the reset transistor, the amplification transistor, and the select transistor. Above the interconnect layers 95, 96, and 97, a photodiode 92 containing a p-n junction is provided. Above the photodiode 92, a color filter 98 and an on-chip lens (OCL) 99 are provided.

FIG. 44 illustrates an example of applying the solid-state imaging apparatus according to the first to fifth embodiments to a back-illuminated CIS. The back-illuminated CIS illustrated in FIG. 44 includes a first substrate 101 and a second substrate 102 in a stacked configuration. The first substrate 101 is a support substrate. A pixel array unit 1 and a peripheral circuit 103 are provided on the second substrate 102. The peripheral circuit 103 includes column readout circuit units 3a and 3b as well as column signal processing units 4a and 4b.

FIG. 45 illustrates an example of applying the solid-state imaging apparatus according to the first to fifth embodiments to a back-illuminated CIS. The back-illuminated CIS illustrated in FIG. 45 includes a first substrate 101 and a second substrate 102 in a stacked configuration. A peripheral circuit 103 is provided on the first substrate 101. The peripheral circuit 103 includes column readout circuit, units 3a and 3b as well as column signal processing units 4a and 4b. A pixel array unit 1 is provided on the second substrate 102.

<Example of Application to Electronic Device>

The solid-state imaging apparatus according to the first to fifth embodiments can be applied to an electronic device of any type provided with an imaging function, such as a camera system like a digital still camera or a video camera, or a mobile phone that includes an imaging function, for example. For example, the electronic device illustrated in FIG. 46 is a video camera capable of shooting still images or moving images, for example, and includes a solid-state imaging apparatus 200, an optical system 201, a shutter apparatus 202, a driving unit 204 that drives the solid-state imaging apparatus 200 and the shutter apparatus 202, and a signal processing unit 203.

The solid-state imaging apparatus according to the first to fifth embodiments is applicable as the solid-state imaging apparatus 200. The optical system 201 guides image light from an object (incident light) to the pixel array unit 1 of the solid-state imaging apparatus 200. The optical system 201 may include a plurality of optical lenses. The shutter apparatus 202 controls the periods during which light is radiated onto or blocked from the solid-state imaging apparatus 200. The driving unit 204 drives a transfer operation of the solid-state imaging apparatus 200 and a shutter operation of the shutter apparatus 202. The signal processing unit 203 performs various types of signal processing on a signal output from the solid-state imaging apparatus 200. The processed image signal is stored in a storage medium such as memory, or is output to a monitor or the like.

Other Embodiments

As above, the present technology is described by the first to sixth embodiments, but the statements and drawings constituting part of this disclosure should not be understood as limiting the present technology. If the gist of the technical content disclosed by the foregoing embodiments is understood, it is clear to persons skilled in the art that a variety of substitute embodiments, examples, and applied technologies may be included in the present technology. Furthermore, the present technology obviously includes various embodiments and the like not described herein, such as configurations that arbitrarily apply each of the configurations explained in the foregoing embodiments. Consequently, the technical scope of the present technology is to be determined solely by the matters specifying the technology as set forth in the claims, which are appropriate from the above exemplary description.

In addition, the configurations respectively disclosed in the first to sixth embodiments and their modifications can be appropriately combined within a range that does not cause inconsistency. For example, configurations respectively disclosed by a plurality of different embodiments may be combined, and configurations respectively disclosed by a plurality of different modifications of the same embodiment may be combined.

Further, the present technology may include the following configuration.

(1)

A solid-state apparatus including:

a pixel array unit that includes a plurality of pixels arranged in a matrix of rows and columns; and a peripheral circuit disposed in a periphery of the pixel array unit, in which each of the pixels includes a floating diffusion, a reset transistor, an amplification transistor, and a select transistor, a readout pixel and a reference pixel from among the pixels form a differential amplifier, the reference pixel is plurally disposed in a same row, a same column, or an adjacent column, and the plural reference pixels share at least one of a reference-side reset input line connected to a drain or a source of the reset transistor, a reference-side output signal line connected to a drain of the select transistor, and a current supply line connected to a source of the amplification transistor.

(2)

The solid-state imaging apparatus according to (1), in which the readout pixel is plurally disposed in a same row, a same column, or an adjacent column, and the plural readout pixels share a readout-side reset input line connected to a drain or a source of the reset transistor.

(3)

The solid-state imaging apparatus according to (1) or (2), in which the readout pixel is selected plurally and simultaneously, the peripheral circuit further includes switches that short a readout-side reset input line connected to a drain or a source of the reset transistor and a readout-side output signal line connected to a drain of the select transistor for each of the simultaneously selected readout pixels, and the simultaneously selected readout pixels are successively reset.

(4)

The solid-state imaging apparatus according to (3), in which a reset level of one of the simultaneously selected readout pixels is read out, while simultaneously, a signal level of another of the simultaneously selected readout pixels is read out.

(5)

The solid-state imaging apparatus according to any one of (1) to (4), in which a source of the reset transistor of the reference pixel is connected to the floating diffusion of the reference pixel, a drain of the reset transistor of the reference pixel is connected to the reference-side reset input line, a source of the reset transistor of the readout pixel is connected to the floating diffusion of the readout pixel, a drain of the reset transistor of the readout pixel s connected to an output signal line, and the reference pixel is fixed to a specific row of the pixel array unit.

(6)

The solid-state imaging apparatus according to (5), in which the floating diffusion of the reference pixel supplies a reset voltage from the reference-side reset input line, and the floating diffusion of the readout pixel supplies a reset voltage by connecting the floating diffusion and the readout-side output signal line through the reset transistor to form a negative feedback loop.

(7)

The solid-state imaging apparatus according to any one of (1) to (6), in which the peripheral circuit includes a switching unit that switches an operating point of the amplification transistor of the pixels between a source follower readout and a differential amplification readout, and the switching unit includes a switch that shorts the readout-side output signal line to a power supply potential during the source follower readout.

(8)

The solid-state imaging apparatus according to (7), in which the reference pixel further includes another reset transistor having a source connected to the floating diffusion of the reference pixel and a drain connected to the current supply line.

(9)

The solid-state imaging apparatus according to any one of (1) to (8), in which the pixels adjacent to each other in a same row or a same column share a source diffusion layer of the amplification transistor.

(10)

The solid-state imaging apparatus according to any one of (1) to (9), in which the pixels adjacent to each other in a same row or a same column share a drain diffusion layer of the reset transistor.

(11)

The solid-state imaging apparatus according to (9) or (10), in which in the pixels adjacent to each other in a same row or a same column, an arrangement of the floating diffusion, the reset transistor, the amplification transistor, and the select transistor has line symmetry.

(12)

The solid-state imaging apparatus according to any one of (1) to (7), in which in the pixel array unit, the floating diffusions of the plurality of pixels disposed in a same row or a same column are joined.

(13)

The solid-state imaging apparatus according to any one of (1) to (8), in which the pixel array unit further includes a switch that joins the floating diffusions of the plurality of pixels disposed in a same row or a same column.

(14)

The solid-state imaging apparatus according to (13), in which the pixels whose floating diffusions are joined by the switch share an output signal line connected to drains of the select transistors of the pixels.

(15)

The solid-state imaging apparatus according to (13) or (14), in which the select transistors of the pixels whose floating diffusions are joined by the switch are turned on simultaneously.

(16)

The solid-state imaging apparatus according to any one of (1) to (15), in which the peripheral circuit includes two or more systems of sample and hold circuits connected to a common readout-side output signal line connected to a drain of the select transistor of each of a plurality of the readout pixels.

(17)

A solid-state imaging apparatus including:

a pixel array unit that includes a plurality of pixels arranged in a matrix of rows and columns; and a peripheral circuit disposed in a periphery of the pixel array unit, in which each of the pixels includes a floating diffusion, a reset transistor, an amplification transistor, and a select transistor, a readout pixel and a reference pixel from among the pixels form a differential amplifier, a source of the reset transistor of the reference pixel is connected to the floating diffusion of the reference pixel, a drain of the reset transistor of the reference pixel is connected to a reset input line, a source of the reset transistor of the readout pixel is connected to the floating diffusion of the readout pixel, a drain of the reset transistor of the readout pixel is connected to an output signal line, and the reference pixel is fixed to a specific row of the pixel array unit.

(18)

An electronic device including:

a solid-state imaging apparatus including a pixel array unit that includes a plurality of pixels arranged in a matrix of rows and columns and a peripheral circuit disposed in a periphery of the pixel array unit; and a signal processing circuit that processes an image signal from the solid-state imaging apparatus, in which each of the pixels includes a floating diffusion, a reset transistor, an amplification transistor, and a select transistor, a readout pixel and a reference pixel from among the pixels form a differential amplifier, the reference pixel is plurally disposed in a same row, a same column, or an adjacent column, and the plural reference pixels share at least one of a reference-side reset input line connected to a drain or a source of the reset transistor, a reference-side output signal line connected to a drain of the select transistor, and a current supply line connected to a source of the amplification transistor.

(19)

An electronic device including:

a solid-state imaging apparatus including a pixel array unit that includes a plurality of pixels arranged in a matrix of rows and columns and a peripheral circuit disposed in a periphery of the pixel array unit; and a signal processing circuit that processes an image signal from the solid-state imaging apparatus, in which each of the pixels includes a floating diffusion, a reset transistor, an amplification transistor, and a select transistor, a readout pixel and a reference pixel from among the pixels form a differential amplifier, a source of the reset transistor of the reference pixel is connected to the floating diffusion of the reference pixel, a drain of the reset transistor of the reference pixel is connected to a reset input line, a source of the reset transistor of the readout pixel is connected to the floating diffusion of the readout pixel, a drain of the reset transistor of the readout pixel is connected to an output signal line, and the reference pixel is fixed to a specific row of the pixel array unit.

(20)

A light detecting device comprising:

one or more switch transistors;

a first pixel including a first photoelectric converter, a first floating diffusion region coupled to the first photoelectric converter through a first transfer transistor, and a first amplification transistor coupled to the first floating diffusion region;

a second pixel in a column in which the first pixel is disposed, the second pixel including a second photoelectric converter, a second floating diffusion region coupled to the second photoelectric converter through a second transfer transistor, and a second amplification transistor coupled to the second floating diffusion region; and a third pixel in the column, the third pixel including a third photoelectric converter, a third floating diffusion region coupled to the third photoelectric converter through a third transfer transistor, and a third amplification transistor coupled to the third floating diffusion region, wherein a pixel signal is differentially amplified by the first amplification transistor and the third amplification transistor, and wherein the first floating diffusion region and the second floating diffusion region are selectively connected to each other via one of the one or more switch transistors.

(21)

The light detecting device according to (20), further comprising:

a plurality of reset transistors, wherein the plurality of reset transistors includes a first reset transistor configured to reset the first floating diffusion region, a second reset transistor configured to reset the second floating diffusion region, and a third reset transistor configured to reset the third floating diffusion region.

(22)

The light detecting device according to (21), wherein a source of the first reset transistor or a drain of the first reset transistor is coupled to a power supply voltage, and a source of the third reset transistor or a drain of the third reset transistor is coupled to a first voltage line that provides a first voltage different from the power supply voltage.

(23)

The light detecting device according to any one of (20) to (22), further comprising:

a fourth pixel in the column, the fourth pixel including a fourth photoelectric converter, a fourth floating diffusion region coupled to the fourth photoelectric converter through a fourth transfer transistor, and a fourth amplification transistor coupled to the fourth floating diffusion region, wherein the third floating diffusion region and the fourth floating diffusion region are selectively connected to each other via a second one of the one or more switch transistors.

(24)

The light detecting device according to any one of (20) to (23), further comprising:

a current supply (VCOM) line that is disposed adjacent to the column; and an output signal (VSL) line that is disposed adjacent to the column.

(25)

The light detecting device according to (24), wherein the current supply line is disposed between the first amplification transistor and a fourth amplification transistor of a fourth pixel, the fourth pixel disposed in an adjacent column to the column.

(26)

The light detecting device according to (24), wherein the first amplification transistor is coupled to the current supply line, the second amplification transistor is coupled to the current supply line, and the third amplification transistor is coupled to the current supply line. (27)

The light detecting device according to (26), wherein the first amplification transistor is coupled to the output signal line, and The second amplification transistor is coupled to the output signal line.

(28)

The light detecting device according to (27), further comprising:

a second output signal (VSLR) line that is disposed adjacent to the column, the second output signal line being different than the output signal line, wherein the third amplification transistor is coupled to the second output signal line.

(29)

The light detecting device according to any one of (20) to (28), wherein the first pixel includes a first switch transistor from the one or more switch transistors, the first switch transistor being the one of the one or more switch transistors that is configured to electrically connect the first floating diffusion region to the second floating diffusion region, the second pixel includes a second switch transistor from the one or more switch transistors, the second switch transistor configured to electrically connect the second floating diffusion region to a fourth floating diffusion region, and the third pixel includes a third switch transistor from the one or more switch transistors, the third switch transistor configured to electrically connect the third floating diffusion region to a fifth floating diffusion region.

(30)

The light detecting device according to any one of (20) to (29), further comprising:

a pixel array including the first pixel, the second pixel, and the third pixel, wherein the third pixel is a reference pixel that is positioned at an edge of the pixel array.

(31)

An electronic apparatus comprising:

a light detecting device including one or more switch transistors;

a first pixel including a first photoelectric converter, a first floating diffusion region coupled to the first photoelectric converter through a first transfer transistor, and a first amplification transistor coupled to the first floating diffusion region;

a second pixel in a column in which the first pixel is disposed, the second pixel including a second photoelectric converter, a second floating diffusion region coupled to the second photoelectric converter through a second transfer transistor, and a second amplification transistor coupled to the second floating diffusion region; and a third pixel in the column, the third pixel including a third photoelectric converter, a third floating diffusion region coupled to the third photoelectric converter through a third transfer transistor, and a third amplification transistor coupled to the third floating diffusion region, wherein a pixel signal is differentially amplified by the first amplification transistor and the third amplification transistor, and wherein the first floating diffusion region and the second floating diffusion region are selectively connected to each other via one of the one or more switch transistors.

(32)

The electronic apparatus according to (31), wherein the light detecting device further includes a plurality of reset transistors, wherein the plurality of reset transistors includes a first reset transistor configured to reset the first floating diffusion region, a second reset transistor configured to reset the second floating diffusion region, and a third reset transistor configured to reset the third floating diffusion region.

(33)

The electronic apparatus according to (32), wherein a source of the first reset transistor or a drain of the first reset transistor is coupled to a. power supply voltage, and a source of the third reset transistor or a drain of the third reset transistor is coupled to a first voltage line that provides a first voltage different from the power supply voltage.

(34)

The electronic apparatus according to any tine of (30) to (33), wherein the light detecting device further includes a fourth pixel in the column, the fourth pixel including a fourth photoelectric converter, a fourth floating diffusion region coupled to the fourth photoelectric converter through a fourth transfer transistor, and a fourth amplification transistor coupled to the fourth floating diffusion region, wherein the third floating diffusion region and the fourth floating diffusion region are selectively connected to each other via a second one of the one or more switch transistors.

(35)

The electronic apparatus according to any one of 30) to (34), wherein the light detecting device further includes a current supply (VCOM) line that is disposed adjacent to the column; and an output signal (VSL) line that is disposed adjacent to the column.

(36)

The electronic apparatus according to (35), wherein the first amplification transistor is coupled to the current supply line, the second amplification transistor is coupled to the current supply line, and the third amplification transistor is coupled to the current supply line.

(37)

The electronic apparatus according to (36), wherein the first amplification transistor is coupled to the output signal line, and the second amplification transistor is coupled to the output signal line.

(38)

The electronic apparatus according to any one of (30) to (37), wherein the first pixel includes a first switch transistor from the one or more switch transistors, the first switch transistor being the one of the one or more switch transistors that is configured to electrically connect the first floating diffusion region to the second floating diffusion region, the second pixel includes a second switch transistor from the one or more switch transistors, the second switch transistor configured to electrically connect the second floating diffusion region to a fourth floating diffusion region, and the third pixel includes a third switch transistor from the one or more switch transistors, the third switch transistor configured to electrically connect the third floating diffusion region to a fifth floating diffusion region.

(39)

The electronic apparatus according to any one of (30) to (38), wherein the light detecting device further includes a pixel array including the first pixel, the second pixel, and the third pixel, and wherein the third pixel is a reference pixel that is positioned at an edge of the pixel array.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Pixel array unit
1a Readout pixel region
1b Reference pixel region
2 Vertical driving unit
3, 3a, 3b Column readout circuit unit
4, 4a, 4b Column signal processing unit
5 Horizontal driving unit
6 Signal processing unit
7 System control unit
8 Pixel driving line
9 Vertical signal line
41, 42 Sample and hold circuit
43, 44 Analog-to-digital conversion unit 51, 52, 61, 62 Short line
70a to 70h, 70x, 71a to 71h, 71x, 71y, 72a to 72h, 72x, 72y, 73a to 73h, 73x, 74a to 74h, 74x, 75a to 75h, 75x, 76a to 76h, 76f, 76x, 77x, 77y Diffusion layer
81a to 81h, 81x, 81y, 82a to 82h, 82x, 82y, 83a to 83h, 83x, 84a to 84h, 84x Gate electrode
91 Substrate
92 Photodiode
93 Pixel transistor
94 Insulating layer
95, 96, 97 Interconnect layer
98 Color filter
101, 102 Substrate
103 Peripheral circuit
200 Solid-state imaging apparatus
201 Optical system
202 Shutter apparatus
203 Signal processing unit
204 Driving unit
C1 to C4 Capacitor
FD Floating diffusion
L1$k$, L2$k$ Constant current source
M0$_k$ to M3$_k$, M11$_k$, M12$k$ Switch
PD, PD1, PD2 Photodiode
S1$_k$ to S3$_k$, S11$_k$ to S20$_k$, S31 to S38, S41$_i$ to S41$_{i+5}$, S42$_i$ to S42$_{i+5}$, T1, T1a, T1b Transfer transistor
T1$_k$ to T4$_k$ Transistor
T2, T2a, T2b Reset transistor
T3 Select transistor
T4 Amplifying transistor
VCOM$_k$, VCOM$_{k+1}$ Current supply line
VRD, VRD0$_k$ to VRD2$_k$, VRD0$_{k+1}$ to VRD2$_{k+1}$, VSLR$_k$, VSLR$_{k+1}$ Reset input line
VSL0$_k$ to VSL2$_k$, VSL0$_{k+1}$ to VSL2$_{k+1}$ Output signal line
X$_{i,k}$ to X$_{i+6,k}$, X$_{i,k+1}$ to X$_{i+6,k+1}$, X$_{R,k}$, X$_{R+1,k}$, X$_{R,k+1}$ Pixel

The invention claimed is:

1. A light detecting device comprising:
one or more switch transistors;
a first pixel including
a first photoelectric converter,
a first floating diffusion region coupled to the first photoelectric converter through a first transfer transistor, and
a first amplification transistor coupled to the first floating diffusion region;
a second pixel in a column in which the first pixel is disposed, the second pixel including
a second photoelectric converter,
a second floating diffusion region coupled to the second photoelectric converter through a second transfer transistor, and
a second amplification transistor coupled to the second floating diffusion region; and
a third pixel in the column, the third pixel including
a third photoelectric converter,
a third floating diffusion region coupled to the third photoelectric converter through a third transfer transistor, and
a third amplification transistor coupled to the third floating diffusion region,
wherein a pixel signal is differentially amplified by the first amplification transistor and the third amplification transistor, and
wherein the first floating diffusion region and the second floating diffusion region are selectively connected to each other via one of the one or more switch transistors.

2. The light detecting device according to claim 1, further comprising:
a plurality of reset transistors, wherein the plurality of reset transistors includes
a first reset transistor configured to reset the first floating diffusion region,
a second reset transistor configured to reset the second floating diffusion region, and
a third reset transistor configured to reset the third floating diffusion region.

3. The light detecting device according to claim 2, wherein
a source of the first reset transistor or a drain of the first reset transistor is coupled to a power supply voltage, and
a source of the third reset transistor or a drain of the third reset transistor is coupled to a first voltage line that provides a first voltage different from the power supply voltage.

4. The light detecting device according to claim 1, further comprising:
a fourth pixel in the column, the fourth pixel including
a fourth photoelectric converter,
a fourth floating diffusion region coupled to the fourth photoelectric converter through a fourth transfer transistor, and
a fourth amplification transistor coupled to the fourth floating diffusion region,
wherein the third floating diffusion region and the fourth floating diffusion region are selectively connected to each other via a second one of the one or more switch transistors.

5. The light detecting device according to claim 1, further comprising:
a current supply (VCOM) line that is disposed adjacent to the column; and
an output signal (VSL) line that is disposed adjacent to the column.

6. The light detecting device according to claim 5,
wherein the current supply line is disposed between the first amplification transistor and a fourth amplification transistor of a fourth pixel, the fourth pixel disposed in an adjacent column to the column.

7. The light detecting device according to claim 5, wherein
the first amplification transistor is coupled to the current supply line,
the second amplification transistor is coupled to the current supply line, and
the third amplification transistor is coupled to the current supply line.

8. The light detecting device according to claim 7, wherein
the first amplification transistor is coupled to the output signal line, and
the second amplification transistor is coupled to the output signal line.

9. The light detecting device according to claim 8, further comprising:
a second output signal (VSLR) line that is disposed adjacent to the column, the second output signal line being different than the output signal line,
wherein the third amplification transistor is coupled to the second output signal line.

10. The light detecting device according to claim 1, wherein
the first pixel includes a first switch transistor from the one or more switch transistors, the first switch transistor being the one of the one or more switch transistors that is configured to electrically connect the first floating diffusion region to the second floating diffusion region,
the second pixel includes a second switch transistor from the one or more switch transistors, the second switch transistor configured to electrically connect the second floating diffusion region to a fourth floating diffusion region, and
the third pixel includes a third switch transistor from the one or more switch transistors, the third switch transistor configured to electrically connect the third floating diffusion region to a fifth floating diffusion region.

11. The light detecting device according to claim 1, further comprising:
a pixel array including the first pixel, the second pixel, and the third pixel,
wherein the third pixel is a reference pixel that is positioned at an edge of the pixel array.

12. An electronic apparatus comprising:
a light detecting device including
one or more switch transistors;
a first pixel including
a first photoelectric converter,
a first floating diffusion region coupled to the first photoelectric converter through a first transfer transistor, and
a first amplification transistor coupled to the first floating diffusion region;
a second pixel in a column in which the first pixel is disposed, the second pixel including
a second photoelectric converter,
a second floating diffusion region coupled to the second photoelectric converter through a second transfer transistor, and
a second amplification transistor coupled to the second floating diffusion region; and
a third pixel in the column, the third pixel including
a third photoelectric converter,
a third floating diffusion region coupled to the third photoelectric converter through a third transfer transistor, and
a third amplification transistor coupled to the third floating diffusion region,
wherein a pixel signal is differentially amplified by the first amplification transistor and the third amplification transistor, and
wherein the first floating diffusion region and the second floating diffusion region are selectively connected to each other via one of the one or more switch transistors.

13. The electronic apparatus according to claim 12, wherein the light detecting device further includes
a plurality of reset transistors, wherein the plurality of reset transistors includes
a first reset transistor configured to reset the first floating diffusion region,
a second reset transistor configured to reset the second floating diffusion region, and
a third reset transistor configured to reset the third floating diffusion region.

14. The electronic apparatus according to claim 13, wherein
a source of the first reset transistor or a drain of the first reset transistor is coupled to a power supply voltage, and
a source of the third reset transistor or a drain of the third reset transistor is coupled to a first voltage line that provides a first voltage different from the power supply voltage.

15. The electronic apparatus according to claim 12, wherein the light detecting device further includes
a fourth pixel in the column, the fourth pixel including
a fourth photoelectric converter,
a fourth floating diffusion region coupled to the fourth photoelectric converter through a fourth transfer transistor, and
a fourth amplification transistor coupled to the fourth floating diffusion region,
wherein the third floating diffusion region and the fourth floating diffusion region are selectively connected to each other via a second one of the one or more switch transistors.

16. The electronic apparatus according to claim 12, wherein the light detecting device further includes
a current supply (VCOM) line that is disposed adjacent to the column; and
an output signal (VSL) line that is disposed adjacent to the column.

17. The electronic apparatus according to claim 16, wherein
the first amplification transistor is coupled to the current supply line,
the second amplification transistor is coupled to the current supply line, and
the third amplification transistor is coupled to the current supply line.

18. The electronic apparatus according to claim 17, wherein
the first amplification transistor is coupled to the output signal line, and
the second amplification transistor is coupled to the output signal line.

19. The electronic apparatus according to claim 12, wherein
the first pixel includes a first switch transistor from the one or more switch transistors, the first switch transistor being the one of the one or more switch transistors that is configured to electrically connect the first floating diffusion region to the second floating diffusion region,
the second pixel includes a second switch transistor from the one or more switch transistors, the second switch transistor configured to electrically connect the second floating diffusion region to a fourth floating diffusion region, and
the third pixel includes a third switch transistor from the one or more switch transistors, the third switch transistor configured to electrically connect the third floating diffusion region to a fifth floating diffusion region.

20. The electronic apparatus according to claim 12, wherein the light detecting device further includes
a pixel array including the first pixel, the second pixel, and the third pixel, and
wherein the third pixel is a reference pixel that is positioned at an edge of the pixel array.

* * * * *